(12) United States Patent
Miyake et al.

(10) Patent No.: US 9,735,282 B2
(45) Date of Patent: Aug. 15, 2017

(54) SEMICONDUCTOR DEVICE AND DISPLAY DEVICE HAVING SEMICONDUCTOR DEVICE

(71) Applicant: Semiconductor Energy Laboratory Co., Ltd., Atsugi-shi, Kanagawa-ken (JP)

(72) Inventors: Hiroyuki Miyake, Kanagawa (JP); Yoshiaki Oikawa, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/978,470

(22) Filed: Dec. 22, 2015

(65) Prior Publication Data
US 2016/0190331 A1 Jun. 30, 2016

(30) Foreign Application Priority Data

Dec. 29, 2014 (JP) ................................. 2014-266969
Dec. 29, 2014 (JP) ................................. 2014-266973

(51) Int. Cl.
*H01L 29/786* (2006.01)
*H01L 27/32* (2006.01)
(Continued)

(52) U.S. Cl.
CPC ........ *H01L 29/7869* (2013.01); *H01L 27/124* (2013.01); *H01L 27/1225* (2013.01);
(Continued)

(58) Field of Classification Search
CPC .............. H01L 27/1225; H01L 27/124; H01L 27/1255; H01L 27/3225; H01L 29/045;
(Continued)

(56) References Cited

U.S. PATENT DOCUMENTS 5,361,017 A * 11/1994 Krause .................. H05B 33/08
250/205
5,432,428 A * 7/1995 Meadows ............... G05F 1/573
320/128
(Continued)

FOREIGN PATENT DOCUMENTS

CN 001318818 A 10/2001
CN 101198200 A 6/2008
(Continued)

OTHER PUBLICATIONS

Asakuma.N et al., "Crystallization and Reduction of SOL-Gel-Derived Zinc Oxide Films by Irradiation With Ultraviolet Lamp", Journal of SOL-Gel Science And Technology, 2003, vol. 26, pp. 181-184.

(Continued)

*Primary Examiner* — Allan R Wilson
(74) *Attorney, Agent, or Firm* — Fish & Richardson P.C.

(57) ABSTRACT

Luminance variation due to change of current through a light-emitting element caused by change in environmental temperature is suppressed. Current through a first light-emitting element in a pixel portion is controlled by a monitor circuit. The monitor circuit includes a second light-emitting element, a transistor, a resistor, and an amplifier circuit. An anode of the second light-emitting element is connected to a source of the transistor. A cathode of the second light-emitting element is connected to the resistor and a first input terminal of the amplifier circuit. A second input terminal of the amplifier circuit is connected to a second power supply line. An output terminal of the amplifier circuit is connected to a gate of the transistor. The drain of the transistor is connected to a third power supply line. The transistor and the resistor each include an oxide semiconductor film.

21 Claims, 46 Drawing Sheets

(51) Int. Cl.
*H01L 29/24* (2006.01)
*H01L 29/04* (2006.01)
*H01L 27/12* (2006.01)
*H05B 33/08* (2006.01)

(52) U.S. Cl.
CPC ...... *H01L 27/1255* (2013.01); *H01L 27/3225* (2013.01); *H01L 29/045* (2013.01); *H01L 29/24* (2013.01); *H01L 29/78633* (2013.01); *H05B 33/08* (2013.01); *H01L 27/323* (2013.01); *H01L 27/3244* (2013.01); *H01L 27/3262* (2013.01)

(58) Field of Classification Search
CPC .............. H01L 29/24; H01L 29/78633; H01L 29/7869; H05B 33/08
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,081,075 A * | 6/2000 | Littlefield ............. H05B 33/08 315/209 R |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,737,478 B2 * | 6/2010 | Yanagisawa .......... G01J 1/4204 257/292 |
| 2001/0033252 A1 | 10/2001 | Yamazaki et al. |
| 2001/0046027 A1 | 11/2001 | Tai et al. |
| 2002/0005696 A1 | 1/2002 | Yamazaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0100463 A1 * | 5/2004 | Miyagawa ............ G09G 3/3233 345/212 |
| 2004/0127038 A1 | 7/2004 | Carcia et al. |
| 2005/0012731 A1 | 1/2005 | Yamazaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0068298 A1 | 3/2008 | Shen et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0225061 A1 | 9/2008 | Kimura et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0182306 A1 | 7/2010 | Kimura et al. |
| 2011/0109246 A1 | 5/2011 | Hying |
| 2011/0248648 A1 * | 10/2011 | Liu ....................... G09G 3/3406 315/294 |
| 2012/0048942 A1 * | 3/2012 | Giebel ............... G06K 7/10584 235/470 |
| 2012/0062240 A1 | 3/2012 | Nishijima |
| 2012/0299500 A1 * | 11/2012 | Sadwick ............ H05B 33/0887 315/224 |
| 2013/0021316 A1 | 1/2013 | Inoue et al. |
| 2013/0277672 A1 | 10/2013 | Sano et al. |
| 2014/0175436 A1 | 6/2014 | Yamazaki |
| 2014/0183523 A1 | 7/2014 | Endo |
| 2014/0191684 A1 * | 7/2014 | Valois ................ H05B 33/0815 315/307 |
| 2014/0239846 A1 | 8/2014 | Shoji et al. |
| 2014/0299874 A1 | 10/2014 | Yamazaki |
| 2014/0333285 A1 * | 11/2014 | Tanaka ..................... G01J 1/44 324/96 |

FOREIGN PATENT DOCUMENTS

| | | |
|---|---|---|
| CN | 102084717 A | 6/2011 |
| CN | 102592534 A | 7/2012 |
| DE | 102007003343 | 3/2008 |

(56) References Cited

FOREIGN PATENT DOCUMENTS

| | | | |
|---|---|---|---|
| EP | 1737044 A | 12/2006 | |
| EP | 1918904 A | 5/2008 | |
| EP | 2226847 A | 9/2010 | |
| EP | 2242038 A | 10/2010 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2002-333861 A | 11/2002 | |
| JP | 2003-086000 A | 3/2003 | |
| JP | 2003-086808 A | 3/2003 | |
| JP | 2003-091262 A | 3/2003 | |
| JP | 2004-103957 A | 4/2004 | |
| JP | 2004-273614 A | 9/2004 | |
| JP | 2004-273732 A | 9/2004 | |
| JP | 2006/165529 | 6/2006 | |
| JP | 2008-134625 A | 6/2008 | |
| JP | 2010-193434 A | 9/2010 | |
| JP | 2011-528168 | 11/2011 | |
| JP | 2012/078798 | 4/2012 | |
| JP | 2014-164081 A | 9/2014 | |
| KR | 10-0684491 | 2/2007 | |
| KR | 2008-0037538 A | 4/2008 | |
| KR | 2010-0086433 A | 7/2010 | |
| KR | 2011-0026520 A | 3/2011 | |
| TW | I272571 | 2/2007 | |
| TW | 200816868 | 4/2008 | |
| TW | 200834517 | 8/2008 | |
| TW | 201010504 | 3/2010 | |
| WO | WO-2004/114391 | 12/2004 | |
| WO | WO-2010/000333 | 1/2010 | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009. pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium DIgest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-251, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure For Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (Zno TFTs) for AMLCDs", J. Soc. Inf. Display (Journal of The Society For Information Display), 2007, vol. 15, No.1, pp. 17-22.

Hosono.H et al., "Working hypothesis to explore novel wide band gap electrically conducting amorphous oxides and examples", J. Non-Cryst. Solids (Journal of Non-Crystalline SOlids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N. et al., "SPINEL,YbFe2O4, and Yb2Fe3O7 Types of Structures for Compounds in The In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kurokawa.Y et al., "UHF RFCPPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of The 13th International Display Workshops, Dec. 7, 2006, pp. 663-666.

Lee.J et al., World's Largest (15-Inch) XGA AMLCD Panel Using IGZO Oxide TFT', SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 200, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), March 1, 2003, vol. 21, No. 2, pp. 800-803.

Park.J et al., "Electronic Transport Properties of Amorphous Indium-Gallium-Zinc Oxide Semiconductor upon exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International electron Devices Meeting, dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , June 17, 1996, vol. 68, No. 25, pp. 3650-3652.

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 200, vol. 85, No. 5, pp. 1012-1015.

(56) References Cited

OTHER PUBLICATIONS

International Search Report (Application No. PCT/IB2015/059656) Dated Mar. 29, 2016.
Written Opinion (Application No. PCT/IB2015/059656) Dated Mar. 29, 2016.

* cited by examiner

100A

100A

100B

100B

FIG. 29A
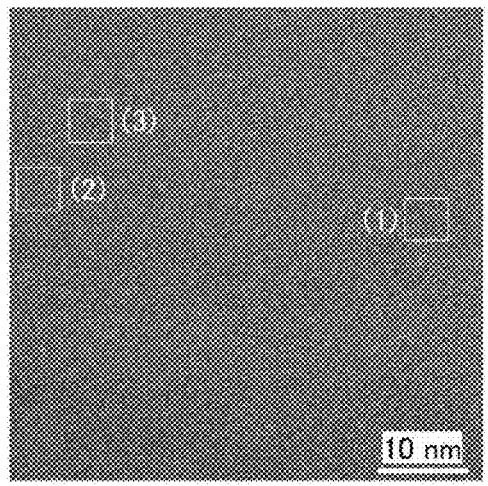
FIG. 29B  FIG. 29C  FIG. 29D
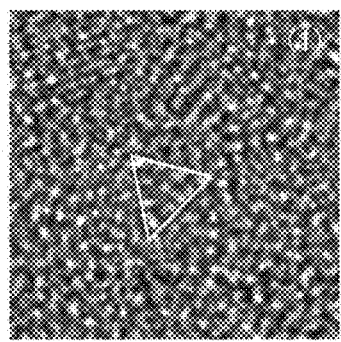 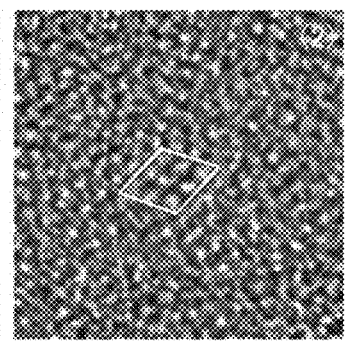 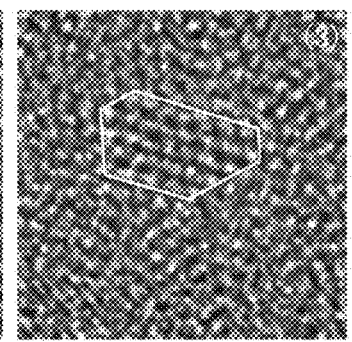

FIG. 31A
FIG. 31B
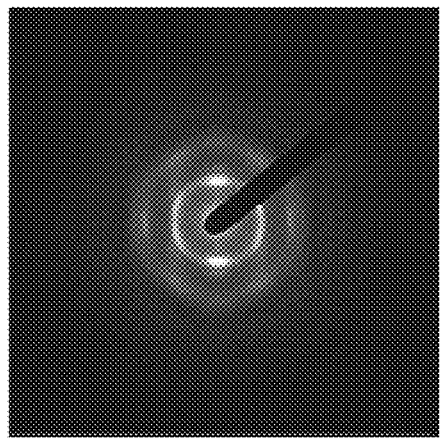
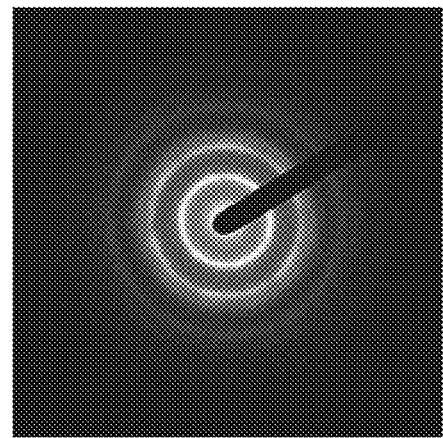

Crystal structure of InMZnO$_4$

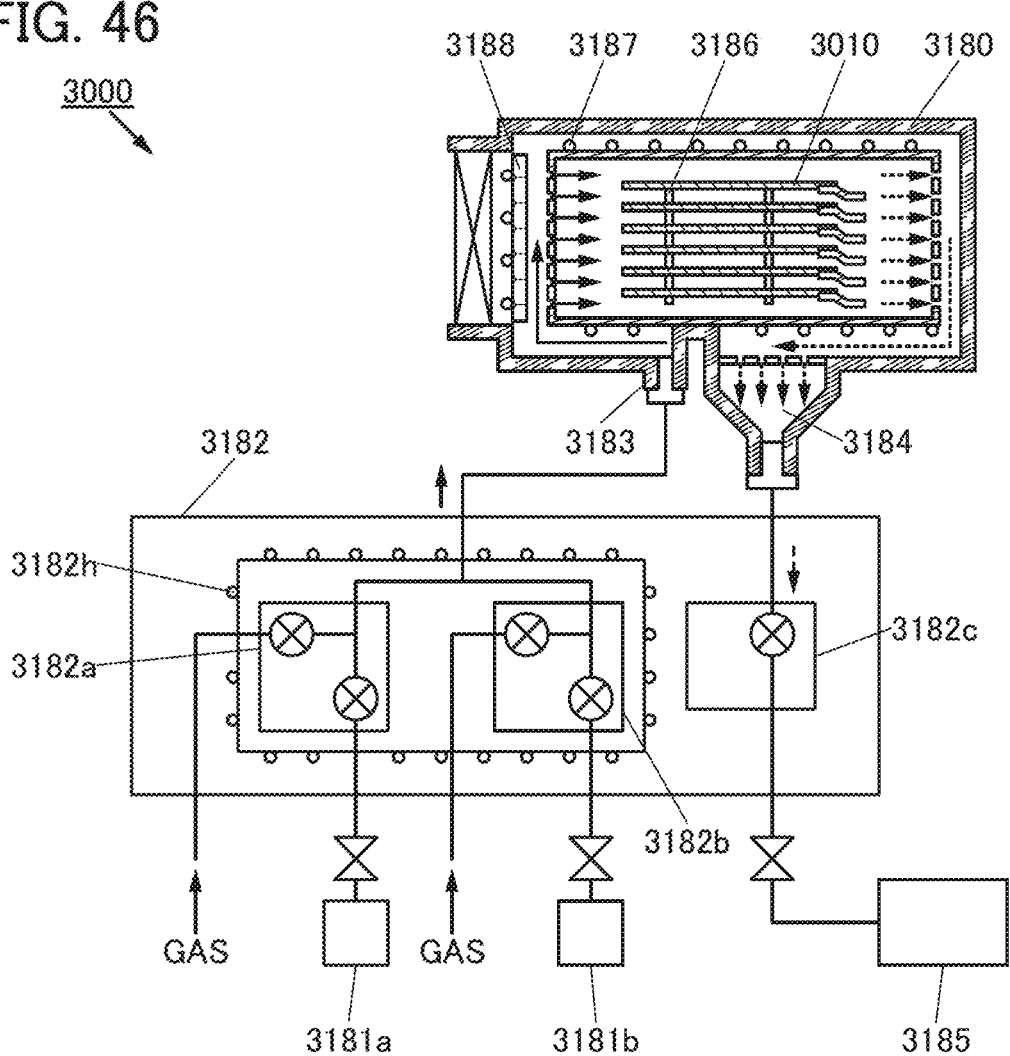

SEMICONDUCTOR DEVICE AND DISPLAY DEVICE HAVING SEMICONDUCTOR DEVICE

TECHNICAL FIELD

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. In particular, one embodiment of the present invention relates to a semiconductor device, a display device including an electroluminescence element (hereinafter also referred to as an EL display device), a liquid crystal display device, a light-emitting device, a power storage device, a memory device, an imaging device, a method for driving them, or a method for manufacturing them.

BACKGROUND ART

Attention has been focused on a technique for forming a transistor using a semiconductor thin film formed over a substrate having an insulating surface (also referred to as a field-effect transistor (FET) or a thin film transistor (TFT)). Such transistors are used in a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention (e.g., Patent Document 1).

In addition, a structure in which a monitor circuit that corrects a potential of a cathode of a light-emitting element in accordance with the ambient temperature of the light-emitting element (hereinafter the ambient temperature is referred to as environmental temperature) with a transistor including an oxide semiconductor in order to correct a characteristic change due to environmental temperature of the light-emitting element provided in each pixel of an EL display device is provided outside a pixel portion is disclosed (e.g., Patent Document 2).

REFERENCE

Patent Document

[Patent Document 1] Japanese Published Patent Application No. 2006-165529
[Patent Document 2] Japanese Published Patent Application No. 2012-078798

DISCLOSURE OF INVENTION

As shown in Patent Document 2, a light-emitting element has properties in which its resistance value (internal resistance value) is changed in accordance with an environmental temperature. Specifically, when the room temperature is regarded as a normal temperature and the temperature is higher than normal, the resistance decreases, while when the temperature is lower than normal, the resistance increases. Therefore, current-voltage characteristics of the light-emitting element are changed in accordance with environmental temperature. Specifically, when the temperature rises, the value of current of the light-emitting element is increased and the luminance becomes higher than desired. When the temperature decreases and the same voltage is applied, the value of current of the light-emitting element is reduced and the luminance of the light-emitting element becomes lower than desired. Thus, the luminance of the light-emitting element might vary because of change in the value of current flowing through the light-emitting element, which is caused by change in environmental temperature.

In view of the above problem, an object of one embodiment of the present invention is to suppress luminance variation due to change in the value of current flowing through a light-emitting element, which is caused by change in environmental temperature. Another object of one embodiment of the present invention is to provide a novel semiconductor device. Another object of one embodiment of the present invention is to provide a novel display device.

Note that the description of the above object does not disturb the existence of other objects. In one embodiment of the present invention, there is no need to achieve all the objects. Other objects are apparent from and can be derived from the description of the specification and the like.

According to one embodiment of the present invention, the amount of current flowing through a first light-emitting element included in a pixel portion is controlled by a monitor circuit. The monitor circuit includes a second light-emitting element, a transistor, a resistor, and an amplifier circuit. An anode of the second light-emitting element is electrically connected to one of a source and a drain of the transistor. A cathode of the second light-emitting element is electrically connected to one electrode of the resistor and a first input terminal of the amplifier circuit. The other electrode of the resistor is electrically connected to a first power supply line. A second input terminal of the amplifier circuit is electrically connected to a second power supply line. An output terminal of the amplifier circuit is electrically connected to a gate of the transistor. The other of the source and the drain of the transistor is electrically connected to a third power supply line. The transistor includes an oxide semiconductor film. The resistor includes an oxide conductive film formed over the same surface as the oxide semiconductor film. The structure is more specifically described below.

One embodiment of the present invention is a semiconductor device having an oxide semiconductor film, which includes a pixel portion and a monitor circuit provided outside the pixel portion. The pixel portion includes a first light-emitting element. The monitor circuit includes a second light-emitting element, a transistor, a resistor, and an amplifier circuit. An anode of the second light-emitting element is electrically connected to one of a source and a drain of the transistor. A cathode of the second light-emitting element is electrically connected to one electrode of the resistor and a first input terminal of the amplifier circuit. The other electrode of the resistor is electrically connected to a first power supply line. A second input terminal of the amplifier circuit is electrically connected to a second power supply line. An output terminal of the amplifier circuit is electrically connected to a gate of the transistor. The other of the source and the drain of the transistor is electrically connected to a third power supply line. The transistor includes the oxide semiconductor film. The resistor includes an oxide conductive film formed over the same surface as the oxide semiconductor film. The amount of current flowing through the first light-emitting element is controlled by the monitor circuit.

Another embodiment of the present invention is a semiconductor device having an oxide semiconductor film, which includes a pixel portion and a monitor circuit provided outside the pixel portion. The pixel portion includes a selection transistor, a driving transistor, and a first light-emitting element. The monitor circuit includes a second light-emitting element, a transistor, a resistor, and an amplifier circuit. An anode of the second light-emitting element is electrically connected to one of a source and a drain of the transistor. A cathode of the second light-emitting element is electrically connected to one electrode of the resistor and a first input terminal of the amplifier circuit. The other electrode of the resistor is electrically connected to a first power supply line. A second input terminal of the amplifier circuit is electrically connected to a second power supply line. An output terminal of the amplifier circuit is electrically connected to a gate of the transistor. The other of the source and the drain of the transistor is electrically connected to a third power supply line. The transistor includes the oxide semiconductor film. The resistor includes an oxide conductive film formed over the same surface as the oxide semiconductor film. The amount of current flowing through the driving transistor and the first light-emitting element is controlled by the monitor circuit.

Another embodiment of the present invention is a semiconductor device having an oxide semiconductor film, which includes a pixel portion and a monitor circuit provided outside the pixel portion. The pixel portion includes a selection transistor, a driving transistor, and a first light-emitting element. The selection transistor has a function of controlling conduction between a scan line and a gate of the driving transistor. The driving transistor has a function of controlling the amount of current flowing through the first light-emitting element. The monitor circuit includes a second light-emitting element, a transistor, a resistor, and an amplifier circuit. An anode of the second light-emitting element is electrically connected to one of a source and a drain of the transistor. A cathode of the second light-emitting element is electrically connected to one electrode of the resistor and a first input terminal of the amplifier circuit. The other electrode of the resistor is electrically connected to a first power supply line. A second input terminal of the amplifier circuit is electrically connected to a second power supply line. An output terminal of the amplifier circuit is electrically connected to a gate of the transistor. The other of the source and the drain of the transistor is electrically connected to a third power supply line. The transistor includes the oxide semiconductor film. The resistor includes an oxide conductive film formed over the same surface as the oxide semiconductor film. The amount of current flowing through the driving transistor and the first light-emitting element is controlled by the monitor circuit.

In the above embodiment, the selection transistor and the driving transistor each preferably include the oxide semiconductor film.

Another embodiment of the present invention is a semiconductor device having an oxide semiconductor film, which includes a pixel portion and a monitor circuit provided outside the pixel portion. The pixel portion includes a selection transistor, a driving transistor, a first transistor, and a first light-emitting element. The selection transistor has a function of controlling conduction between a scan line and a gate of the driving transistor. The driving transistor and the first transistor each have a function of controlling the amount of current flowing through the first light-emitting element. The monitor circuit includes a second light-emitting element, a second transistor, a resistor, and an amplifier circuit. An anode of the second light-emitting element is electrically connected to one of a source and a drain of the second transistor. A cathode of the second light-emitting element is electrically connected to one electrode of the resistor and a first input terminal of the amplifier circuit. The other electrode of the resistor is electrically connected to a first power supply line. A second input terminal of the amplifier circuit is electrically connected to a second power supply line. An output terminal of the amplifier circuit is electrically connected to a gate of the second transistor. The other of the source and the drain of the second transistor is electrically connected to a third power supply line. The second transistor includes the oxide semiconductor film. The resistor includes an oxide conductive film formed over the same surface as the oxide semiconductor film. The amount of current flowing through the driving transistor and the first light-emitting element is controlled by the monitor circuit.

In the above embodiment, the selection transistor, the driving transistor, and the first transistor each preferably include the oxide semiconductor film.

In the above embodiments, it is preferable that the oxide semiconductor film contain In, Zn, and M (M is Ti, Ga, Y, Zr, La, Ce, Nd, Sn, or Hf). In the above embodiments, it is preferable that the oxide semiconductor film include a crystal part and that the crystal part have c-axis alignment. In the above embodiments, it is preferable that the oxide conductive film contain In, Zn, and M (M is Ti, Ga, Y, Zr, La, Ce, Nd, Sn, or Hf).

Another embodiment of the present invention is a display device including the semiconductor device according to any one of the above embodiments, and a color filter. Another embodiment of the present invention is a display module including the display device and a touch sensor. Another embodiment of the present invention is an electronic device including the semiconductor device according to any one of the above embodiments, the display device, or the display module; and an operation key or a battery.

According to one embodiment of the present invention, luminance variation due to change in the value of current flowing through a light-emitting element, which is caused by change in environmental temperature, can be suppressed. According to one embodiment of the present invention, a novel semiconductor device can be provided. According to one embodiment of the present invention, a novel display device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 29A to 29D are Cs-corrected high-resolution TEM images of a plane of a CAAC-OS.

FIGS. 31A and 31B show electron diffraction patterns of a CAAC-OS.

FIG. 46 illustrates a structure of a deposition apparatus.

BEST MODE FOR CARRYING OUT THE INVENTION

Figure 1A:
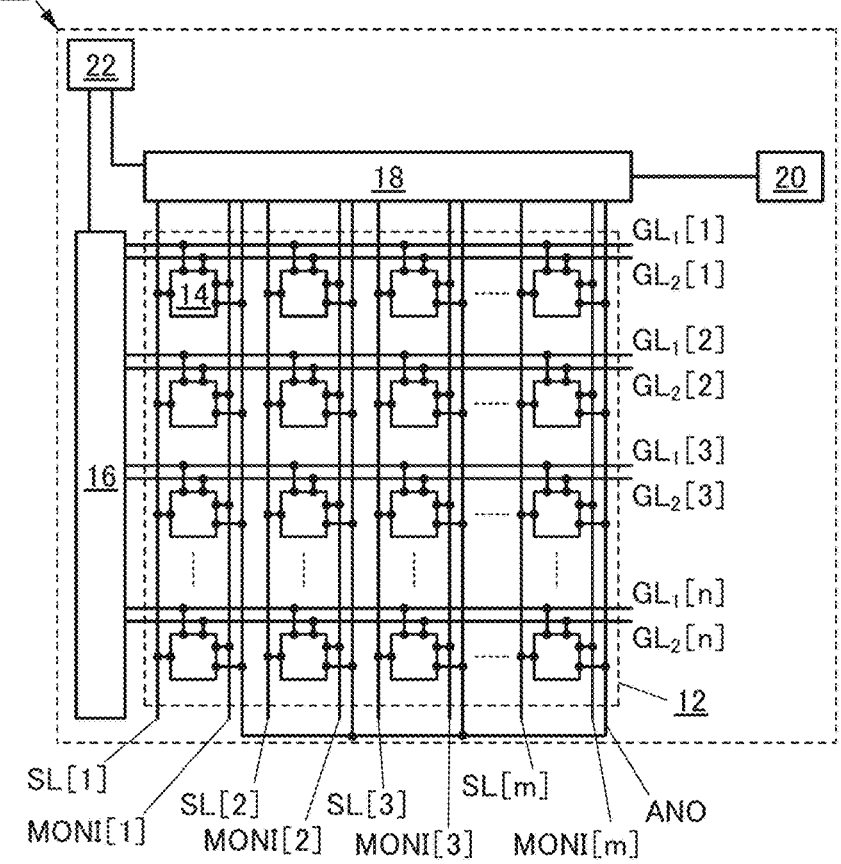
FIGS. 1A and 1B are a block diagram and a circuit diagram illustrating one embodiment of a semiconductor device.

Embodiments will be described below with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to the shapes or values shown in the drawings. In the drawings, the same portions or portions having similar functions are denoted by the same reference numerals in different drawings, and explanation thereof will not be repeated. Furthermore, the same hatching pattern is used for portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over", "above", "under", and "below", are used for convenience in describing a positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

Note that in this specification and the like, when it is explicitly described that X and Y are connected, the case where X and Y are electrically connected, the case where X and Y are functionally connected, and the case where X and Y are directly connected are included therein. Accordingly, a connection relation other than the predetermined connection relation, for example, a connection relation other than that shown in drawings and texts, is also allowed.

Here, X and Y are each assumed to be an object (e.g., a device, an element, a circuit, a wiring, an electrode, a terminal, a conductive film, or the like).

For example, in the case where X and Y are electrically connected, one or more elements that enable electrical connection between X and Y (e.g., a switch, a transistor, a capacitor, an inductor, a resistor, a diode, a display element, a light-emitting element, and/or a load) can be connected between X and Y. A switch has a function of being controlled to be on or off. That is, a switch is conducting (on state) or not conducting (off state) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. When a signal output from X is transmitted to Y, it can be said that X and Y are functionally connected even if another circuit is provided between X and Y.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or the like).

Embodiment 1

In this embodiment, an example of a semiconductor device of one embodiment of the present invention will be described with reference to FIGS. 1A and 1B, FIGS. 2A and 2B, FIG. 3, FIGS. 4A to 4C, FIG. 5, FIGS. 6A and 6B, and FIG. 7.

FIG. 1A is a block diagram illustrating an example of a semiconductor device of one embodiment of the present invention.

A semiconductor device 10 illustrated in FIG. 1A includes a pixel portion 12, a gate line driver circuit 16 on the periphery of the pixel portion 12, a signal line driver circuit 18 on the periphery of the pixel portion 12, a monitor circuit 20 provided outside the pixel portion 12, and a terminal portion 22 electrically connected to the gate line driver circuit 16 and the signal line driver circuit 18. The pixel portion 12 includes a plurality of pixels 14.

As illustrated in FIG. 1A, the plurality of pixels 14 are arranged in a matrix. Whether the pixels 14 are in a selected state or in a non-selected state is determined in each line in accordance with a selection signal supplied from gate lines ($GL_1[1]$ to $GL_1[n]$ and $GL_2[1]$ to $GL_2[n]$, n is a natural number) connected to the gate line driver circuit 16. The pixel 14 selected by the selection signal is supplied with video data (also referred to as $V_{data}$, an image signal, a video signal, or a video voltage) from any of signal lines (SL[1] to SL[m], m is a natural number) connected to the signal line driver circuit 18. The plurality of pixels 14 are electrically connected to an anode line (ANO).

Note that although FIG. 1A illustrates as an example the configuration in which the gate line driver circuit 16 and the signal line driver circuit 18 are provided over the semiconductor device 10, one embodiment of the present invention is not limited thereto, and one of the gate line driver circuit 16 and the signal line driver circuit 18 may be provided over the semiconductor device 10. Alternatively, the semiconductor device 10 may be provided only with the pixel portion 12 and the monitor circuit 20 without the gate line driver circuit 16, the signal line driver circuit 18, and the terminal portion 22.

The terminal portion 22 means a portion having terminals for inputting one or more of power, a control signal, and an image signal to the semiconductor device 10 from external circuits. The terminal portion 22 may be electrically connected to a timing control circuit (also referred to as a controller or a control IC) or the like.

Although FIG. 1A illustrates as an example the configuration in which the plurality of pixels 14 in the pixel portion 12 are arranged in a matrix (a stripe arrangement), one embodiment of the present invention is not limited thereto, and delta arrangement or pentile arrangement may be employed for the pixels 14, for example. Note that color components controlled in the pixel 14 at the time of color display are not limited to three colors of R, G, and B (R, G, and B correspond to red, green, and blue, respectively), and color components of more than three colors may be employed, for example, R, G, B, and W (W corresponds to white); or R, G, B, and one or more of Y (yellow), C (cyan), M (magenta), and the like. Further, the size of a display region may be different depending on respective dots of the color components.

The pixel 14 includes at least a light-emitting element. In a light-emitting element, by application of voltage to the light-emitting element, electrons are injected from one of a pair of electrodes included in the light-emitting element and holes are injected from the other of the pair of electrodes, into a layer containing a light-emitting compound; thus, current flows. The electrons and holes are recombined; thus, the light-emitting compound is excited. The light-emitting organic compound returns to a ground state from the excited state, thereby emitting light. Based on such a mechanism, such a light-emitting element is referred to as a current-excitation type light-emitting element.

<1-1. Characteristics of Light-Emitting Element>

Characteristics of a light-emitting element included in the pixel 14 are described below. First, luminance-current (L-I) characteristics and current-voltage (I-V) characteristics which are examples of the characteristics of the light-emitting element are described with reference to FIGS. 2A and 2B.

Figure 2A:
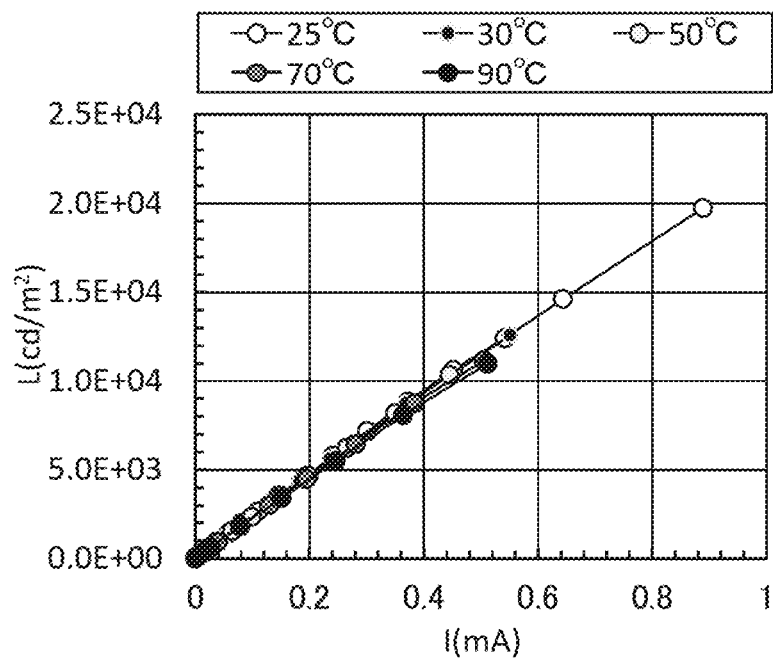
FIGS. 2A and 2B show L-I characteristics of a light-emitting element and I-V characteristics of the light-emitting element, respectively.

FIG. 2A shows L-I characteristics of the light-emitting element. As shown in FIG. 2A, the luminance of the light-emitting element gets higher in proportion to a current which flows therethrough. That is, there is no change or an extremely small change due to environmental temperature (hereinafter referred to as temperature dependence in some cases) in the L-I characteristics of the light-emitting element.

Figure 2B:
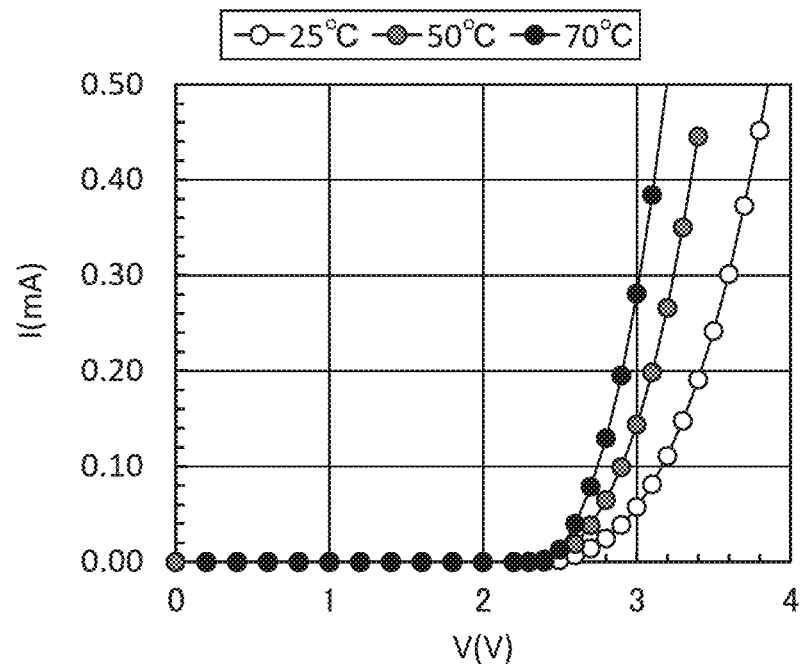

FIG. 2B shows I-V characteristics of the light-emitting element. Since the resistance of the light-emitting element changes in accordance with temperature, the luminance also changes with change in the temperature. For example, as shown in FIG. 2B, in the case where the same voltage is applied, when the temperature of the light-emitting element becomes higher than 25° C., the current which flows through the light-emitting element is increased.

Thus, the semiconductor device of one embodiment of the present invention includes the monitor circuit 20 in order to reduce temperature dependence of the light-emitting element. The monitor circuit 20 has a function of adjusting luminance of the light-emitting element included in the pixel 14 in accordance with environmental temperature. Here, an example of the monitor circuit 20 is described.

<1-2. Configuration of Monitor Circuit>

Figure 1B:
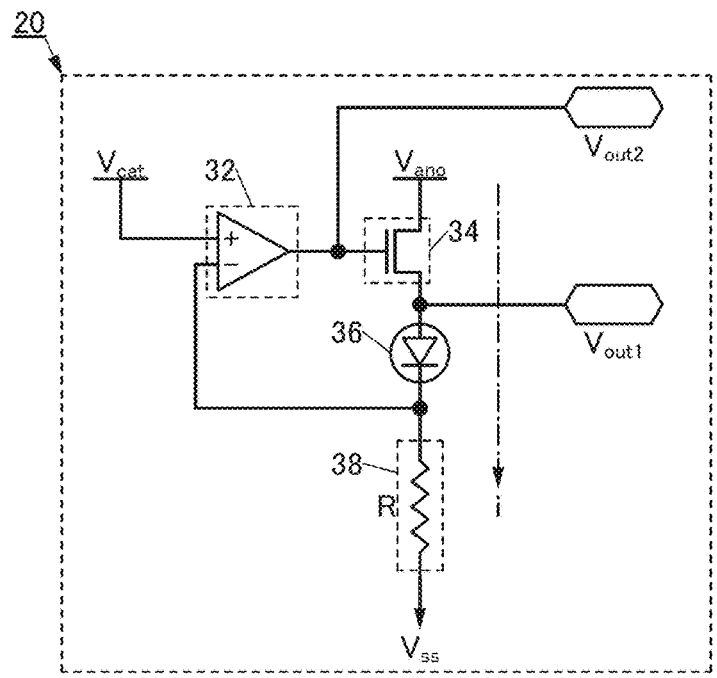

FIG. 1B is a circuit diagram illustrating an example of the monitor circuit 20 included in the semiconductor device of one embodiment of the present invention.

The monitor circuit 20 illustrated in FIG. 1B includes an amplifier circuit 32, a transistor 34, a light-emitting element 36, and a resistor 38.

One input terminal of the amplifier circuit 32 is electrically connected to a power supply line to which a potential $V_{cat}$ is applied, and the other input terminal of the amplifier circuit 32 is electrically connected to a terminal on the cathode side of the light-emitting element 36. An output terminal of the amplifier circuit 32 is electrically connected to a wiring to which a potential $V_{out2}$ is applied and a gate of the transistor 34.

One of a source and a drain of the transistor 34 is electrically connected to a power supply line to which a potential $V_{ano}$ is applied, and the other of the source and the drain of the transistor 34 is electrically connected to an anode of the light-emitting element 36 and a wiring to which a potential $V_{out1}$ is applied.

The cathode of the light-emitting element 36 is electrically connected to one electrode of the resistor 38, and the other electrode of the resistor 38 is electrically connected to a wiring to which a potential $V_{ss}$ is applied.

For example, in the case of the monitor circuit 20 illustrated in FIG. 1B, a value i of current flowing from the wiring to which the potential $V_{ano}$ is applied to the wiring to which the potential $V_{ss}$ is applied can be expressed by the following Formula 1.

$$(V_{cat}-V_{ss})/R \quad (1)$$

Thus, it is preferable that the resistance R of the resistor 38 have no temperature dependence and be constant. A voltage $V_{gs}$ which is necessary to supply the current value i can be obtained from $V_{out2}-V_{out1}$, and a voltage applied to the light-emitting element 36 can be obtained from $V_{out1}-V_{cat}$.

For the resistor 38, an oxide conductor (OC) which is a material of an oxide semiconductor (OS) that has become a conductor is preferably used. The oxide conductor (OC) has a small resistance change due to environmental temperature. That is, the oxide conductor (OC) can be used as a resistant material having low temperature dependence. However, the resistor 38 is not necessarily formed using the oxide conductor (OC) and another material having low temperature dependence may be used.

The transistor 34 preferably includes an oxide semiconductor (OS) in an active layer. The oxide semiconductor (OS) can be formed in the same manufacturing steps as the above-described oxide conductor (OC). Note that characteristics of the oxide semiconductor (OS) of the transistor 34 might change in accordance with environmental temperature, similar to those of the light-emitting element 36. For example, in the case where a transistor including an oxide semiconductor (OS) is used as a driving transistor of the light-emitting element, Vas of the transistor might be increased when the environmental temperature rises.

Figure 3:
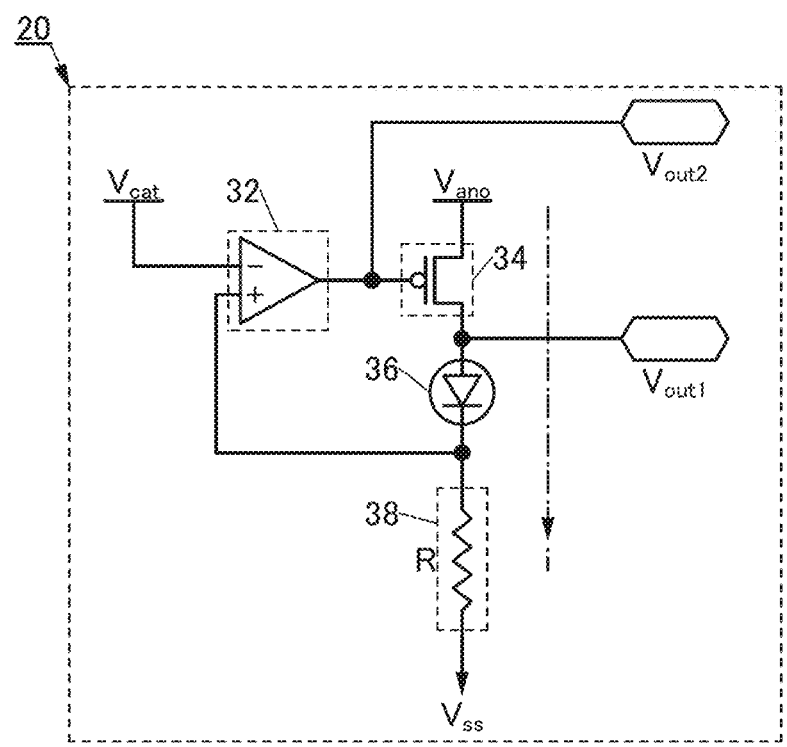
FIG. 3 is a circuit diagram illustrating one embodiment of a monitor circuit.

Note that although FIG. 1B illustrates as an example the monitor circuit 20 having a configuration in which an n-channel transistor is used as the transistor 34, one embodiment of the present invention is not limited thereto, and a configuration illustrated in FIG. 3 may be employed, for example. FIG. 3 is a circuit diagram illustrating an example of the monitor circuit 20. As in the monitor circuit 20 illustrated in FIG. 3, a p-channel transistor may be used as the transistor 34, and the polarities of the amplifier circuit 32 may be switched.

Here, the temperature dependence of a transistor including an oxide semiconductor (OS) and that of an oxide conductor (OC) are described.

<2-1. Temperature Dependence of Transistor Including Oxide Semiconductor>

First, temperature dependence of a transistor including an oxide semiconductor is described. Here, transistors corresponding to a transistor 600 illustrated in FIGS. 4A to 4C were fabricated, and their temperature characteristics were evaluated.

<2-2. Transistor Structure>

Figure 4A:
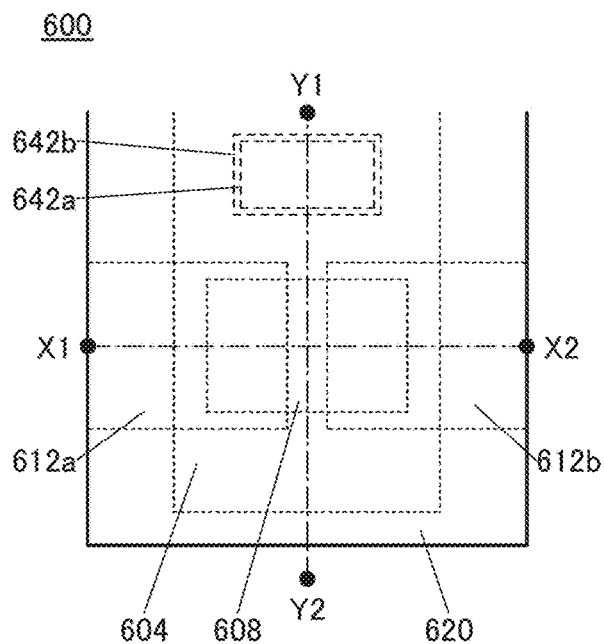
FIGS. 4A to 4C are a top view and cross-sectional views illustrating one embodiment of a transistor.
Figure 4B:
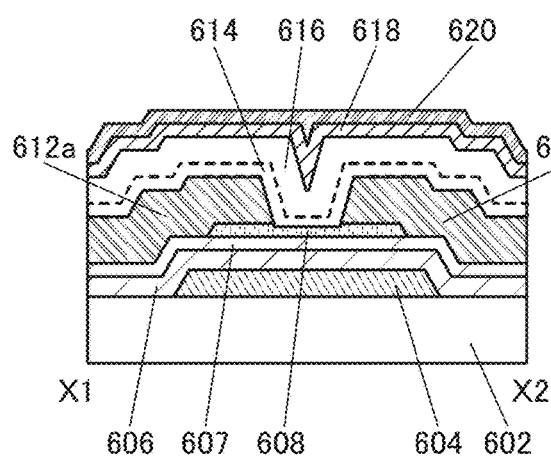
Figure 4C:
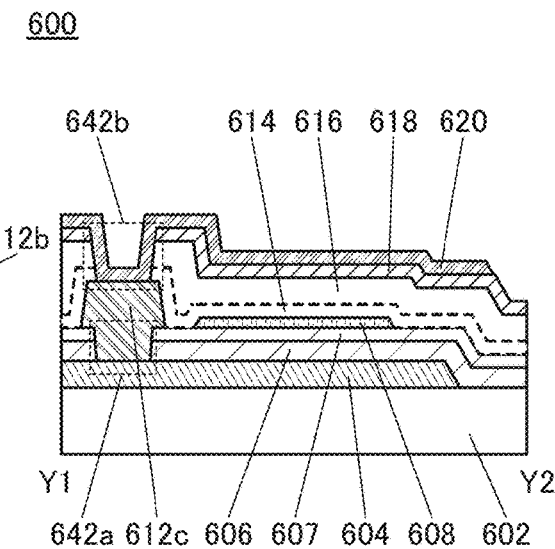

FIG. 4A is a top view of the transistor 600. FIG. 4B is a cross-sectional view taken along the dashed dotted line X1-X2 in FIG. 4A, and FIG. 4C is a cross-sectional view taken along the dashed dotted line Y1-Y2 in FIG. 4A. Note that in FIG. 4A, some components of the transistor 600 (e.g., an insulating film functioning as a gate insulating film) are not illustrated to avoid complexity. The direction of the dashed dotted line X1-X2 may be called a channel length direction, and the direction of the dashed dotted line Y1-Y2 may be called a channel width direction. As in FIG. 4A, some components might not be illustrated in some top views of transistors described below.

The transistor 600 includes a conductive film 604 functioning as a first gate electrode over a substrate 602, an insulating film 606 over the substrate 602 and the conductive film 604, an insulating film 607 over the insulating film 606, an oxide semiconductor film 608 over the insulating film 607, a conductive film 612a functioning as a source electrode electrically connected to the oxide semiconductor film 608, and a conductive film 612b functioning as a drain electrode electrically connected to the oxide semiconductor film 608.

Insulating films 614, 616, and 618 are provided over the transistor 600, specifically, over the conductive films 612a and 612b and the oxide semiconductor film 608. A conductive film 620 is provided over the insulating film 618. An opening 642a reaching the conductive film 604 is provided in the insulating films 606 and 607, and a conductive film 612c is formed to cover the opening 642a. An opening 642b reaching the conductive film 612c is formed in the insulating films 614, 616, and 618. The conductive film 620 is connected to the conductive film 612c through the opening 642b. That is, the conductive film 604 and the conductive film 620 are electrically connected to each other. Note that the conductive film 620 functions as a second gate electrode (also referred to as a back-gate electrode) of the transistor 600.

For the evaluation in this embodiment, two samples which are different in structure of the oxide semiconductor film 608 (hereinafter the samples are referred to as a sample A1 and a sample A2) were fabricated as transistors each corresponding to the transistor 600 illustrated in FIGS. 4A to 4C. In each of the samples A1 and A2, the channel length L was 3 μm and the channel width W was 5 μm.

<2-3. Method of Manufacturing Transistor>

A method of manufacturing the samples A1 and A2 is described below.

First, the conductive film 604 was formed over the substrate 602. A glass substrate was used as the substrate 602. As the conductive film 604, a 100-nm-thick tungsten film was formed with a sputtering apparatus.

Next, the insulating films 606 and 607 were formed over the substrate 602 and the conductive film 604. As the insulating film 606, a 400-nm-thick silicon nitride film was formed with a PECVD apparatus. As the insulating film 607, a 50-nm-thick silicon oxynitride film was formed with a PECVD apparatus.

Next, the oxide semiconductor film 608 was formed over the insulating film 607.

The oxide semiconductor film 608 in the sample A1 had a stacked-layer structure of IGZO films with different compositions. A first IGZO film was deposited under the conditions where the substrate temperature was 170° C., an argon gas at a flow rate of 140 sccm and an oxygen gas at a flow rate of 60 sccm were introduced into a chamber, the pressure was 0.6 Pa, and an AC power of 2500 W was applied to a metal oxide sputtering target (having an atomic ratio of In:Ga:Zn=4:2:4.1). Note that the thickness of the first IGZO film was 10 nm. A second IGZO film was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a metal oxide sputtering target (having an atomic ratio of In:Ga:Zn=1:1:1.2). Note that the thickness of the second IGZO film was 15 nm.

The oxide semiconductor film 608 in the sample A2 had a single-layer structure of an IGZO film. An IGZO film of the sample A2 was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a metal oxide sputtering target (having an atomic ratio of In:Ga:Zn=1:1:1.2). Note that the thickness of the IGZO film of the sample A2 was 35 nm.

Then, first heat treatment was performed. As the first heat treatment, heat treatment was performed at 450° C. in a nitrogen atmosphere for one hour and then heat treatment was performed at 450° C. in a mixed atmosphere of nitrogen and oxygen for one hour.

Next, a resist mask was formed over the insulating film 607 and the oxide semiconductor film 608, and a desired region was etched to form the opening 642a reaching the conductive film 604. The opening 642a was formed with a dry etching apparatus. Note that the resist mask was removed after the formation of the opening 642a.

Next, a conductive film was formed over the insulating film 607, the oxide semiconductor film 608, and the opening 642a. A resist mask was formed over the conductive film, and a desired region was etched to form the conductive films 612a, 612b, and 612c. As the conductive films 612a, 612b, and 612c, a 50-nm-thick tungsten film, a 400-nm-thick aluminum film, and a 100-nm-thick titanium film were successively formed in this order in a vacuum with a sputtering apparatus. The resist mask was removed after the formation of the conductive films 612a, 612b, and 612c.

Next, a phosphoric acid solution (a solution obtained by diluting an 85% phosphoric acid solution with pure water by 100 times) was applied from above the insulating film 607, the oxide semiconductor film 608, and the conductive films 612a and 612b. Thus, part of the surface of the oxide semiconductor film 608 which is not covered with the conductive films 612a and 612b was removed.

Next, the insulating films 614 and 616 were formed over the insulating film 607, the oxide semiconductor film 608, and the conductive films 612a and 612b. As the insulating film 614, a 50-nm-thick silicon oxynitride film was formed with a PECVD apparatus. As the insulating film 616, a 400-nm-thick silicon oxynitride film was formed with a PECVD apparatus. Note that the insulating film 614 and the insulating film 616 were formed successively in a vacuum with a PECVD apparatus.

The insulating film 614 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 616 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, second heat treatment was performed. The second heat treatment was performed at 350° C. in a nitrogen atmosphere for one hour.

Next, a protective film was formed over the insulating film 616. As the protective film, a 5-nm-thick ITSO film was formed with a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target ($In_2O_3$:$SnO_2$:$SiO_2$=85:10:5 [wt. %]) provided in the sputtering apparatus.

Next, oxygen addition treatment was performed on the insulating films 614 and 616 through the protective film. The oxygen addition treatment was performed with an ashing apparatus under the conditions where the substrate temperature was 40° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so as to apply a bias to the substrate side.

Next, the protective film was removed to expose the surface of the insulating film 616. The protective film was removed in such a manner that treatment with an oxalic acid solution containing an oxalic acid at a concentration of 5% was performed for 300 sec. and then treatment with a hydrofluoric acid solution containing a hydrofluoric acid at a concentration of 0.5% was performed for 15 sec.

Next, the insulating film 618 was formed over the insulating film 616. As the insulating film 618, a 100-nm-thick silicon nitride film was formed with a PECVD apparatus. The insulating film 618 was deposited under the conditions where the substrate temperature was 350° C.; a silane gas at a flow rate of 50 sccm, a nitrogen gas at a flow rate of 5000 sccm, and an ammonia gas at a flow rate of 100 sccm were introduced into a chamber; the pressure was 100 Pa; and an RF power of 1000 W was supplied between parallel-plate electrodes provided in a PECVD apparatus. Note that preheating was not performed on the substrate before formation of the insulating film 618.

Next, a resist mask was formed over the insulating film 618, and a desired region was etched to form the opening 642b reaching the conductive film 612c. The opening 642b was formed with a dry etching apparatus. Note that the resist mask was removed after the formation of the opening 642b.

Next, a conductive film was formed over the insulating film 618 to cover the opening 642b, and the conductive film was processed to form the conductive film 620. As the conductive film 620, a 100-nm-thick ITSO film was formed with a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 3200 W was supplied to a metal oxide target provided in a sputtering apparatus. Note that the composition of the metal oxide target used for forming the ITSO film was the same as that of the metal oxide target used for forming the above-described protective film.

Then, third heat treatment was performed. The third heat treatment was performed at 250° C. in a nitrogen atmosphere for one hour.

Through the above process, the samples A1 and A2 were fabricated.

<2-4. Evaluation of Temperature Dependence>

Next, the temperature dependence of the above fabricated samples A1 and A2 was evaluated.

Figure 5:
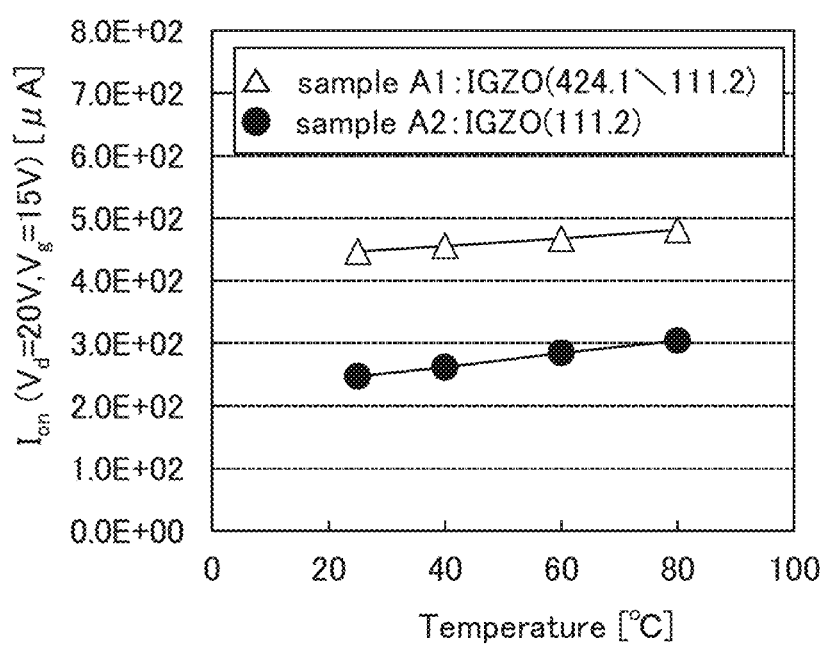
FIG. 5 shows temperature characteristics of transistors.

To evaluate the temperature dependence of the transistors, the on-state currents ($I_{on}$) of the transistors were measured under the conditions where substrate temperatures were 25° C., 40° C., 60° C., and 80° C. Note that a drain voltage ($V_d$) was set to 20 V, and a gate voltage ($V_g$) was set to 15 V. FIG. 5 shows the results of temperature dependence of the samples A1 and A2.

As shown in FIG. 5, the amount of $I_{on}$ of the transistors of both of the samples A1 and A2 increases as the substrate temperature rises.

This shows that a transistor including an oxide semiconductor has temperature dependence.

<3-1. Temperature Dependence of Oxide Conductor>

Next, the temperature dependence of the oxide conductor is described. Here, samples corresponding to a sample 650 for evaluation which is illustrated in FIGS. 6A and 6B were fabricated, and the temperature characteristics of the samples were evaluated.

<3-2. Structure of Sample for Evaluation>

Figure 6A:
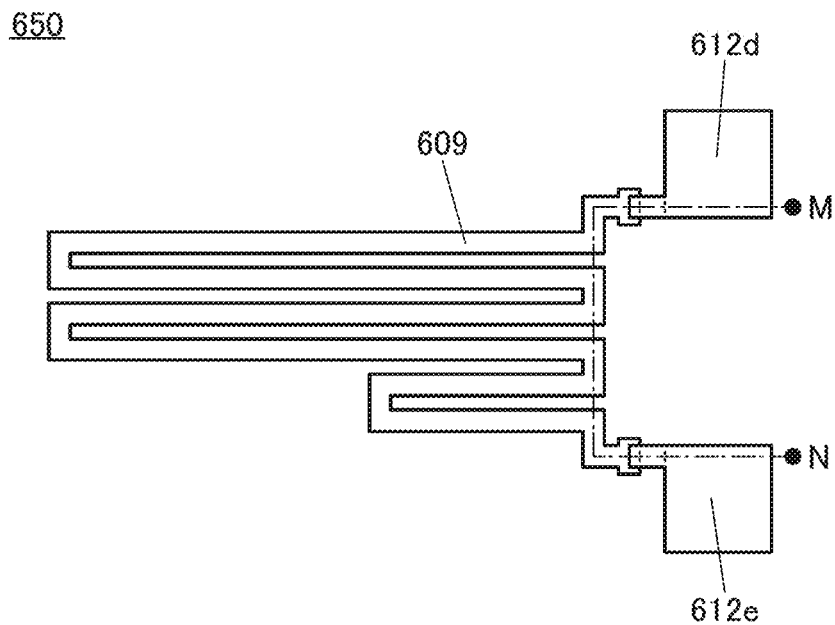
FIGS. 6A and 6B are a top view and a cross-sectional view illustrating one embodiment of a sample for evaluation.
Figure 6B:
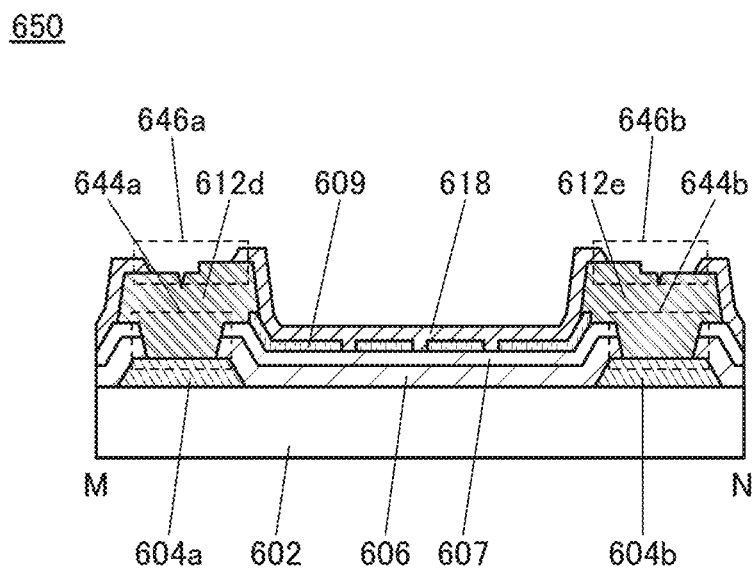

FIG. 6A is a top view of the sample 650 for evaluation, and FIG. 6B is a cross-sectional view taken along the dashed dotted line M-N in FIG. 6A.

The sample 650 for evaluation includes a conductive film 604a over the substrate 602, a conductive film 604b over the substrate 602, the insulating film 606 covering the substrate 602 and the conductive films 604a and 604b, the insulating film 607 over the insulating film 606, an oxide conductive film 609 over the insulating film 607, a conductive film 612d connected to the conductive film 604a through an opening 644a provided in the insulating films 606 and 607, a conductive film 612e connected to the conductive film 604b through an opening 644b provided in the insulating films 606 and 607, and an insulating film 618 covering the insulating film 607, the oxide conductive film 609, and the conductive films 612d and 612e.

Note that the conductive films 612d and 612e are connected to the oxide conductive film 609. In addition, openings 646a and 646b are provided in the insulating film 618 over the conductive films 612d and 612e, respectively.

In this embodiment, samples corresponding to the sample in FIGS. 6A and 6B were fabricated, and resistance of the oxide conductive film 609 in each sample was evaluated. Note that two samples which are different in structure of the oxide conductive film 609 (hereinafter the samples are referred to as a sample B1 and a sample B2) were fabricated and evaluated. Note that in each of the samples B1 and B2, the size (W/L) of the oxide conductive film 609 was 10 µm/1500 µm.

<3-3. Method of Fabricating Sample for Evaluation>

A method of fabricating the samples B1 and B2 is described below.

First, the conductive films 604a and 604b were formed over the substrate 602. A glass substrate was used as the substrate 602. As the conductive films 604a and 604b, a 100-nm-thick tungsten film was formed with a sputtering apparatus.

Next, the insulating films 606 and 607 were formed over the substrate 602 and the conductive films 604a and 604b. As the insulating film 606, a 400-nm-thick silicon nitride film was formed with a PECVD apparatus. As the insulating film 607, a 50-nm-thick silicon oxynitride film was formed with a PECVD apparatus.

Next, an oxide semiconductor film was formed over the insulating film 607.

The structure of the oxide semiconductor film of the sample B1 was the same as that of the sample A1. The structure of the oxide semiconductor film of the sample B2 was the same as that of the sample A2.

Then, first heat treatment was performed. As the first heat treatment, heat treatment was performed at 450° C. in a nitrogen atmosphere for one hour and then heat treatment was performed at 450° C. in a mixed atmosphere of nitrogen and oxygen for one hour.

Next, a resist mask was formed over the insulating film 607 and the oxide semiconductor film, and desired regions were etched to form the openings 644a and 644b reaching the conductive films 604a and 604b, respectively. The openings 644a and 644b were formed with a dry etching apparatus. Note that the resist mask was removed after the formation of the openings 644a and 644b.

Next, a conductive film was formed over the insulating film 607, the oxide semiconductor film, and the openings 644a and 644b. A resist mask was formed over the conductive film, and a desired region was etched to form the conductive films 612d and 612e. As the conductive films 612d and 612e, a 50-nm-thick tungsten film, a 400-nm-thick aluminum film, and a 100-nm-thick titanium film were successively formed in this order in a vacuum with a sputtering apparatus. The resist mask was removed after the formation of the conductive films 612d and 612e.

Next, a phosphoric acid solution (a solution obtained by diluting an 85% phosphoric acid solution with pure water by 100 times) was applied from above the insulating film 607, the oxide semiconductor film, and the conductive films 612d and 612e. Thus, part of the surface of the oxide semiconductor film was removed.

Next, the insulating films 614 and 616 were formed over the insulating film 607, the oxide semiconductor film, and the conductive films 612d and 612e. As the insulating film 614, a 50-nm-thick silicon oxynitride film was formed with a PECVD apparatus. As the insulating film 616, a 400-nm-thick silicon oxynitride film was formed with a PECVD apparatus. Note that the insulating film 614 and the insulating film 616 were formed successively in a vacuum with a PECVD apparatus.

The insulating film 614 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 616 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, second heat treatment was performed. The second heat treatment was performed at 350° C. in a nitrogen atmosphere for one hour.

Next, a protective film was formed over the insulating film 616. As the protective film, a 5-nm-thick ITSO film was formed with a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target ($In_2O_3$:$SnO_2$:$SiO_2$=85:10:5 [wt. %]) provided in the sputtering apparatus.

Next, oxygen addition treatment was performed on the insulating films 614 and 616 through the protective film. The oxygen addition treatment was performed with an ashing apparatus under the conditions where the substrate temperature was 40° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so as to apply a bias to the substrate side.

Next, the ITSO film was removed to expose the surface of the insulating film 616. The protective film was removed in such a manner that treatment with an oxalic acid solution containing an oxalic acid at a concentration of 5% was performed for 300 sec. and then treatment with a hydrofluoric acid solution containing a hydrofluoric acid at a concentration of 0.5% was performed for 15 sec.

Next, the insulating films 614 and 616 were removed to expose the insulating film 607, the oxide semiconductor film, and the conductive films 612d and 612e.

Next, the insulating film 618 was formed over the insulating film 607, the oxide semiconductor film, and the conductive films 612d and 612e. As the insulating film 618, a 100-nm-thick silicon nitride film was formed with a PECVD apparatus. The insulating film 618 was deposited under the conditions where the substrate temperature was 350° C.; a silane gas at a flow rate of 50 sccm, a nitrogen gas at a flow rate of 5000 sccm, and an ammonia gas at a flow rate of 100 sccm were introduced into a chamber; the pressure was 100 Pa; and an RF power of 1000 W was supplied between parallel-plate electrodes provided in a PECVD apparatus. Note that preheating was not performed on the substrate before formation of the insulating film 618.

Note that when the insulating film 618 is formed, hydrogen in the insulating film 618 enters the oxide semiconductor film, so that the oxide semiconductor film serves as the oxide conductive film 609.

Next, a resist mask was formed over the insulating film 618, and desired regions were etched to form the openings 646a and 646b reaching the conductive films 612d and 612e, respectively. The openings 646a and 646b were formed with a dry etching apparatus. Note that the resist mask was removed after the formation of the openings 646a and 646b.

Then, third heat treatment was performed. The third heat treatment was performed at 250° C. in a nitrogen atmosphere for one hour.

Through the above process, the samples B1 and B2 were fabricated.

<3-4. Evaluation of Temperature Dependence>

Next, the temperature dependence of resistance of the above fabricated samples B1 and B2 was evaluated.

Figure 7:
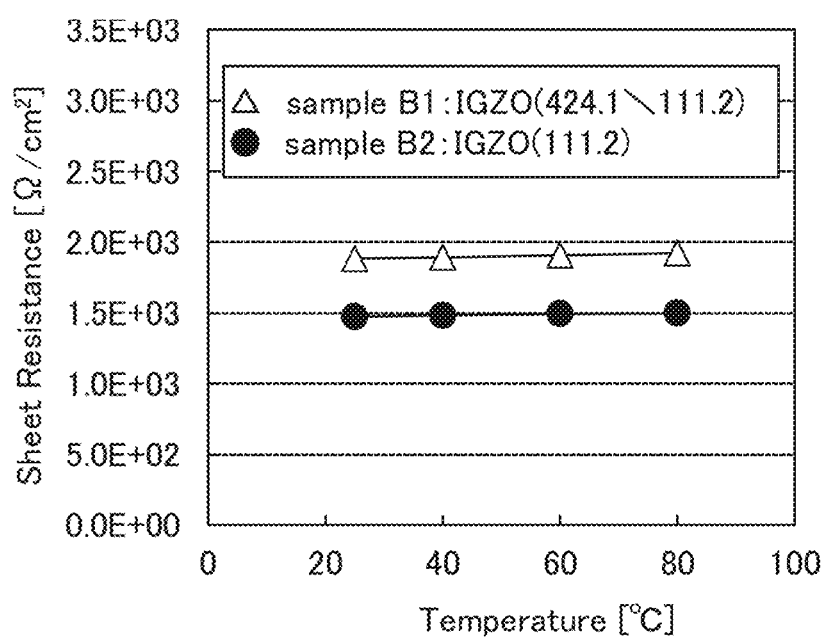
FIG. 7 shows temperature characteristics of resistance of the sample for evaluation.

To evaluate the temperature dependence of the samples for evaluation, the sheet resistance of the samples for evaluation was measured under the conditions where substrate temperatures were 25° C., 40° C., 60° C., and 80° C. FIG. 7 shows the results of temperature dependence of resistance of the samples B1 and B2.

As shown in FIG. 7, sheet resistance of both of the samples B1 and B2 changed little even with change in the substrate temperature.

As described above, the oxide conductor film (OC) has no temperature dependence of resistance or extremely low temperature dependence of resistance.

As described above, according to one embodiment of the present invention, luminance variation in a light-emitting element can be inhibited in such a manner that change in the value of current flowing through the light-emitting element, which is caused by change in environmental temperature, is monitored and corrected by a monitor circuit including an oxide conductor (OC) the resistance of which scarcely changes owing to change in environmental temperature. Thus, it is possible to provide a semiconductor device and a display device whose display quality is excellent even with change in the environmental temperature.

The structure described in this embodiment can be combined as appropriate with any of the structures described in the other embodiments.

Embodiment 2

In this embodiment, a correction method with the monitor circuit described in Embodiment 1 will be described with reference to FIG. 8, FIG. 9, FIGS. 10A and 10B, FIGS. 11A and 11B, FIGS. 12A and 12B, FIGS. 13A and 13B, and FIGS. 14A and 14B.

<Correction Method of Monitor Circuit>

Figure 8:
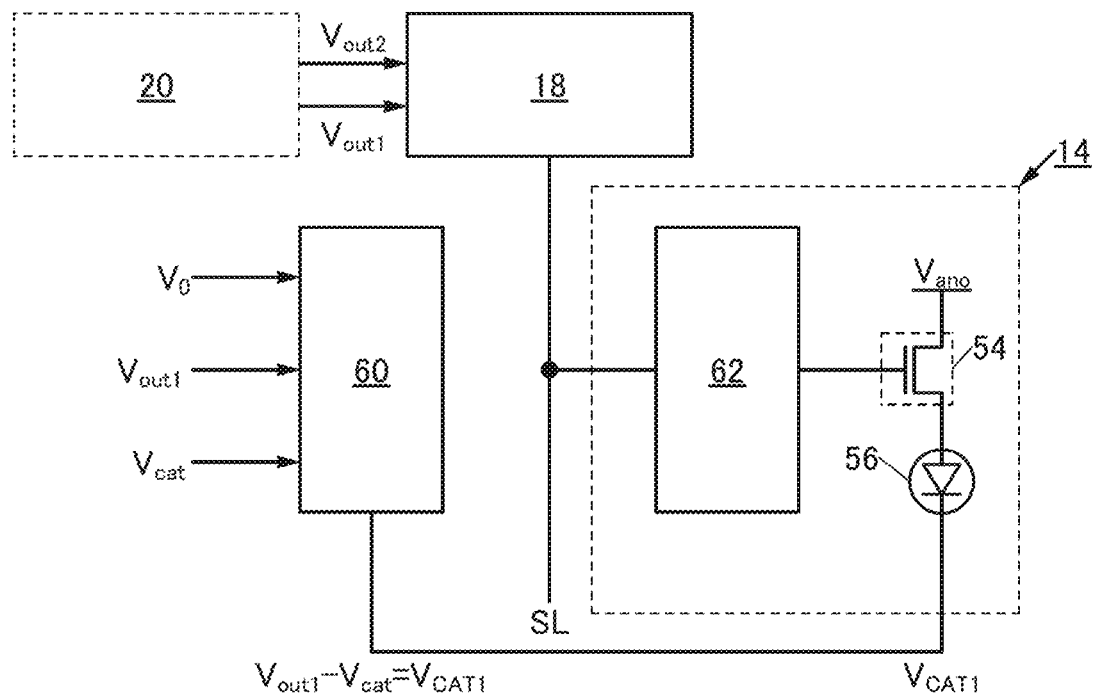
FIG. 8 is a block diagram illustrating a correction method with a monitor circuit.

FIG. 8 is a block diagram illustrating a correction method of a light-emitting element with the monitor circuit of one embodiment of the present invention.

In the block diagram illustrated in FIG. 8, the pixel 14 includes a circuit group 62, a driving transistor 54, and a light-emitting element 56. A cathode of the light-emitting element 56 is electrically connected to a correction circuit 60. An anode of the light-emitting element 56 is electrically connected to one of a source and a drain of the driving transistor 54, and the other of the source and the drain of the driving transistor 54 is electrically connected to a wiring to which a potential $V_{ano}$ is applied. A gate of the driving transistor 54 is electrically connected to one terminal of the circuit group 62, and the other terminal of the circuit group 62 is electrically connected to the signal line driver circuit 18 through a signal line SL. The signal line driver circuit 18 is electrically connected to the monitor circuit 20.

Note that in the block diagram illustrated in FIG. 8, the potential $V_{ano}$ is fixed to control an amplitude of video data input into the gate of the driving transistor 54 through the signal line SL and the circuit group 62 or a potential of the cathode side of the light-emitting element 56 is controlled by the correction circuit 60, so that temperature dependence of the light-emitting element 56 and temperature dependence of $V_{gs}$ of the driving transistor 54 can be inhibited. In this manner, the monitor circuit 20 can be used to adjust a difference (a potential difference) between the potential of the video data (e.g., a low-level potential) and the potential on the cathode side of the light-emitting element 56. Note that the potential difference may be adjusted with a temperature sensor or the like instead of the monitor circuit 20.

The amplitude of the video data input into the gate of the driving transistor 54 is adjusted by, for example, D/A converter (DAC). For example, the amplitude of the video data is determined by referring to a potential $V_{out1}$ and a potential $V_{out2}$ which are output from the monitor circuit 20.

As the potential on the cathode side of the light-emitting element 56, a potential $V_{CAT1}$ is generated so that a potential $V_0$ (the potential $V_0$ is the lowest potential of data) and the potential $V_{out1}$ are constant. For example, the potential $V_{CAT1}$ can be set to the value of a difference between the potential $V_{out1}$ and the potential $V_{cat}$.

In the circuit group 62, a variety of elements such as a transistor (e.g., a selection transistor) and a capacitor can be provided. For example, any of the following structure examples 1 to 5 can be employed for the pixel circuit of the circuit group 62.

<Structure Example 1 of Pixel Circuit>

Figure 9:
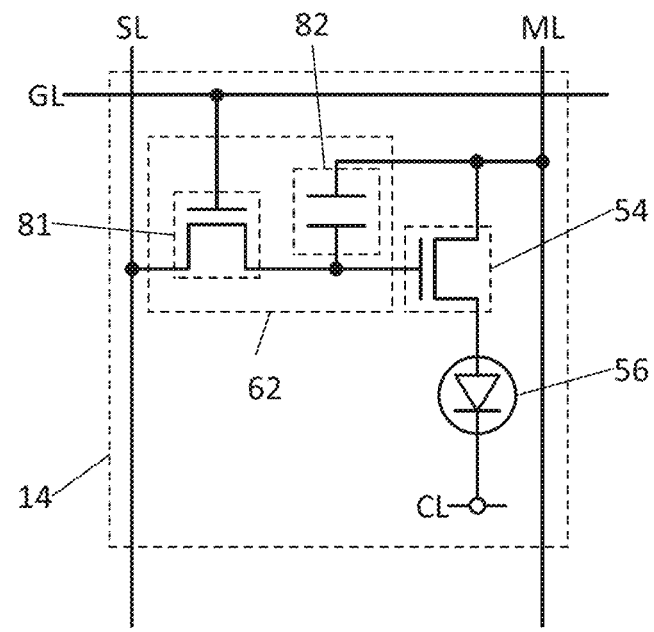
FIG. 9 is a circuit diagram illustrating one embodiment of a pixel circuit.

In a pixel circuit illustrated in FIG. 9, one pixel includes two n-channel transistors and one capacitor.

Note that an example in which an n-channel transistor is used as the transistor in the pixel 14 is shown. Note that a transistor formed through the same steps as the transistor in the pixel 14 may be used for a driver circuit. Furthermore, digital time grayscale driving can be employed for the pixel circuit illustrated in FIG. 9.

The configuration of the pixel circuit and operation of a pixel employing digital time grayscale driving are described.

The pixel 14 includes a selection transistor 81, the driving transistor 54, the light-emitting element 56, and a capacitor 82. A gate of the selection transistor 81 is connected to a gate line GL, and one of a source and a drain of the selection transistor 81 is connected to the signal line SL and the other thereof is connected to the gate of the driving transistor 54. The gate of the driving transistor 54 is connected to a wiring ML through the capacitor 82, and the one of the source and the drain of the driving transistor 54 is connected to the wiring ML and the other thereof is connected to the anode of the light-emitting element 56. The cathode of the light-emitting element 56 is electrically connected to a wiring CL.

Note that gate capacitance of the driving transistor 54 may be used as a substitute for the capacitor 82 in some cases, so that the capacitor 82 can be omitted. The gate capacitance of the driving transistor 54 may be formed between the channel region and the gate.

Next, a signal input into the driving transistor 54 is described. In the case of a voltage-input voltage driving method, video data for turning on or off the driving transistor 54 is input into the driving transistor 54. In order for the driving transistor 54 to operate in a linear region, voltage higher than the voltage applied to the wiring ML is applied to the gate of the driving transistor 54. Note that voltage higher than the threshold voltage $V_{th}$ of the driving transistor 54 is applied to the signal line SL.

In the case of performing analog grayscale driving, a voltage higher than or equal to a voltage which is the sum of the forward voltage of the light-emitting element 56 and the threshold voltage $V_{th}$ of the driving transistor 54 is applied to the gate of the driving transistor 54. Video data by which the driving transistor 54 is operated in a saturation region is input, so that current is supplied to the light-emitting element 56. In order for the driving transistor 54 to operate in a saturation region, the potential applied to the wiring ML is set higher than the gate potential of the driving transistor 54. When analog video data is used, it is possible to supply current to the light-emitting element 56 in accordance with the video data and perform analog grayscale driving.

<Structure Example 2 of Pixel Circuit>

Figure 10A:
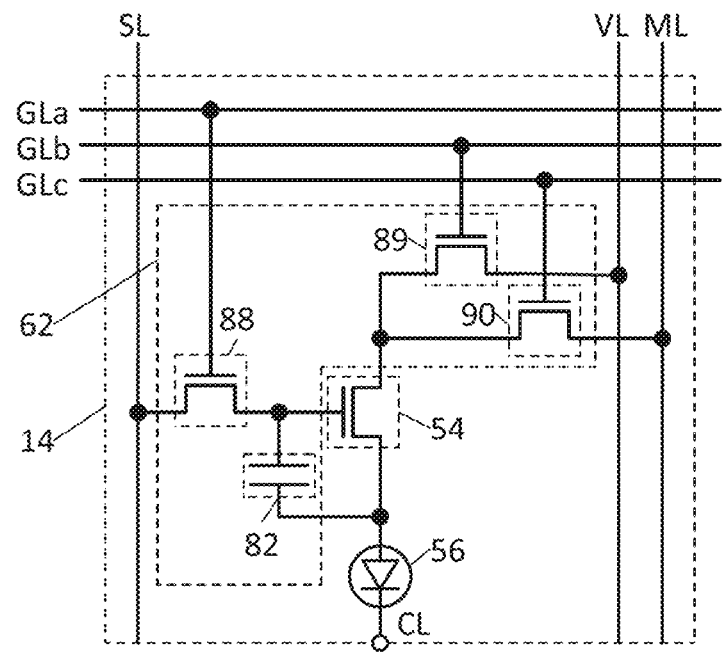
FIGS. 10A and 10B are a circuit diagram and a timing chart illustrating one embodiment of a pixel circuit.

In a pixel circuit illustrated in FIG. 10A, one pixel includes four n-channel transistors and one capacitor.

The pixel 14 illustrated in FIG. 10A includes the driving transistor 54, a selection transistor 88, a transistor 89, a transistor 90, the capacitor 82, and the light-emitting element 56.

The potential of the anode of the light-emitting element 56 is controlled in accordance with an image signal Sig input into the pixel 14. The luminance of the light emitting element 56 depends on a potential difference between the anode and the cathode.

The selection transistor 88 has a function of controlling conduction between the signal line SL and the gate of the driving transistor 54. The one of the source and the drain of the driving transistor 54 is connected to the anode of the light-emitting element 56. The transistor 89 has a function of controlling conduction between a wiring VL and the other of the source and the drain of the driving transistor 54. The transistor 90 has a function of controlling conduction between the wiring ML and the other of the source and the drain of the driving transistor 54. One of a pair of electrodes of the capacitor 82 is connected to the gate of the driving transistor 54, and the other thereof is connected to the anode of the light-emitting element 56.

The switching of the selection transistor 88 is performed in accordance with a potential of a gate line GLa which is connected to a gate of the selection transistor 88. The switching of the transistor 89 is performed in accordance with a potential of a gate line GLb which is connected to a gate of the transistor 89. The switching of the transistor 90 is performed in accordance with a potential of a gate line GLc which is connected to a gate of the transistor 90.

Next, an example of operation of the pixel 14 illustrated in FIG. 10A for external correction is described.

Figure 10B:
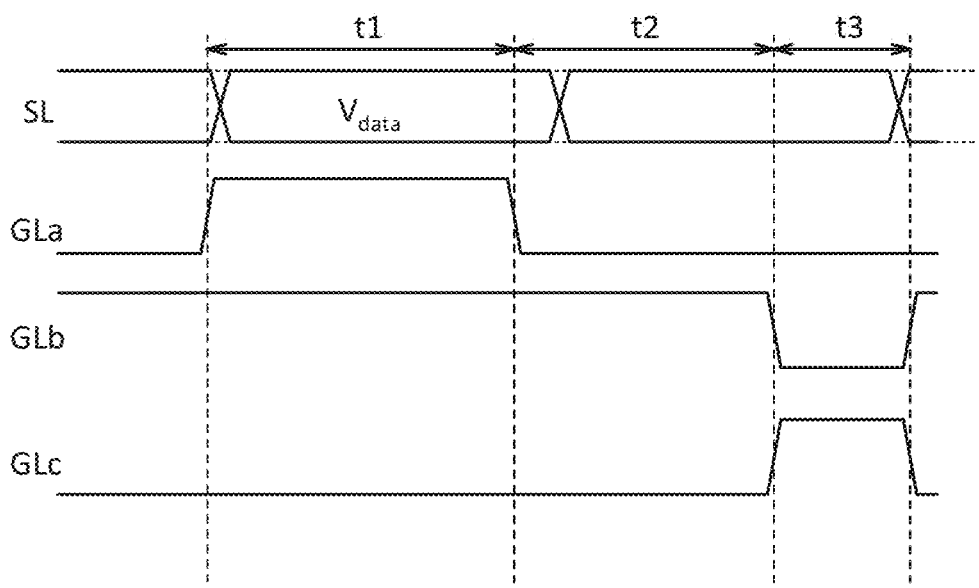

FIG. 10B shows an example of a timing chart of the potentials of the gate line GLa, the gate line GLb, and the gate line GLc, which are connected to the pixel 14 illustrated in FIG. 10A, and a potential of the image signal Sig supplied to the signal line SL. Note that in the timing chart in FIG. 10B, all the transistors included in the pixel 14 in FIG. 10A are n-channel transistors.

First, in a period t1, a high-level potential is applied to the gate line GLa, a high-level potential is applied to the gate line GLb, and a low-level potential is applied to the gate line GLc. As a result, the selection transistor 88 and the transistor 89 are turned on, and the transistor 90 is turned off. A potential $V_{data}$ of the image signal Sig is applied to the signal line SL, and the potential $V_{data}$ is applied to the gate of the driving transistor 54 through the selection transistor 88.

A potential $V_{ano}$ is applied to the wiring VL, and a potential $V_{cat}$ is applied to the wiring CL. The potential $V_{ano}$ is preferably higher than the sum of the potential $V_{cat}$ and the threshold voltage $V_{the}$ of the light-emitting element 56. The potential $V_{ano}$ of the wiring VL is applied to the other of the source and the drain of the driving transistor 54 through the transistor 89. Thus, the value of the drain current of the driving transistor 54 is determined by the potential $V_{data}$. Then, the drain current is supplied to the light-emitting element 56, whereby the luminance of the light-emitting element 56 is determined.

Next, in a period t2, a low-level potential is applied to the gate line GLa, a high-level potential is applied to the gate line GLb, and a low-level potential is applied to the gate line GLc. As a result, the transistor 89 is turned on, and the selection transistor 88 and the transistor 90 are turned off. When the selection transistor 88 is turned off, the potential $V_{data}$ is held at the gate of the driving transistor 54. The potential $V_{ano}$ is applied to the wiring VL, and the potential $V_{cat}$ is applied to the wiring CL. Thus, the light-emitting element 56 maintains the luminance determined in the period t1.

Next, in a period t3, a low-level potential is applied to the gate line GLa, a low-level potential is applied to the gate line GLb, and a high-level potential is applied to the gate line GLc. As a result, the transistor 90 is turned on, and the selection transistor 88 and the transistor 89 are turned off. The potential $V_{cat}$ is applied to the wiring CL. The potential $V_{ano}$ is applied to the wiring ML.

By the above operation, the drain current of the driving transistor 54 is supplied to the light-emitting element 56 through the transistor 90. Then, the drain current of the driving transistor 54 may be supplied to the monitor circuit 20 through the wiring ML. The monitor circuit 20 generates a signal including information about the value of the drain current by using the drain current flowing through the wiring ML. Thus, using the above signal, the display device of one embodiment of the present invention can correct the value of the potential $V_{data}$ of the image signal Sig supplied to the pixel 14.

Note that in the display device including the pixel 14 illustrated in FIG. 10A, the operation in the period t3 is not necessarily performed after the operation in the period t2. For example, in the display device, the operation in the period t3 may be performed after the operations in the periods t1 and t2 are repeated a plurality of times. Alternatively, after the operation in the period t3 is performed on pixels 14 in one row, the light-emitting elements 56 may be brought into a non-light-emitting state by writing an image signal corresponding to the lowest grayscale level 0 to the pixels 14 in the row which have been subjected to the above operation. Then, the operation in the period t3 may be performed on pixels 14 in the next row.

<Structure Example 3 of Pixel Circuit>

Figure 11A:
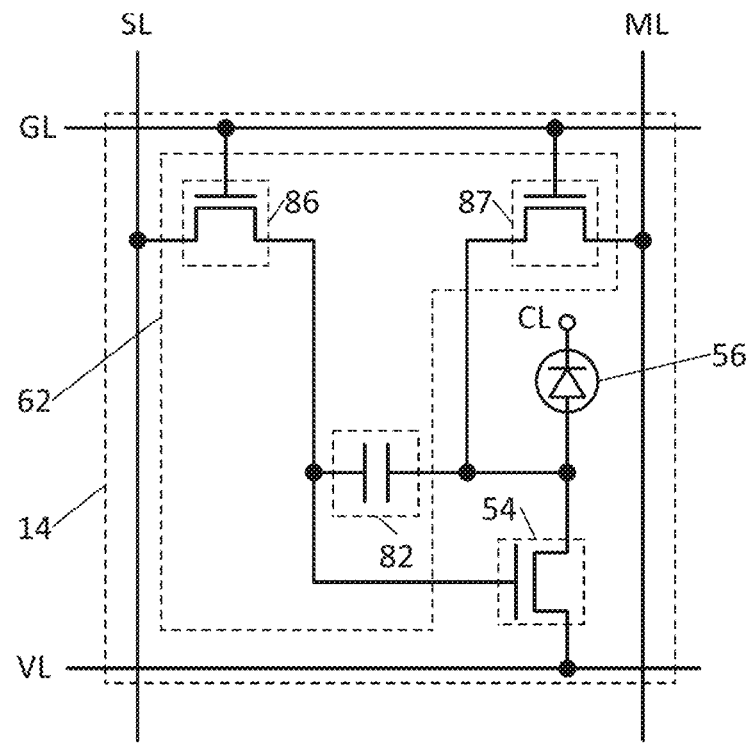
FIGS. 11A and 11B are a circuit diagram and a timing chart illustrating one embodiment of a pixel circuit.

In a pixel circuit illustrated in FIG. 11A, one pixel includes three n-channel transistors and one capacitor.

The pixel 14 illustrated in FIG. 11A includes a selection transistor 86, a transistor 87, the driving transistor 54, the capacitor 82, and the light-emitting element 56.

The potential of the anode of the light-emitting element 56 is controlled in accordance with an image signal Sig input into the pixel 14. The luminance of the light emitting element 56 depends on a potential difference between the anode and the cathode.

The selection transistor 86 has a function of controlling conduction between the signal line SL and the gate of the driving transistor 54. The one of the source and the drain of the driving transistor 54 is connected to the anode of the light-emitting element 56, and the other thereof is connected to a wiring VL. The transistor 87 has a function of controlling conduction between the wiring ML and the one of the source and the drain of the driving transistor 54. One of a pair of electrodes of the capacitor 82 is connected to the gate of the driving transistor 54, and the other thereof is connected to the anode of the light-emitting element 56.

The switching of the selection transistor 86 is performed in accordance with a potential of the gate line GL which is connected to a gate of the selection transistor 86. Similarly, the switching of the transistor 87 is performed in accordance with a potential of the gate line GL which is connected to a gate of the transistor 87.

Next, an example of operation of the pixel 14 illustrated in FIG. 11A is described.

Figure 11B:
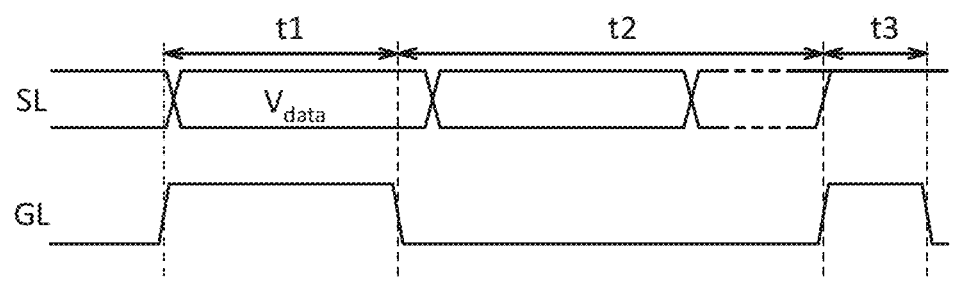

FIG. 11B shows an example of a timing chart of the potentials of the gate line GL connected to the pixel 14 illustrated in FIG. 11A and a potential of the image signal Sig supplied to the signal line SL. Note that in the timing chart in FIG. 11B, all the transistors included in the pixel 14 in FIG. 11A are n-channel transistors.

First, in a period t1, a high-level potential is applied to the gate line GL. As a result, the selection transistor 86 and the transistor 87 are turned on. A potential $V_{data}$ of the image signal Sig is applied to the signal line SL, and the potential $V_{data}$ is applied to the gate of the driving transistor 54 through the selection transistor 86.

A potential $V_{ano}$ is applied to the wiring VL, and a potential $V_{cat}$ is applied to the wiring CL. The potential $V_{ano}$ is preferably higher than the sum of the potential $V_{cat}$, the threshold voltage $V_{the}$ of the light-emitting element 56, and the threshold voltage $V_{th}$ of the driving transistor 54. The above potential difference is provided between the wiring VL and the wiring CL, so that the value of the drain current of the driving transistor 54 is determined by the potential $V_{data}$. Then, the drain current is supplied to the light-emitting element 56, whereby the luminance of the light-emitting element 56 is determined.

In the case where the driving transistor 54 is an n-channel type, it is preferable that, in the period t1, a potential of the wiring ML be lower than the sum of a potential of the wiring CL and the threshold voltage $V_{the}$ of the light-emitting element 56, and a potential of the wiring VL be higher than the sum of the potential of the wiring ML and the threshold voltage $V_{th}$ of the driving transistor 54. With the above configuration, the drain current of the driving transistor 54 can be preferentially supplied to the wiring ML instead of the light-emitting element 56 even when the transistor 87 is on.

Next, in a period t2, a low-level potential is applied to the gate line GL. As a result, the selection transistor 86 and the transistor 87 are turned off. When the selection transistor 86 is turned off, the potential $V_{data}$ is held at the gate of the driving transistor 54. The potential $V_{ano}$ is applied to the wiring VL, and the potential $V_{cat}$ is applied to the wiring CL. Thus, the light-emitting element 56 emits light in accordance with the luminance determined in the period t1.

Next, in a period t3, a high-level potential is applied to the gate line GL. As a result, the selection transistor 86 and the transistor 87 are turned on. In addition, such a potential that the gate voltage of the driving transistor 54 is higher than the threshold voltage $V_{th}$ thereof is applied to the signal line SL. The potential $V_{cat}$ is applied to the wiring CL. Then, the potential of the wiring ML is lower than the sum of the potential of the wiring CL and the threshold voltage $V_{the}$ of the light-emitting element 56, and the potential of the wiring VL is higher than the sum of the potential of the wiring ML and the threshold voltage $V_{th}$ of the driving transistor 54. With the above configuration, the drain current of the driving transistor 54 can be preferentially supplied to the wiring ML instead of the light-emitting element 56.

Then, the drain current of the driving transistor 54 may be supplied to the monitor circuit 20 through the wiring ML. The monitor circuit 20 generates a signal including information about the value of the drain current by using the drain current flowing through the wiring ML. Thus, using the above signal, the display device of one embodiment of the present invention can correct the value of the potential $V_{data}$ of the image signal Sig supplied to the pixel 14.

Note that in the display device including the pixel 14 illustrated in FIG. 11A, the operation in the period t3 is not necessarily performed after the operation in the period t2. For example, in the display device, the operation in the period t3 may be performed after the operations in the periods t1 and t2 are repeated a plurality of times. Alternatively, after the operation in the period t3 is performed on pixels 14 in one row, the light-emitting elements 56 may be brought into a non-light-emitting state by writing an image signal corresponding to the lowest grayscale level 0 to the pixels 14 in the row which have been subjected to the above operation. Then, the operation in the period t3 may be performed on pixels 14 in the next row.

<Structure Example 4 of Pixel Circuit>

Figure 12A:
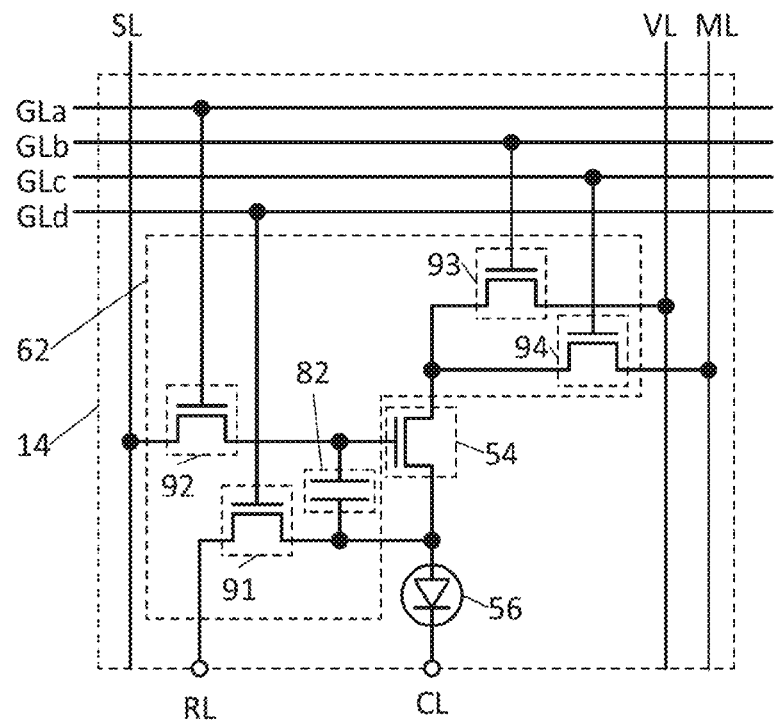
FIGS. 12A and 12B are a circuit diagram and a timing chart illustrating one embodiment of a pixel circuit.

In a pixel circuit illustrated in FIG. 12A, one pixel includes five n-channel transistors and one capacitor.

The pixel 14 illustrated in FIG. 12A includes the driving transistor 54, a transistor 91, a selection transistor 92, a transistor 93, a transistor 94, the capacitor 82, and the light-emitting element 56.

The transistor 91 has a function of controlling conduction between a wiring RL and the anode of the light-emitting element 56. The selection transistor 92 has a function of controlling conduction between the signal line SL and the gate of the driving transistor 54. The one of the source and the drain of the driving transistor 54 is connected to the anode of the light-emitting element 56. The transistor 93 has a function of controlling conduction between the wiring VL and the other of the source and the drain of the driving transistor 54. The transistor 94 has a function of controlling conduction between the wiring ML and the other of the source and the drain of the driving transistor 54. One of a pair of electrodes of the capacitor 82 is connected to the gate of the driving transistor 54, and the other thereof is connected to the anode of the light-emitting element 56.

The switching of the selection transistor 92 is performed in accordance with a potential of the gate line GLa which is connected to a gate of the selection transistor 92. The switching of the transistor 93 is performed in accordance with a potential of the gate line GLb which is connected to a gate of the transistor 93. The switching of the transistor 94 is performed in accordance with a potential of the gate line GLc which is connected to a gate of the transistor 94. The switching of the transistor 91 is performed in accordance with a potential of the gate line GLd which is connected to a gate of the transistor 91.

Next, an example of operation of the pixel 14 illustrated in FIG. 12A for external correction is described.

Figure 12B:
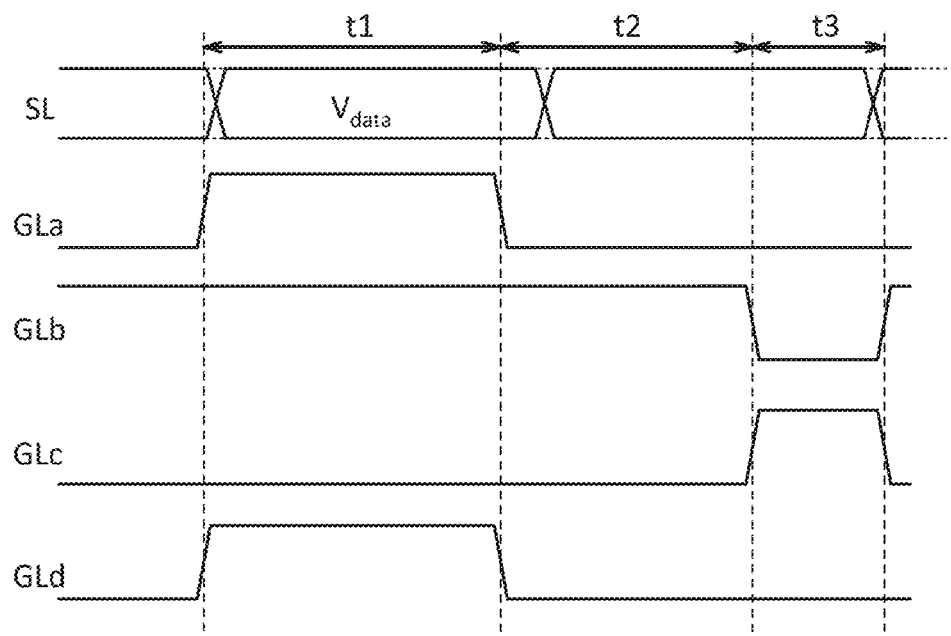

FIG. 12B shows an example of a timing chart of the potentials of the gate line GLa, the gate line GLb, the gate line GLc, and the gate line GLd, which are connected to the pixel 14 illustrated in FIG. 12A, and a potential of the image signal Sig supplied to the signal line SL. Note that in the timing chart in FIG. 12B, all the transistors included in the pixel 14 in FIG. 12A are n-channel transistors.

First, in a period t1, a high-level potential is applied to the gate line GLa, a high-level potential is applied to the gate line GLb, a low-level potential is applied to the gate line GLc, and a high-level potential is applied to the gate line GLd. As a result, the selection transistor 92, the transistor 93, and the transistor 91 are turned on, and the transistor 94 is turned off. A potential $V_{data}$ of the image signal Sig is applied to the signal line SL, and the potential $V_{data}$ is applied to the gate of the driving transistor 54 through the selection transistor 92. Thus, the value of the drain current of the driving transistor 54 is determined by the potential $V_{data}$. A potential $V_{ano}$ is applied to the wiring VL and a potential $V_1$ is applied to the wiring RL; therefore, the drain current flows between the wiring VL and the wiring RL through the transistor 91 and the transistor 93.

The potential $V_{ano}$ is preferably higher than the sum of a potential $V_{cat}$ and the threshold voltage $V_{the}$ of the light-emitting element 56. The potential $V_{ano}$ of the wiring VL is applied to the other of the source and the drain of the driving transistor 54 through the transistor 93. The potential $V_1$ applied to the wiring RL is applied to the one of the source and the drain of the driving transistor 54 through the transistor 91. The potential $V_{cat}$ is applied to the wiring CL.

Note that it is preferable that the potential $V_1$ be sufficiently lower than a potential obtained by subtracting the threshold voltage $V_{th}$ of the driving transistor 54 from a potential $V_0$. The light-emitting element 56 does not emit light in the period t1 because the potential $V_1$ can be set sufficiently lower than the potential obtained by subtracting the threshold voltage $V_{the}$ of the light-emitting element 56 from the potential $V_{cat}$.

Next, in a period t2, a low-level potential is applied to the gate line GLa, a high-level potential is applied to the gate line GLb, a low-level potential is applied to the gate line GLc, and a low-level potential is applied to the gate line GLd. As a result, the transistor 93 is turned on, and the selection transistor 92, the transistor 94, and the transistor 91 are turned off. When the selection transistor 92 is turned off, the potential $V_{data}$ is held at the gate of the driving transistor 54.

The potential $V_{ano}$ is applied to the wiring VL, and the potential $V_{cat}$ is applied to the wiring CL. Accordingly, the drain current of the driving transistor 54, the value of which is determined in the period t1, is supplied to the light-emitting element 56 because the transistor 91 is turned off. By supply of the drain current to the light-emitting element 56, the luminance of the light-emitting element 56 is determined, and the luminance is held in the period t2.

Next, in a period t3, a low-level potential is applied to the gate line GLa, a low-level potential is applied to the gate line GLb, a high-level potential is applied to the gate line GLc, and a low-level potential is applied to the gate line GLd. As a result, the transistor 94 is turned on, and the selection transistor 92, the transistor 93, and the transistor 91 are turned off. The potential $V_{cat}$ is applied to the wiring CL. The potential $V_{ano}$ is applied to the wiring ML.

By the above operation, the drain current of the driving transistor 54 is supplied to the light-emitting element 56. Then, the drain current of the driving transistor 54 may be supplied to the monitor circuit 20 through the wiring ML. The monitor circuit 20 generates a signal including information about the value of the drain current by using the drain current flowing through the wiring ML. Thus, using the above signal, the display device of one embodiment of the present invention can correct the value of the potential $V_{data}$ of the image signal Sig supplied to the pixel 14.

Note that in the display device including the pixel 14 illustrated in FIG. 12A, the operation in the period t3 is not necessarily performed after the operation in the period t2. For example, in the display device, the operation in the period t3 may be performed after the operations in the periods t1 and t2 are repeated a plurality of times. Alternatively, after the operation in the period t3 is performed on pixels 14 in one row, the light-emitting elements 56 may be brought into a non-light-emitting state by writing an image signal corresponding to the lowest grayscale level 0 to the pixels 14 in the row which have been subjected to the above operation. Then, the operation in the period t3 may be performed on pixels 14 in the next row.

In the pixel 14 illustrated in FIG. 12A, even when variation in resistance of a portion between the anode and the cathode of the light-emitting element 56 among pixels is caused by deterioration of the light-emitting element 56 or the like, the potential of the source of the driving transistor 54 can be set to the predetermined potential $V_1$ at the time of applying the potential $V_{data}$ to the gate of the driving transistor 54. Thus, variation in luminance of the light-emitting element 56 among pixels can be prevented.

<Structure Example 5 of Pixel Circuit>

Figure 13A:
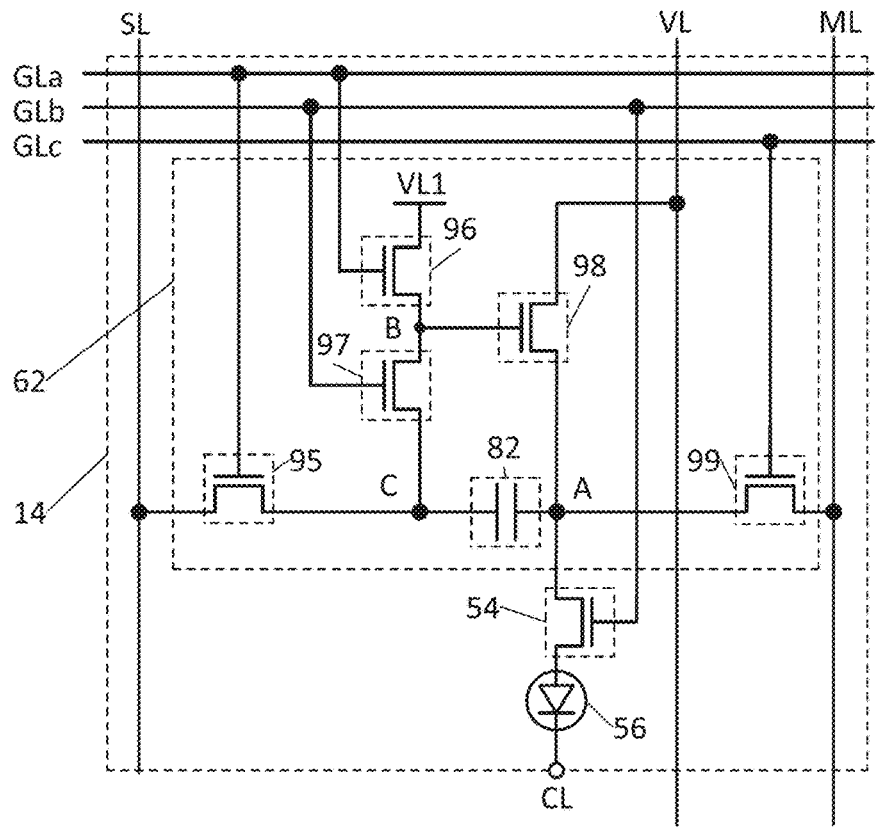
FIGS. 13A and 13B are a circuit diagram and a timing chart illustrating one embodiment of a pixel circuit.

In a pixel circuit illustrated in FIG. 13A, one pixel includes six n-channel transistors and one capacitor.

The pixel 14 illustrated in FIG. 13A includes the driving transistor 54, a selection transistor 95, a transistor 96, a transistor 97, a transistor 98, a transistor 99, the capacitor 82, and the light-emitting element 56.

The potential of the anode of the light-emitting element 56 is controlled in accordance with an image signal Sig input into the pixel 14. The luminance of the light emitting element 56 depends on a potential difference between the anode and the cathode.

The selection transistor 95 has a function of controlling conduction between the signal line SL and one of the pair of electrodes of the capacitor 82. The other of the pair of electrodes of the capacitor 82 is connected to one of a source and a drain of the transistor 98. The transistor 96 has a function of controlling conduction between a wiring VL1 and a gate of the transistor 98. The transistor 97 has a function of controlling conduction between the one of the pair of electrodes of the capacitor 82 and the gate of the transistor 98. The driving transistor 54 has a function of controlling conduction between the one of the source and the drain of the transistor 98 and the anode of the light-emitting element 56. The transistor 99 has a function of controlling conduction between the wiring ML and the one of the source and the drain of the transistor 98.

The switching of the selection transistor 95 is performed in accordance with a potential of the gate line GLa which is connected to a gate of the selection transistor 95. The switching of the transistor 96 is performed in accordance with a potential of the gate line GLa which is connected to a gate of the transistor 96. The switching of the transistor 97 is performed in accordance with a potential of the gate line GLb which is connected to a gate of the transistor 97. The switching of the driving transistor 54 is performed in accordance with a potential of the gate line GLb which is connected to the gate of the driving transistor 54. The switching of the transistor 99 is performed in accordance with a potential of the gate line GLc which is connected to a gate of the transistor 99.

Figure 13B:
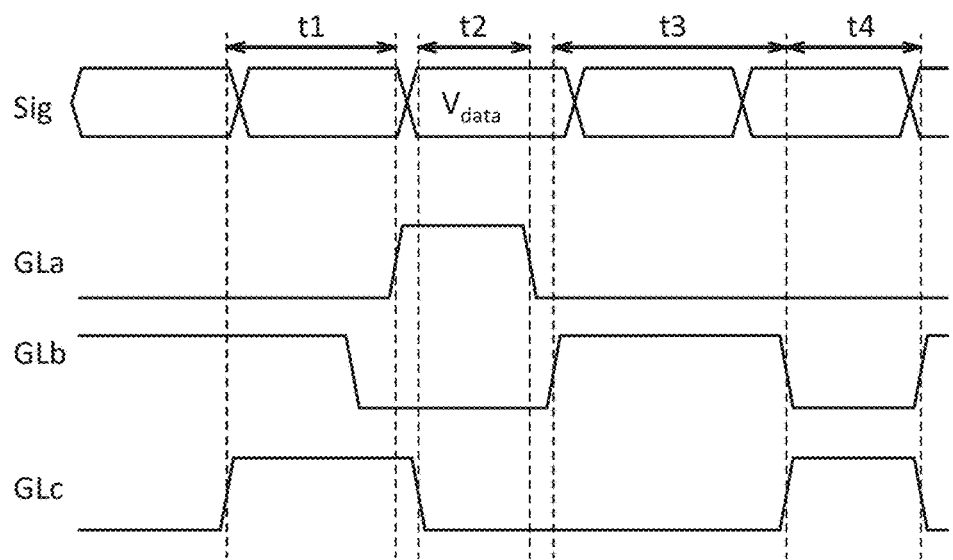

FIG. 13B shows an example of a timing chart of the potentials of the gate line GLa, the gate line GLb, and the gate line GLc, which are connected to the pixel 14 illustrated in FIG. 13A, and a potential of the image signal Sig supplied to the signal line SL. Note that in the timing chart in FIG. 13B, all the transistors included in the pixel 14 in FIG. 13A are n-channel transistors.

First, in a period t1, a low-level potential is applied to the gate line GLa, a high-level potential is applied to the gate line GLb, and a high-level potential is applied to the gate line GLc. As a result, the transistor 97, the driving transistor 54, and the transistor 99 are turned on, and the selection transistor 95 and the transistor 96 are turned off. The driving transistor 54 and the transistor 99 are turned on, whereby the potential $V_0$, which is the potential of the wiring ML, is applied to the one of the source and the drain of the transistor 98 and the other of the pair of electrodes of the capacitor 82 (represented as a node A).

A potential $V_{ano}$ is applied to the wiring VL, and a potential $V_{cat}$ is applied to the wiring CL. The potential $V_{ano}$ is preferably higher than the sum of the potential $V_0$ and the threshold voltage $V_{the}$ of the light-emitting element 56. The potential $V_0$ is preferably lower than the sum of the potential $V_{cat}$ and the threshold voltage $V_{the}$ of the light-emitting element 56. With the potential $V_0$ set in the above range, current can be prevented from flowing through the light-emitting element 56 in the period t1.

A low-level potential is then applied to the gate line GLb, and the transistor 97 and the driving transistor 54 are accordingly turned off and the node A is held at the potential $V_0$.

Next, in a period t2, a high-level potential is applied to the gate line GLa, a low-level potential is applied to the gate line GLb, and a low-level potential is applied to the gate line GLc. As a result, the selection transistor 95 and the transistor 96 are turned on, and the transistor 97, the driving transistor 54, and the transistor 99 are turned off.

In the transition from the period t1 to the period t2, it is preferable that the potential applied to the gate line GLa be changed from low to high and then the potential applied to the gate line GLc be changed from high to low. This operation prevents change in the potential of the node A due to the change of the potential applied to the gate line GLa.

The potential $V_{ano}$ is applied to the wiring VL, and the potential $V_{cat}$ is applied to the wiring CL. The potential $V_{data}$ of the image signal Sig is applied to the signal line SL, and a potential $V_1$ is applied to the wiring VL1. Note that the potential $V_1$ is preferably higher than the sum of the potential $V_{cat}$ and the threshold voltage $V_{th}$ of the transistor 98 and lower than the sum of the potential $V_{ano}$ and the threshold voltage $V_{th}$ of the transistor 98.

Note that in the pixel configuration illustrated in FIG. 13A, even if the potential $V_1$ is higher than the sum of the potential $V_{cat}$ and the threshold voltage $V_{the}$ of the light-emitting element 56, the light-emitting element 56 does not emit light as long as the driving transistor 54 is off. Thus, the allowable potential $V_0$ range can be expanded and the allowable range of $V_1$-$V_0$ can also be increased. As a result of increasing the degree of freedom of values for $V_1$-$V_0$, threshold voltage of the transistor 98 can be accurately obtained even when time required to obtain the threshold voltage of the transistor 98 is reduced or is limited.

By this operation, the potential $V_1$ which is higher than the sum of the potential of the node A and the threshold voltage is input into the gate of the transistor 98 (represented as a node B), and the transistor 98 is turned on. Thus, electric charge in the capacitor 82 is discharged through the transistor 98, and the potential of the node A, which is the potential $V_0$, starts to increase. The potential of the node A finally converges to the potential $V_1$-$V_{th}$; then, the transistor 98 is turned off.

The potential $V_{data}$ of the image signal Sig applied to the signal line SL is applied to the one of the pair of electrodes of the capacitor 82 (represented as a node C) through the selection transistor 95.

Next, in a period t3, a low-level potential is applied to the gate line GLa, a high-level potential is applied to the gate line GLb, and a low-level potential is applied to the gate line GLc. As a result, the transistor 97 and the driving transistor 54 are turned on, and the selection transistor 95, the transistor 96, and the transistor 99 are turned off.

In the transition from the period t2 to the period t3, it is preferable that the potential applied to the gate line GLa be changed from high to low and then the potential applied to the gate line GLb be changed from low to high. This structure can prevent potential change of the node A due to change of the potential applied to the gate line GLa.

The potential $V_{ano}$ is applied to the wiring VL, and the potential $V_{cat}$ is applied to the wiring CL.

The potential $V_{data}$ is applied to the node B by the above operation; thus, the gate voltage of the transistor 98 becomes $V_{data}$-$V_1$+$V_{th}$. Thus, the gate voltage of the transistor 98 can be the value to which the threshold voltage $V_{th}$ is added. With this structure, variation in the threshold voltage $V_{th}$ of the transistor 98 can be reduced. Thus, variation of current values supplied to the light-emitting element 56 can be inhibited, whereby unevenness in luminance of the display device can be reduced.

Note that the potential applied to the gate line GLb is greatly varied here, whereby an influence of variation of threshold voltages of the driving transistor 54 on the value of current supplied to the light-emitting element 56 can be prevented. In other words, the high-level potential applied to the gate line GLb is much higher than the threshold voltage of the driving transistor 54, and the low-level potential applied to the gate line GLb is much lower than the threshold voltage of the driving transistor 54; thus, on/off switching of the driving transistor 54 is secured and the influence of variation of threshold voltages of the driving transistor 54 on the value of current supplied to the light-emitting element 56 can be prevented.

Next, in a period t4, a low-level potential is applied to the gate line GLa, a low-level potential is applied to the gate line GLb, and a high-level potential is applied to the gate line GLc. As a result, the transistor 99 is turned on, and the transistor 96, the selection transistor 95, the transistor 97, and the driving transistor 54 are turned off.

The potential $V_{ano}$ is applied to the wiring VL. In addition, the wiring ML may be connected to the monitor circuit 20.

By the above operation, a drain current $I_d$ of the transistor 98 flows not into the light-emitting element 56 but the wiring ML through the transistor 99. The monitor circuit 20 generates a signal including information about the value of the drain current $I_d$ by using the drain current $I_d$ flowing through the wiring ML. The magnitude of the drain current $I_d$ depends on the field-effect mobility or the size (channel length, channel width) of the transistor 98. Thus, using the above signal, the display device of one embodiment of the present invention can correct the value of the potential $V_{data}$ of the image signal Sig supplied to the pixel 14. That is, the influence of variation in the field-effect mobility of the transistor 98 can be reduced.

Note that in the display device including the pixel 14 illustrated in FIG. 13A, the operation in the period t4 is not necessarily performed after the operation in the period t3. For example, in the display device, the operation in the period t4 may be performed after the operations in the periods t1 to t3 are repeated a plurality of times. Alternatively, after the operation in the period t4 is performed on pixels 14 in one row, the light-emitting elements 56 may be brought into a non-light-emitting state by writing an image signal corresponding to the lowest grayscale level 0 to the pixels 14 in the row which have been subjected to the above operation. Then, the operation in the period t4 may be performed on pixels 14 in the next row.

Note that in the display device including the pixel 14 illustrated in FIG. 13A, the other of the source and the drain of the transistor 98 is electrically isolated from the gate of the transistor 98, so that their potentials can be individually controlled. Accordingly, in the period t2, the potential of the other of the source and the drain of the transistor 98 can be set higher than a potential obtained by adding the threshold voltage $V_{th}$ to the gate potential of the transistor 98. Thus, when the transistor 98 is normally on, that is, when the threshold voltage $V_{th}$ is negative, charge can be accumulated in the capacitor 82 until the source potential of the transistor 98 becomes higher than the gate potential $V_1$ of the transistor 98. For these reasons, in the display device of one embodiment of the present invention, even when the transistor 98 is normally-on, the threshold voltage can be obtained in the period t2; and in the period t3, the gate voltage of the transistor 98 can be set to a value obtained by adding the threshold voltage $V_{th}$.

Therefore, in the display device of one embodiment of the present invention, display unevenness can be reduced and high-quality images can be displayed even if the transistor 98 becomes normally-on.

Not only the characteristics of the transistor 98 but also the characteristics of the light-emitting element 56 may be monitored. Here, it is preferable that current be not supplied to the transistor 98 by controlling the potential $V_{data}$ of the image signal Sig, for example. The current of the light-emitting element 56 can be thus extracted, and degradation or variation in current characteristics of the light-emitting element 56 can be obtained.

Note that a pixel circuit in the display device of one embodiment of the present invention is not limited to that shown in FIG. 9, FIG. 10A, FIG. 11A, FIG. 12A, and FIG. 13A. For example, a switch, a resistor, a capacitor, a sensor, a transistor, a logic circuit, or the like may be added to the pixel circuit illustrated in FIG. 9, FIG. 10A, FIG. 11A, FIG. 12A, and FIG. 13A.

Here, the transistors, the capacitor, the resistor, the light-emitting element, and the like of the semiconductor device of one embodiment of the present invention are described with reference to FIGS. 14A and 14B.

Figure 14A:
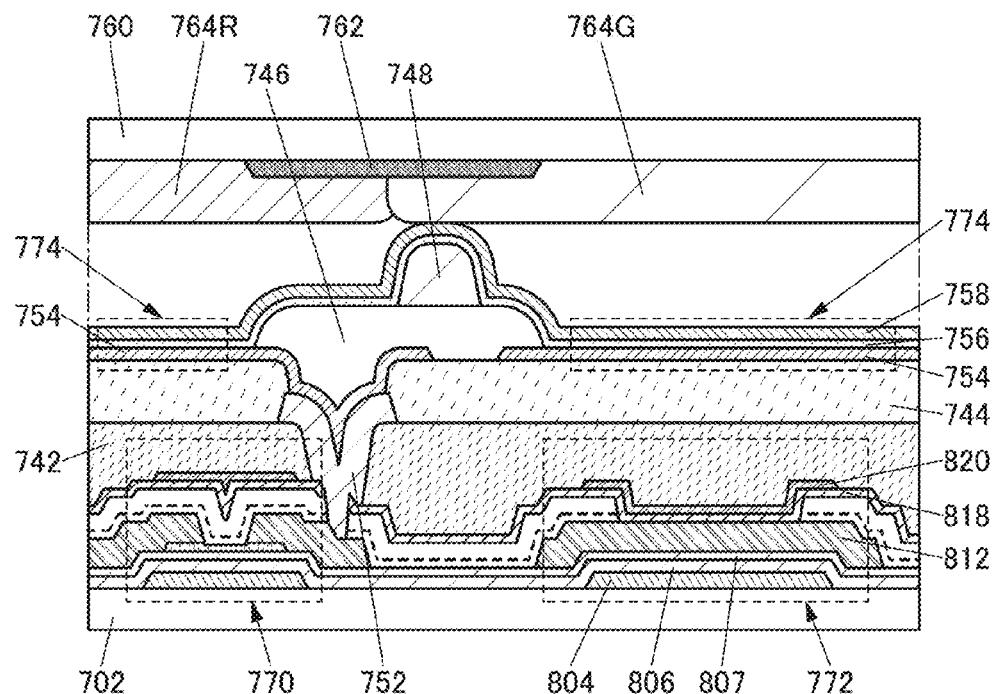
FIGS. 14A and 14B are cross-sectional views each illustrating one embodiment of a semiconductor device.
Figure 14B:
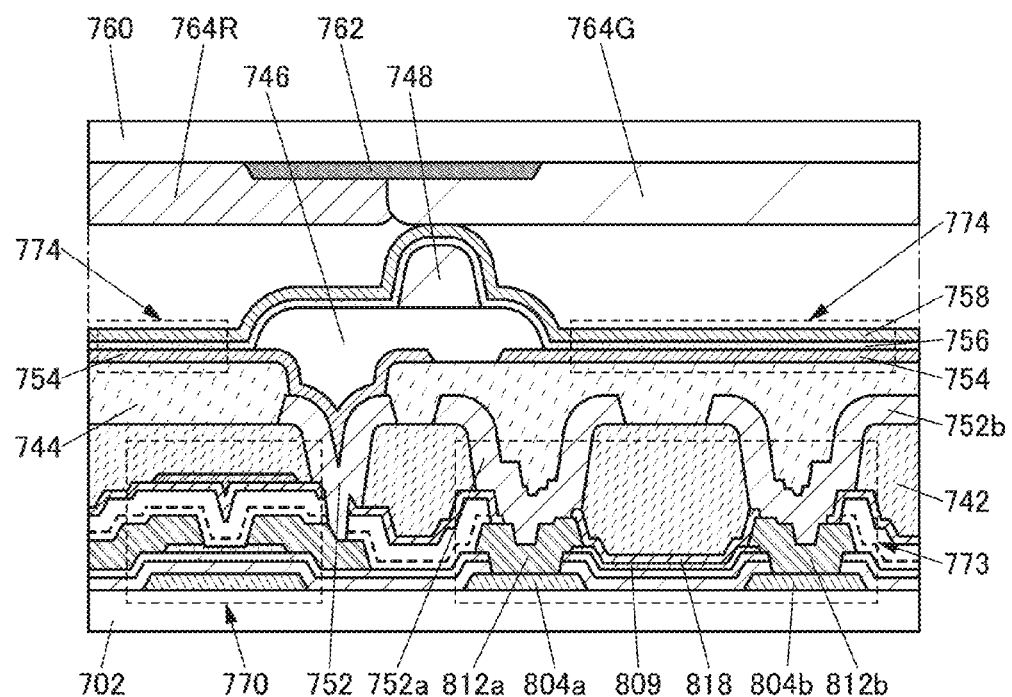

FIGS. 14A and 14B are cross-sectional views illustrating one embodiment of a semiconductor device. Note that FIG. 14A is a cross-sectional view illustrating an example of the pixel portion of the semiconductor device, and FIG. 14B is a cross-sectional view illustrating an example of the monitor circuit of the semiconductor device.

The semiconductor device illustrated in FIG. 14A includes a transistor 770 over a substrate 702, a capacitor 772 formed over the same surface as the transistor 770, and a light-emitting element 774 formed above the transistor 770 and the capacitor 772. A substrate 760 is provided at a position facing the substrate 702. The substrate 760 is provided with a light-blocking film 762, a color filter 764R that transmits red light, a color filter 764G that transmits green light, and the like.

An insulating film 742 and an insulating film 744 are provided over the transistor 770 and the capacitor 772. The insulating films 742 and 744 have a function of planarizing unevenness due to the transistor 770, the capacitor 772, and the like. An opening is provided in the insulating film 742, which reaches a conductive film functioning as one of a source and a drain of the transistor 770, and a conductive film 752 for connection is provided therein. An opening is provided in the insulating film 744, which reaches the conductive film 752, and a conductive film 754 functioning as an anode of the light-emitting element 774 is provided therein. Note that the conductive film 754 is separated into island shapes between adjacent pixels.

A partition wall 746 is provided so as to cover end portions of the conductive film 754, and a spacer 748 is provided over the partition wall 746. The spacer 748 has a function of adjusting a distance between the light-emitting element 774 and the substrate 760 facing the light-emitting element 774 and a function of preventing light emitted from the light-emitting element 774 from not being mixed with that in an adjacent pixel.

The light-emitting element 774 includes the conductive film 754 functioning as an anode, an EL layer 756 over the conductive film 754, and a conductive film 758 functioning as a cathode over the EL layer 756.

In the structure of the semiconductor device illustrated in FIG. 14A, light emitted from the light-emitting element 774 is extracted outside through the substrate 760 and the color filters 764R and 764G. Thus, the conductive film 754 has a function of reflecting visible light, and the conductive film 758 has a function of transmitting visible light. Note that a micro optical resonator (microcavity) structure utilizing a resonant effect of light between the conductive film 754 and the conductive film 758 may be formed.

One of a pair of electrodes of the capacitor 772 is a conductive film 804 formed over the same surface as a gate electrode of the transistor 770, and the other of the pair of electrodes of the capacitor 772 is a conductive film 812 formed over the same surface as a source electrode and a drain electrode of the transistor 770. An insulating film 806 and an insulating film 807 formed over the same surface as an insulating film functioning as a gate insulating film of the transistor 770 is provided between the conductive film 804 and the conductive film 812. The insulating films 806 and 807 function as a dielectric layer of the capacitor 772.

An insulating film 818 functioning as a protective insulating film of the transistor 770 is formed over the conductive film 812, and a conductive film 820 formed over the same surface as a conductive film functioning as a back gate electrode of the transistor 770 is formed over the insulating film 818. With the use of the insulating film 818 between the conductive film 812 and the conductive film 820 as a dielectric layer, electrostatic capacitance can be increased without an increase of the area of the capacitor 772.

The semiconductor device illustrated in FIG. 14B includes the transistor 770 over the substrate 702, a resistor 773 formed over the same surface as the transistor 770, and the light-emitting element 774 formed above the transistor 770 and the resistor 773. The substrate 760 is provided at a position facing the substrate 702. The substrate 760 is provided with the light-blocking film 762, the color filter 764R that transmits red light, the color filter 764G that transmits green light, and the like.

The resistor 773 includes conductive films 804a and 804b formed over the same surface as the gate electrode of the transistor 770, an oxide semiconductor film 809 formed over the same surface as an oxide semiconductor film functioning as an active layer of the transistor 770, conductive films 812a and 812b formed over the same surface as the source electrode and the drain electrode of the transistor 770, and the insulating film 818 functioning as a protective insulating film of the transistor 770.

Note that the insulating films 742 and 744 and the like may be provided over the resistor 773. Conductive films 752a and 752b functioning as connection wirings are provided over the conductive films 812a and 812b, respectively. For example, the resistor 773 and the conductive film 758 functioning as a cathode of the light-emitting element 774 can be electrically connected to each other with the conductive films 752a and 752b.

The structure described in this embodiment can be combined as appropriate with any of the structures described in the other embodiments.

Embodiment 3

In this embodiment, a structure of a transistor included in a semiconductor device of one embodiment of the present invention will be described with reference to FIGS. 15A to 15C, FIGS. 16A to 16C, FIGS. 17A to 17C, FIGS. 18A to 18C, FIGS. 19A to 19C, FIGS. 20A to 20D, and FIGS. 21A and 21B.

<Structure Example 1 of Transistor>

Figure 15A:
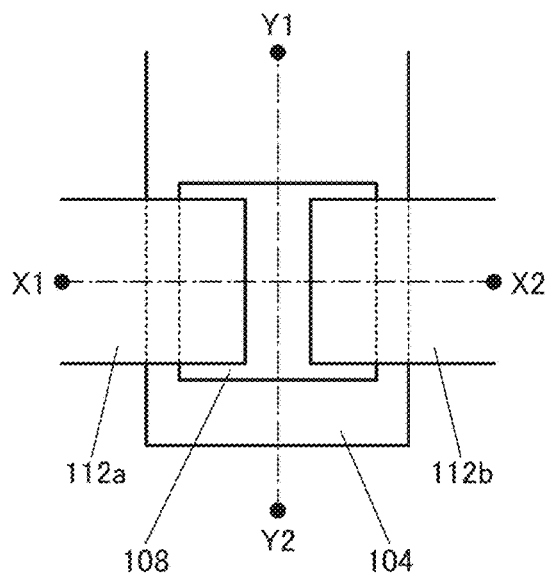
FIGS. 15A to 15C are a top view and cross-sectional views illustrating one embodiment of a transistor.
Figure 15B:
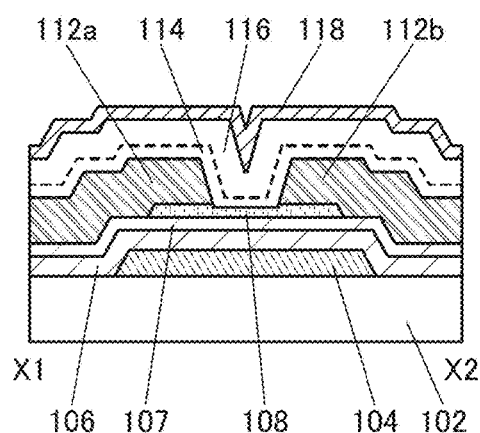
Figure 15C:
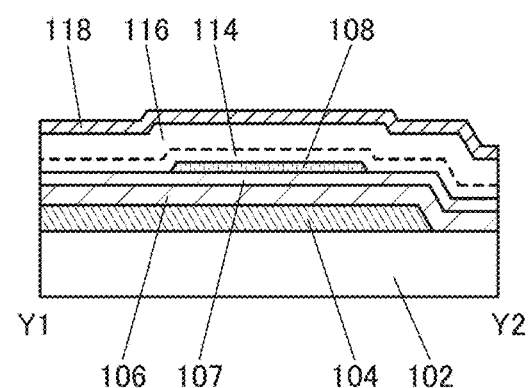

FIG. 15A is a top view of a transistor 100 of the semiconductor device of one embodiment of the present invention. FIG. 15B is a cross-sectional view taken along the dashed dotted line X1-X2 in FIG. 15A, and FIG. 15C is a cross-sectional view taken along the dashed dotted line Y1-Y2 in FIG. 15A.

The transistor 100 includes a conductive film 104 functioning as a gate electrode over a substrate 102, an insulating film 106 over the substrate 102 and the conductive film 104, an insulating film 107 over the insulating film 106, an oxide semiconductor film 108 over the insulating film 107, a conductive film 112a functioning as a source electrode electrically connected to the oxide semiconductor film 108, and a conductive film 112b functioning as a drain electrode electrically connected to the oxide semiconductor film 108. Insulating films 114, 116, and 118 are provided over the transistor 100, specifically, over the conductive films 112a and 112b and the oxide semiconductor film 108. The insulating films 114, 116, and 118 function as a protective insulating film for the transistor 100.

When impurities such as hydrogen or moisture enter the oxide semiconductor film 108, the impurities are bonded to oxygen vacancy formed in the oxide semiconductor film 108, generating electrons serving as carriers. The carriers due to the impurities tend to make the transistor 100 be normally on. Therefore, for stable transistor characteristics, it is important to reduce impurities such as hydrogen or moisture in the oxide semiconductor film 108 and to reduce oxygen vacancy in the oxide semiconductor film 108. Thus, in the transistor 100, oxygen is supplied from the insulating films 114 and 116 to the oxide semiconductor film 108.

Thus, the insulating films 114 and 116 each include a region that contains oxygen in excess of that in the stoichiometric composition (oxygen-excess region). In other words, the insulating films 114 and 116 are insulating films capable of releasing oxygen. The oxygen-excess region is formed in the insulating films 114 and 116 in such a manner that oxygen is added to the insulating films 114 and 116 after the deposition, for example. Oxygen can be added by an ion implantation method, an ion doping method, a plasma immersion ion implantation method, plasma treatment, or the like. For the plasma treatment, an apparatus with which an oxygen gas is made to be plasma by high-frequency power (also referred to as a plasma etching apparatus or a plasma ashing apparatus) is preferably used.

The amount of released oxygen can be found by measuring an insulating film by thermal desorption spectroscopy (TDS). For example, the amount of released oxygen molecules from the insulating films 114 and 116 is larger than or equal to $8.0 \times 10^{14}/cm^2$, preferably larger than or equal to $1.0 \times 10^{15}/cm^2$ and further preferably larger than or equal to $1.5 \times 10^{15}/cm^2$, by TDS. Note that the surface temperature of the films in TDS is higher than or equal to 100° C. and lower than or equal to 700° C., preferably higher than or equal to 100° C. and lower than or equal to 500° C.

In one embodiment of the present invention, a protective film having a function of inhibiting release of oxygen (also simply referred to as a protective film) is formed over the insulating film 116 and oxygen is introduced into the insulating films 114 and 116 through the protective film, so that the oxygen-excess region is formed in the insulating films 114 and 116.

For the protective film having a function of inhibiting release of oxygen, for example, indium (In) and a material including one of zinc (Zn), tin (Sn), tungsten (W), titanium (Ti), and silicon (Si) can be used. In particular, a conductive film containing indium or a semiconductor film containing indium is preferably used as the protective film. The protective film may be removed after oxygen introduction. For the conductive film containing indium, a light-transmitting conductive material such as indium oxide containing tungsten, indium zinc oxide containing tungsten, indium oxide containing titanium, indium tin oxide containing titanium, indium tin oxide (In—Sn oxide, also referred to as ITO), indium zinc oxide, or indium tin oxide containing silicon (In—Sn—Si oxide, also referred to as ITSO) can be used. Among the above-described materials, ITSO is particularly preferably used as the protective film having a function of inhibiting release of oxygen because it can be deposited with favorable coverage over an insulating film having roughness or the like.

Next, a structure of the transistor 100 illustrated in FIGS. 15A to 15C will be described in more detail.

(Substrate)

There is no particular limitation on the property of a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

(Conductive Film)

The conductive film 104 functioning as a gate electrode and the conductive films 112*a* and 112*b* functioning as source and drain electrodes can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these elements; or the like.

Furthermore, each of the conductive films 104, 112*a*, and 112*b* may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive films 104, 112*a*, and 112*b* can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112*a*, and 112*b*. The use of a Cu—X alloy film results in lower manufacturing costs because the film can be processed by wet etching.

(Gate Insulating Film)

As each of the insulating films 106 and 107 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film including three or more stacked layers may be used.

Note that the insulating film 107 in contact with the oxide semiconductor film 108 of the transistor 100 is preferably an oxide insulating film and preferably includes a region that contains oxygen in excess of that in the stoichiometric composition (oxygen-excess region). In other words, the insulating film 107 is an insulating film which is capable of releasing oxygen. In order to provide the oxygen-excess region in the insulating film 107, the insulating film 107 is formed in an oxygen atmosphere, for example. Alternatively, the oxygen-excess region may be formed by introduction of oxygen into the insulating film 107 after the deposition. Oxygen can be introduced by an ion implantation method, an ion doping method, a plasma immersion ion implantation method, plasma treatment, or the like.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to obtain a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106, and a silicon oxide film is formed as the insulating film 107. A silicon nitride film has a higher dielectric constant than a silicon oxide film and needs a larger thickness for capacitance equivalent to that of a silicon oxide film. Thus, when a silicon nitride film is included in the gate insulating film of the transistor 100, the physical thickness of the insulating film can be increased. This makes it possible to suppress a decrease in withstand voltage of the transistor 100 and furthermore to increase the withstand voltage, thereby inhibiting electrostatic breakdown of the transistor 100.

(Oxide Semiconductor Film)

The oxide semiconductor film 108 contains In, Zn, and M (M is Ti, Ga, Y, Zr, La, Ce, Nd, Sn, or Hf). Typically, In—Ga oxide, In—Zn oxide, or In-M-Zn oxide can be used for the oxide semiconductor film 108. It is particularly preferable to use In-M-Zn oxide for the oxide semiconductor film 108.

In the case where the oxide semiconductor film 108 includes In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

For example, it is preferable to use a sputtering target with an atomic ratio of In:Ga:Zn=4:2:4.1 to form the In-M-Zn oxide as the oxide semiconductor film 108, in which case the transistor can have high field-effect mobility. The transistor having high field-effect mobility is preferably used in a pixel circuit or a driver circuit in a high-resolution display device typified by 4 k×2 k pixels (3840 pixels in the horizontal direction and 2160 pixels in the perpendicular direction) or 8 k×4 k pixels (7680 pixels in the horizontal direction and 4320 pixels in the perpendicular direction).

Note that the atomic ratio of metal elements in the oxide semiconductor film 108 vary from that in the above-described sputtering target, within a range of ±40% as an error. For example, when a sputtering target with an atomic ratio of In:Ga:Zn=4:2:4.1 is used, an atomic ratio of In:Ga:Zn in the oxide semiconductor film 108 may be 4:2:3 and its vicinity. For example, when a sputtering target with an atomic ratio of In:Ga:Zn=1:1:1.2 is used, the atomic ratio of In:Ga:Zn in the oxide semiconductor film 108 may be 1:1:1 and its vicinity.

Note that in the case where the oxide semiconductor film 108 is formed of In-M-Zn oxide, the proportion of In and the proportion of M, not taking Zn and O into consideration, are preferably greater than 25 atomic % and less than 75 atomic %, respectively, and further preferably greater than 34 atomic % and less than 66 atomic %, respectively.

The energy gap of the oxide semiconductor film 108 is 2.0 eV or more, preferably 2.5 eV or more and further preferably 3.0 eV or more. The use of an oxide semiconductor having such a wide energy gap can reduce the off-state current of the transistor 100.

The thickness of the oxide semiconductor film 108 is preferably greater than or equal to 3 nm and less than or equal to 200 nm, further preferably greater than or equal to 3 nm and less than or equal to 100 nm, and still further preferably greater than or equal to 3 nm and less than or equal to 50 nm.

Note that without limitation to the compositions and materials described above, a material with an appropriate composition may be used in accordance with required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108 be set to be appropriate.

A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, a highly purified intrinsic or substantially highly purified intrinsic oxide semiconductor film has an extremely low off-state current; even when an element has a channel width (W) of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, an alkali metal, an alkaline earth metal, and the like are given.

Hydrogen contained in the oxide semiconductor film 108 reacts with oxygen bonded to a metal atom to form water, and also causes oxygen vacancy in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Thus, hydrogen in the oxide semiconductor film 108 is preferably reduced as much as possible. Specifically, in the oxide semiconductor film 108, the concentration of hydrogen which is measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$ and lower than or equal to $5\times10^{18}$ atoms/cm$^3$, still further preferably lower than or equal to $1\times10^{18}$ atoms/cm$^3$, yet further preferably lower than or equal to $5\times10^{17}$ atoms/cm$^3$, and even further preferably lower than or equal to $1\times10^{16}$ atoms/cm$^3$.

When silicon or carbon that is one of elements belonging to Group 14 is contained in the oxide semiconductor film 108, oxygen vacancy is increased in the oxide semiconductor film 108, and the oxide semiconductor film 108 becomes an n-type film. Thus, the concentration of silicon or carbon (the concentration is measured by SIMS) in the oxide semiconductor film 108 or the concentration of silicon or carbon (the concentration is measured by SIMS) in the vicinity of an interface with the oxide semiconductor film 108 is set to be lower than or equal to $2\times10^{18}$ atoms/cm$^3$, preferably lower than or equal to $2\times10^{17}$ atoms/cm$^3$.

Furthermore, the concentration of an alkali metal or an alkaline earth metal of the oxide semiconductor film 108, which is measured by SIMS, is lower than or equal to $1\times10^{18}$ atoms/cm$^3$, preferably lower than or equal to $2\times10^{16}$ atoms/cm$^3$. An alkali metal and an alkaline earth metal might generate carriers when bonded to an oxide semiconductor, in which case the off-state current of the transistor might be increased. Therefore, it is preferable to reduce the concentration of an alkali metal or an alkaline earth metal in the oxide semiconductor film 108.

When the oxide semiconductor film 108 contains nitrogen, the oxide semiconductor film 108 easily become n-type by generation of electrons serving as carriers and an increase of carrier density. A transistor including an oxide semiconductor film that contains nitrogen is likely to be normally-on. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

An oxide semiconductor which can be used for the oxide semiconductor film 108 will be described in detail in Embodiment 4.

(Protective Insulating Film)

The insulating films 114, 116, and 118 function as a protective insulating film. The insulating films 114 and 116 contain oxygen, and the insulating film 118 contains nitrogen. Furthermore, the insulating film 114 is an insulating film that allows oxygen to pass through. Note that the insulating film 114 also functions as a film that relieves damage to the oxide semiconductor film 108 at the time of forming the insulating film 116 in a later step.

A silicon oxide film or a silicon oxynitride film with a thickness greater than or equal to 5 nm and less than or equal to 150 nm, preferably greater than or equal to 5 nm and less than or equal to 50 nm, can be used as the insulating film 114.

In addition, it is preferable that the number of defects in the insulating film 114 be small and typically, the spin density of a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that passes through the insulating film 114 is decreased.

Note that not all oxygen entering the insulating film 114 from the outside move to the outside of the insulating film 114 and some oxygen remains in the insulating film 114. Furthermore, movement of oxygen occurs in the insulating film 114 in some cases in such a manner that oxygen enters the insulating film 114 and oxygen contained in the insulating film 114 moves to the outside of the insulating film 114. When an oxide insulating film that allows oxygen to pass through is formed as the insulating film 114, oxygen released from the insulating film 116 provided over the insulating film 114 can be moved to the oxide semiconductor film 108 through the insulating film 114.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases a small amount of nitrogen oxide is a film of which the amount of released ammonia is larger than the amount of released nitrogen oxide in thermal desorption spectroscopy analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of the film becomes a temperature higher than or equal to 50° C. and lower than or equal to 650° C., preferably higher than or equal to 50° C. and lower than or equal to 550° C.

Nitrogen oxide (NO$_x$; x is greater than or equal to 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the vicinity of the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide contained in the insulating film 114 reacts with ammonia contained in the insulating film 116 in heat treatment, nitrogen oxide contained in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller amount of nitrogen oxide the oxide insulating film contains.

The concentration of nitrogen of the above oxide insulating film measured by SIMS is lower than or equal to $6 \times 10^{20}$ atoms/cm$^3$.

The above oxide insulating film is formed by a PECVD method at a substrate temperature higher than or equal to 220° C., higher than or equal to 280° C., or higher than or equal to 350° C. using silane and dinitrogen monoxide, whereby a dense and hard film can be formed.

The insulating film 116 is formed using an oxide insulating film that contains oxygen at a higher proportion than oxygen in the stoichiometric composition. Part of oxygen is released by heating from the oxide insulating film that contains oxygen at a higher proportion than oxygen in the stoichiometric composition. The oxide insulating film that contains oxygen at a higher proportion than oxygen in the stoichiometric composition is an oxide insulating film of which the amount of released oxygen converted into oxygen molecules is greater than or equal to $8.0 \times 10^{14}$ atoms/cm$^3$, preferably greater than or equal to $1.0 \times 10^{15}$ atoms/cm$^3$ in TDS analysis. Note that the temperature of the film surface in the TDS analysis is higher than or equal to 100° C. and lower than or equal to 700° C., preferably higher than or equal to 100° C. and lower than or equal to 500° C.

A silicon oxide film or a silicon oxynitride film with a thickness greater than or equal to 30 nm and less than or equal to 500 nm, preferably greater than or equal to 50 nm and less than or equal to 400 nm, can be used as the insulating film 116.

It is preferable that the number of defects in the insulating film 116 be small, and typically, the spin density of a signal that appears at g=2.001 due to a dangling bond of silicon be lower than $1.5 \times 10^{18}$ spins/cm$^3$, further preferably lower than or equal to $1 \times 10^{18}$ spins/cm$^3$, by ESR measurement. Note that the insulating film 116 is provided more apart from the oxide semiconductor film 108 than the insulating film 114 is; thus, the insulating film 116 may have higher defect density than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this structure. For example, a single-layer structure of either one of the insulating films 114 and 116 may be employed.

The insulating film 118 contains nitrogen. Alternatively, the insulating film 118 contains nitrogen and silicon. The insulating film 118 has a function of blocking oxygen, hydrogen, water, an alkali metal, an alkaline earth metal, or the like. The provision of the insulating film 118 makes it possible to prevent outward diffusion of oxygen from the oxide semiconductor film 108, outward diffusion of oxygen contained in the insulating films 114 and 116, and entry of hydrogen, water, or the like into the oxide semiconductor film 108 from the outside. The insulating film 118 can be formed using a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Note that the above-described various films such as the conductive films, the insulating films, and the oxide semiconductor film can be formed by a sputtering method, a chemical vapor deposition (CVD) method, a vacuum evaporation method, a pulsed laser deposition (PLD) method, or the like. Alternatively, the above-described various films such as the conductive films, the insulating films, and the oxide semiconductor film can be formed by a plasma enhanced chemical vapor deposition (PECVD) method, a thermal CVD method, or an atomic layer deposition (ALD) method. As an example of a thermal CVD method, a metal organic chemical vapor deposition (MOCVD) method can be given. Further alternatively, the above-described various films such as the conductive films, the insulating films, and the oxide semiconductor film can be formed by a coating method or a printing method.

A thermal CVD method has an advantage that no defect due to plasma damage is generated because it does not utilize plasma for forming a film.

Deposition by a thermal CVD method may be performed in such a manner that a source gas and an oxidizer are supplied at a time to the chamber, in which the pressure is set to an atmospheric pressure or a reduced pressure, and react with each other in the vicinity of the substrate or over the substrate.

Deposition by an ALD method may be performed in such a manner that source gases for reaction are sequentially introduced into the chamber, in which the pressure is set to an atmospheric pressure or a reduced pressure, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The above-described variety of films such as the conductive film, the insulating film, the oxide semiconductor film, and the metal oxide film in this embodiment can be formed by an ALD method or a thermal CVD method such as an MOCVD method. For example, in the case where an In—

Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. The chemical formula of tetrakis(dimethylamide)hafnium is $Hf[N(CH_3)_2]_4$. Examples of another material liquid include tetrakis(ethylmethylamine)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. The chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedioate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are used to form an initial tungsten film, and then a $WF_6$ gas and an $H_2$ gas are used to form a tungsten film. Note that an $SiH_4$ gas may be used instead of a $B_2H_6$ gas.

For example, in the case where an oxide semiconductor film, e.g., an In—Ga—Zn—O film is formed with a deposition apparatus using an ALD method, an $In(CH_3)_3$ gas and an $O_3$ gas are used to form an In—O layer, a $Ga(CH_3)_3$ gas and an $O_3$ gas are used to form a GaO layer, and then a $Zn(CH_3)_2$ gas and an $O_3$ gas are introduced to form a ZnO layer. Note that the order of these layers is not limited to this example. A mixed compound layer such as an In—Ga—O layer, an In—Zn—O layer, or a Ga—Zn—O layer may be formed by mixing any of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<Structure Example 2 of Transistor>

A structural example which is different from the transistor 100 in FIGS. 15A to 15C will be described with reference to FIGS. 16A to 16C.

Figure 16A:
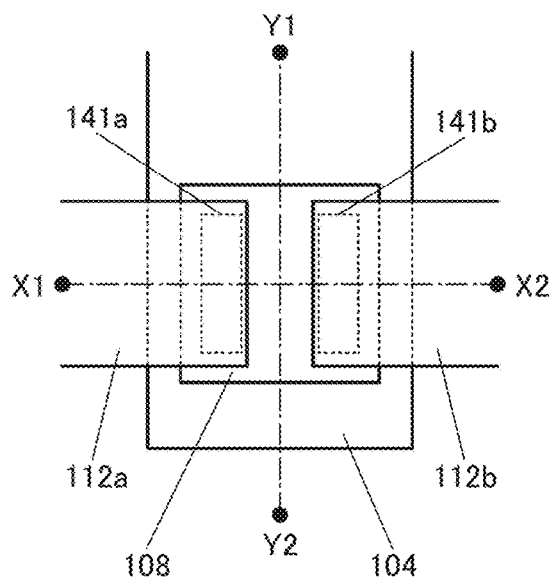
FIGS. 16A to 16C are a top view and cross-sectional views illustrating one embodiment of a transistor.

FIG. 16A is a top view of a transistor 150 of the semiconductor device of one embodiment of the present invention. FIG. 16B is a cross-sectional view taken along the dashed dotted line X1-X2 in FIG. 16A, and FIG. 16C is a cross-sectional view taken along the dashed dotted line Y1-Y2 in FIG. 16A.

The transistor 150 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112a functioning as a source electrode electrically connected to the oxide semiconductor film 108 through an opening 141a provided in the insulating films 114 and 116, and the conductive film 112b functioning as a drain electrode electrically connected to the oxide semiconductor film 108 through an opening 141b provided in the insulating films 114 and 116. The insulating film 118 is provided over the transistor 150, specifically, over the conductive films 112a and 112b and the insulating film 116. The insulating films 114 and 116 function as a protective insulating film for the oxide semiconductor film 108. The insulating film 118 functions as a protective insulating film for the transistor 150.

Figure 16B:
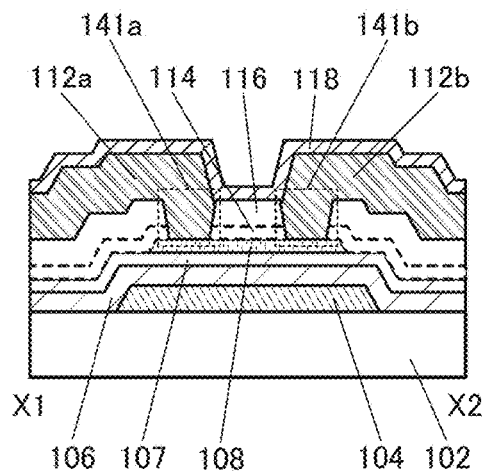
Figure 16C:
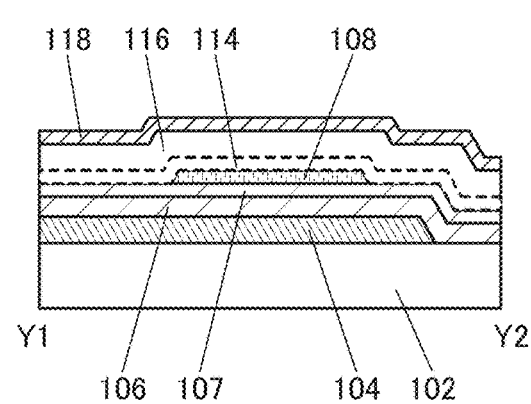

Although the transistor 100 described above has a channel-etched structure, the transistor 150 in FIGS. 16A to 16C has a channel-protective structure. Thus, the semiconductor device of one embodiment of the present invention can have either the channel-etched structure or the channel-protective structure.

<Structure Example 3 of Transistor>

A structural example which is different from the transistor 150 in FIGS. 16A to 16C will be described with reference to FIGS. 17A to 17C.

Figure 17A:
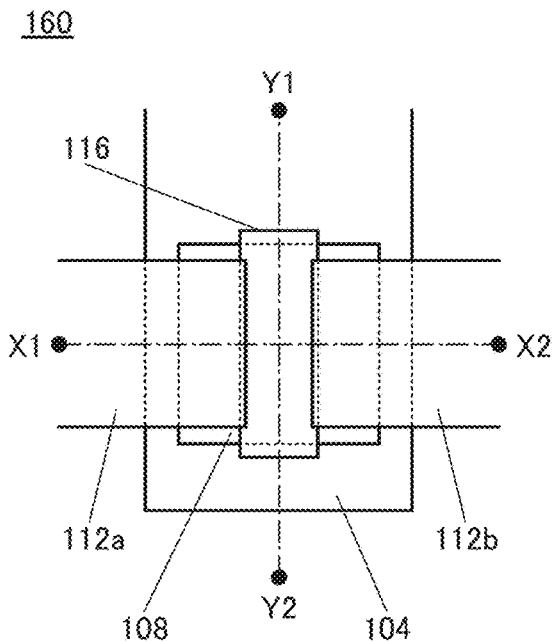
FIGS. 17A to 17C are a top view and cross-sectional views illustrating one embodiment of a transistor.
Figure 17B:
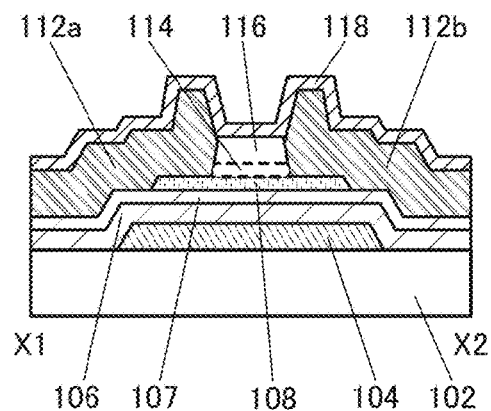
Figure 17C:
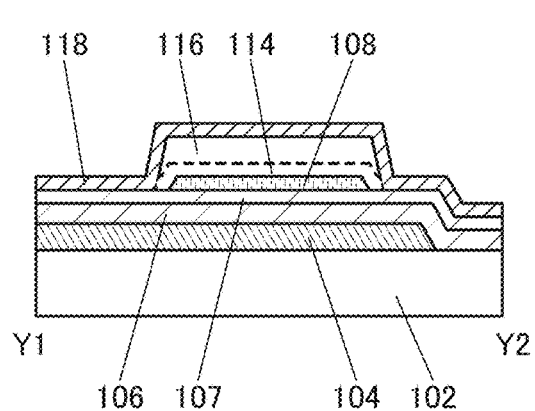

FIG. 17A is a top view of a transistor 160 of the semiconductor device of one embodiment of the present invention. FIG. 17B is a cross-sectional view taken along the dashed dotted line X1-X2 in FIG. 17A, and FIG. 17C is a cross-sectional view taken along the dashed dotted line Y1-Y2 in FIG. 17A.

The transistor 160 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112a functioning as a source electrode electrically connected to the oxide semiconductor film 108, and the conductive film 112b functioning as a drain electrode electrically connected to the oxide semiconductor film 108. The insulating film 118 is provided over the transistor 160, specifically, over the conductive films 112a and 112b and the insulating film 116. The insulating films 114 and 116 function as a protective insulating film for the oxide semiconductor film 108. The insulating film 118 functions as a protective insulating film for the transistor 160.

The transistor 160 is different from the transistor 150 in FIGS. 16A to 16C in the shapes of the insulating films 114 and 116. Specifically, the insulating films 114 and 116 of the transistor 160 have island shapes and are provided over a channel region of the oxide semiconductor film 108. The other components are similar to those of the transistor 150, and an effect similar to that of the transistor 150 can be obtained.

<Structure Example 4 of Transistor>

A structural example which is different from the transistor 100 in FIGS. 15A to 15C will be described with reference to FIGS. 18A to 18C.

Figure 18A:
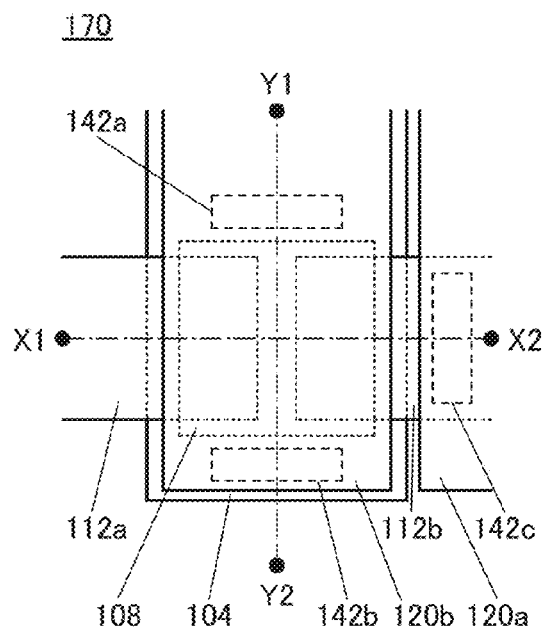
FIGS. 18A to 18C are a top view and cross-sectional views illustrating one embodiment of a transistor.

FIG. 18A is a top view of a transistor 170 of the semiconductor device of one embodiment of the present invention. FIG. 18B is a cross-sectional view taken along the dashed dotted line X1-X2 in FIG. 18A, and FIG. 18C is a cross-sectional view taken along the dashed dotted line Y1-Y2 in FIG. 18A.

The transistor 170 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the conductive film 112a functioning as a source electrode electrically connected to the oxide semiconductor film 108, the conductive film 112b functioning as a drain electrode electrically connected to the oxide semiconductor film 108, the insulating film 114 over the oxide semiconductor film 108 and the conductive films 112a and 112b, the insulating film 116 over the insulating film 114, the insulating film 118 over the insulating film 116, and conductive films 120a and 120b over the insulating film 118.

Furthermore, the insulating films 106 and 107 function as a first gate insulating film of the transistor 170. The insulating films 114, 116, and 118 function as a second gate insulating film of the transistor 170. The conductive film 120a functions as, for example, a pixel electrode used in a display device. The conductive film 120a is connected to the conductive film 112b through an opening 142c provided in the insulating films 114, 116, and 118. The conductive film 120b functions as a second gate electrode (also referred to as a back gate electrode).

Figure 18B:
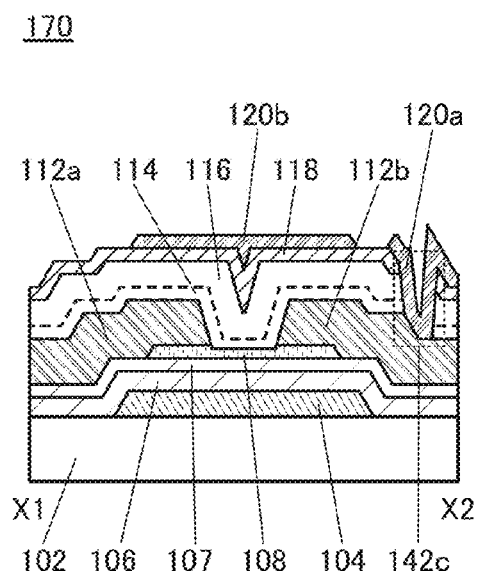
Figure 18C:
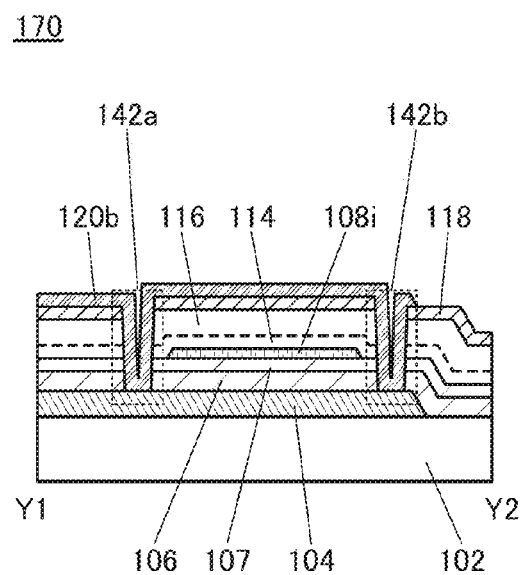

As illustrated in FIG. 18C, the conductive film 120b is connected to the conductive film 104 functioning as the first gate electrode through openings 142a and 142b provided in the insulating films 106, 107, 114, 116 and 118. Accordingly, the conductive film 120b and the conductive film 104 are supplied with the same potential.

Note that although the structure in which the openings 142a and 142b are provided so that the conductive film 120b and the conductive film 104 are connected to each other is described in this embodiment, one embodiment of the present invention is not limited thereto. For example, a structure in which only one of the openings 142a and 142b is provided so that the conductive film 120b and the conductive film 104 are connected to each other, or a structure in which the openings 142a and 142b are not provided and the conductive film 120b and the conductive film 104 are not connected to each other may be employed. Note that in the case where the conductive film 120b and the conductive film 104 are not connected to each other, it is possible to apply different potentials to the conductive film 120b and the conductive film 104.

As illustrated in FIG. 18B, the oxide semiconductor film 108 is positioned to be opposite each of the conductive film 104 functioning as the first gate electrode and the conductive film 120b functioning as the second gate electrode, and is provided between the two conductive films functioning as gate electrodes. The lengths in the channel length direction and the channel width direction of the conductive film 120b functioning as the second gate electrode are longer than those in the channel length direction and the channel width direction of the oxide semiconductor film 108. The whole oxide semiconductor film 108 is covered with the conductive film 120b with the insulating films 114, 116, and 118 provided therebetween. In addition, since the conductive film 120b functioning as the second gate electrode is connected to the conductive film 104 functioning as the first gate electrode through the openings 142a and 142b provided in the insulating films 106, 107, 114, 116, and 118; a side surface of the oxide semiconductor film 108 in the channel width direction faces the conductive film 120b functioning as the second gate electrode with the insulating films 114, 116, and 118 provided therebetween.

In other words, in the channel width direction of the transistor 170, the conductive film 104 functioning as the first gate electrode and the conductive film 120b functioning as the second gate electrode are connected to each other through the openings provided in the insulating films 106 and 107 functioning as a gate insulating film and the insulating films 114, 116, and 118 functioning as a second gate insulating film; and the conductive film 104 and the conductive film 120b surround the oxide semiconductor film 108 with the insulating films 106 and 107 functioning as a gate insulating film and the insulating films 114, 116, and 118 functioning as the second gate insulating film provided therebetween.

Such a structure makes it possible that the oxide semiconductor film 108 included in the transistor 170 is electrically surrounded by electric fields of the conductive film 104 functioning as the first gate electrode and the conductive film 120b functioning as the second gate electrode. The device structure of a transistor, like that of the transistor 170, in which electric fields of a first gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor film 108 by the conductive film 104 functioning as the first gate electrode; therefore, the current drive capability of the transistor 170 can improve and high on-state current characteristics can be obtained. In addition, since the on-state current can be increased, it is possible to reduce the size of the transistor 170. In addition, since the transistor 170 has a structure in which the oxide semiconductor film 108 is surrounded by the conductive film 104 functioning as the first gate electrode and the conductive film 120b functioning as the second gate electrode, the mechanical strength of the transistor 170 can be increased.

<Structure Example 5 of Transistor>

A structural example which is different from the transistor 100 in FIGS. 15A to 15C will be described with reference to FIGS. 19A to 19C.

Figure 19A:
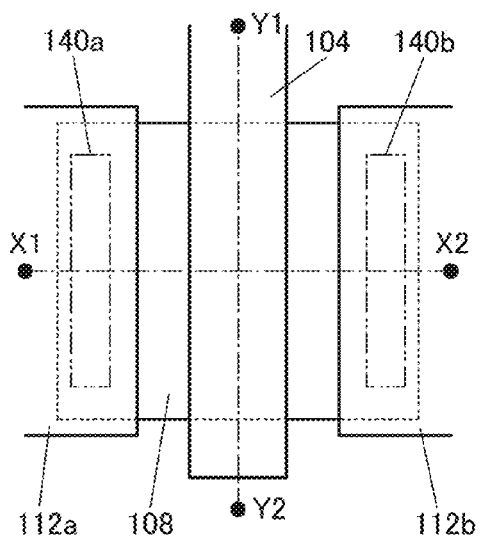
FIGS. 19A to 19C are a top view and cross-sectional views illustrating one embodiment of a transistor.
Figure 19B:
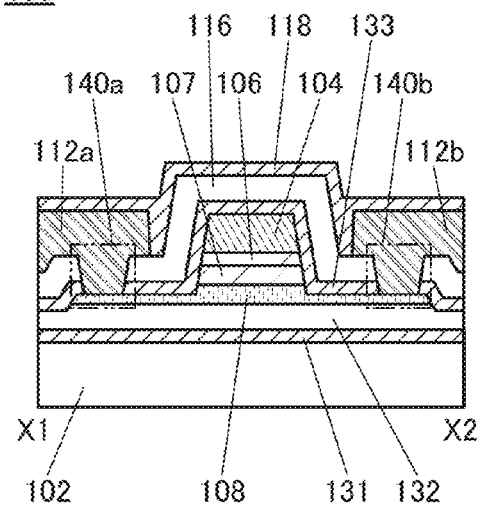
Figure 19C:
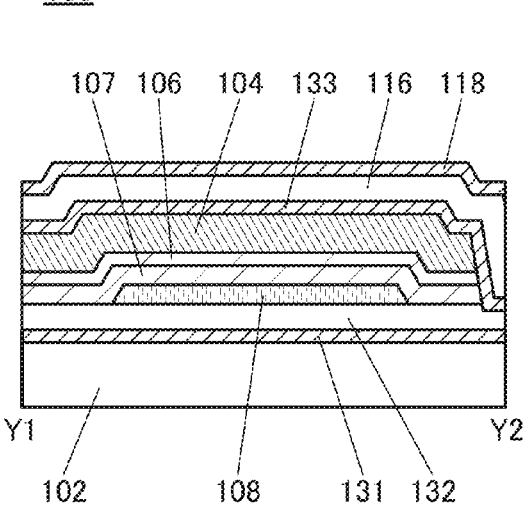

FIG. 19A is a top view of a transistor 180 of the semiconductor device of one embodiment of the present invention. FIG. 19B is a cross-sectional view taken along the dashed dotted line X1-X2 in FIG. 19A, and FIG. 19C is a cross-sectional view taken along the dashed dotted line Y1-Y2 in FIG. 19A.

The transistor 180 includes an insulating film 131 formed over the substrate 102, an insulating film 132 over the insulating film 131, the oxide semiconductor film 108 over the insulating film 132, the insulating film 107 over the oxide semiconductor film 108, the insulating film 106 over the insulating film 107, the conductive film 104 overlapping with the oxide semiconductor film 108 with the insulating films 106 and 107 provided therebetween, an insulating film 133 covering the oxide semiconductor film 108, the insulating film 132, and the conductive film 104, the insulating film 116 over the insulating film 133, the conductive film 112a connected to the oxide semiconductor film 108 through an opening 140a provided in the insulating films 133 and 116, and the conductive film 112b connected to the oxide semiconductor film 108 through an opening 140b provided in the insulating films 133 and 116. Note that the insulating film 118 covering the insulating film 116, the conductive film 104, and the conductive films 112a and 112b may be provided over the transistor 180.

In the transistor 180, the conductive film 104 functions as a gate electrode (also referred to as a top-gate electrode), the conductive film 112a functions as one of a source electrode and a drain electrode, and the conductive film 112b functions as the other of the source electrode and the drain electrode. Furthermore, in the transistor 180, the insulating films 131 and 132 function as a base film of the oxide semiconductor film 108, and the insulating films 107 and 106 function as a gate insulating film. As illustrated in FIGS. 19A to 19C, the transistor 180 is a single-gate transistor having a top-gate structure. As described above, transistors having a variety of structures such as a bottom-gate structure, a dual-gate structure, and a top-gate structure can be employed for the semiconductor device of one embodiment of the present invention.

<Structure Example 6 of Transistor>

A structural example which is different from the transistor 100 in FIGS. 15A to 15C will be described with reference to FIGS. 20A to 20D.

FIGS. 20A to 20D each illustrate a cross-sectional view of a modification example of the transistor 100 in FIGS. 15B and 15C.

Figure 20A:
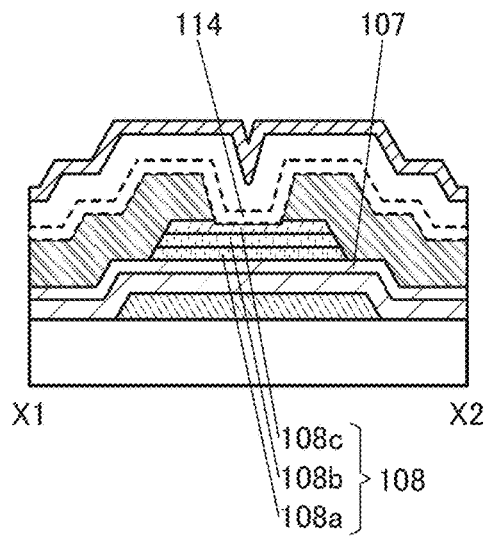
FIGS. 20A to 20D are cross-sectional views illustrating one embodiment of a transistor.
Figure 20B:
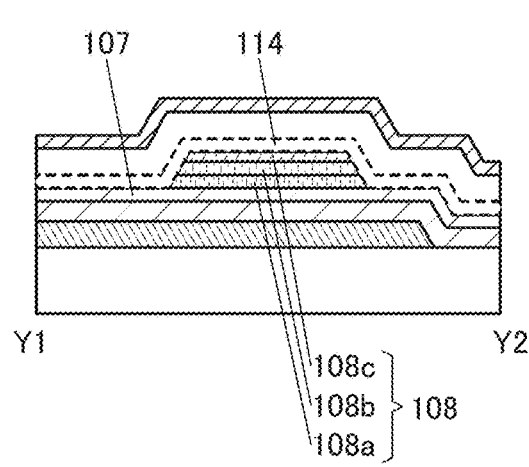

A transistor 100A illustrated in FIGS. 20A and 20B has the same structure as the transistor 100 in FIGS. 15B and 15C except that the oxide semiconductor film 108 has a three-layer structure. Specifically, the oxide semiconductor film 108 of the transistor 100A includes an oxide semiconductor film 108a, an oxide semiconductor film 108b, and an oxide semiconductor film 108c.

Figure 20C:
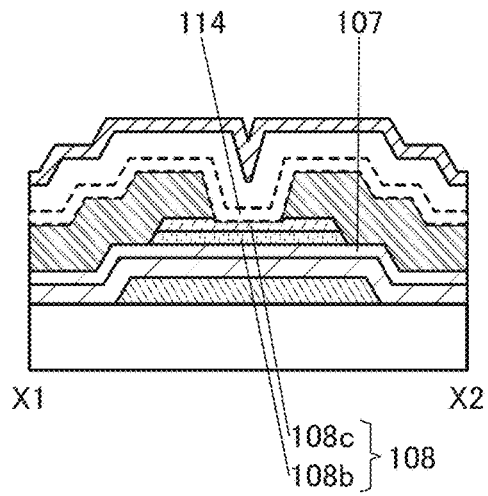
Figure 20D:
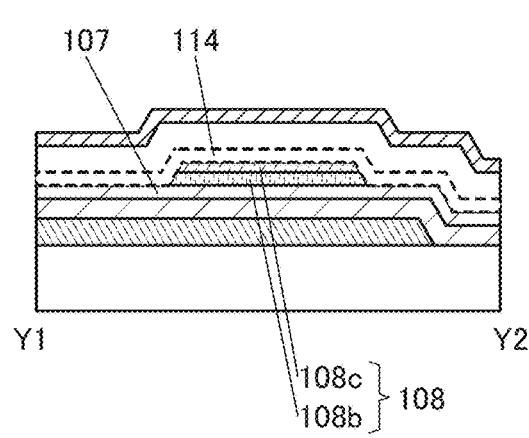

A transistor 100B illustrated in FIGS. 20C and 20D has the same structure as the transistor 100 in FIGS. 15B and 15C except that the oxide semiconductor film 108 has a two-layer structure. Specifically, the oxide semiconductor film 108 of the transistor 100B includes the oxide semiconductor film 108b and the oxide semiconductor film 108c.

Here, band structures including the oxide semiconductor films 108a, 108b, and 108c and insulating films in contact with the oxide semiconductor films 108b and 108c are described with reference to FIGS. 21A and 21B.

Figure 21A:
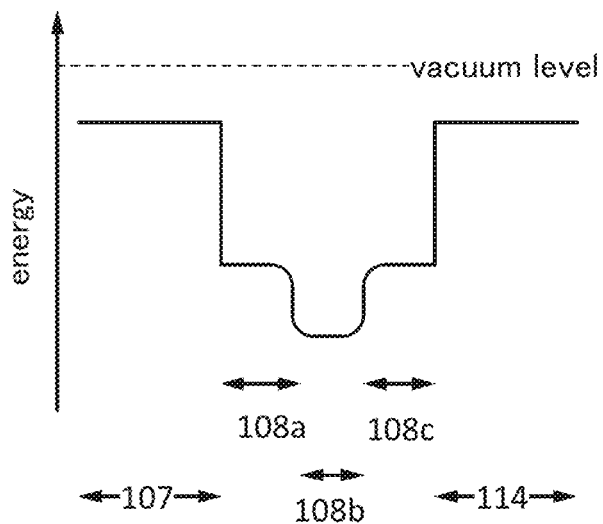
FIGS. 21A and 21B each illustrate a band structure of an oxide semiconductor.

FIG. 21A illustrates an example of a band structure in the thickness direction of a stack including the insulating film 107, the oxide semiconductor films 108a, 108b, and 108c, and the insulating film 114. FIG. 21B illustrates an example of a band structure in the thickness direction of a stack including the insulating film 107, the oxide semiconductor films 108b and 108c, and the insulating film 114. For easy understanding, energy level of the conduction band minimum ($E_c$) of each of the insulating film 107, the oxide semiconductor films 108a, 108b, and 108c, and the insulating film 114 is shown in the band structures.

In FIG. 21A, a silicon oxide film is used as each of the insulating films 107 and 114, an oxide semiconductor film formed using a metal oxide target having an atomic ratio of metal elements of In:Ga:Zn=1:3:2 is used as the oxide semiconductor film 108a, an oxide semiconductor film formed using a metal oxide target having an atomic ratio of metal elements of In:Ga:Zn=1:1:1 is used as the oxide semiconductor film 108b, and an oxide semiconductor film formed using a metal oxide target having an atomic ratio of metal elements of In:Ga:Zn=1:3:2 is used as the oxide semiconductor film 108c.

Figure 21B:
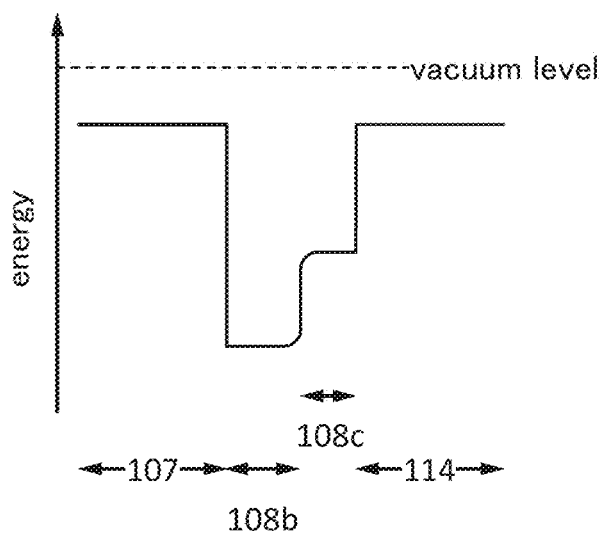

In the band structure of FIG. 21B, a silicon oxide film is used as each of the insulating films 107 and 114, an oxide semiconductor film formed using a metal oxide target having an atomic ratio of metal elements of In:Ga:Zn=1:1:1 is used as the oxide semiconductor film 108b, and a metal oxide film formed using a metal oxide target having an atomic ratio of metal elements of In:Ga:Zn=1:3:2 is used as the oxide semiconductor film 108c.

As illustrated in FIGS. 21A and 21B, the energy level of the conduction band minimum gradually varies between the oxide semiconductor film 108a and the oxide semiconductor film 108b and between the oxide semiconductor film 108b and the oxide semiconductor film 108c. In other words, the energy level of the conduction band minimum is continuously varied or continuously connected. To obtain such a band structure, there exists no impurity, which forms a defect state such as a trap center or a recombination center, at the interface between the oxide semiconductor film 108a and the oxide semiconductor film 108b or at the interface between the oxide semiconductor film 108b and the oxide semiconductor film 108c.

To form a continuous junction between the oxide semiconductor film 108a and the oxide semiconductor film 108b and between the oxide semiconductor film 108b and the oxide semiconductor film 108c, the films may be formed successively without exposure to the air by using a multi-chamber deposition apparatus (sputtering apparatus) provided with a load lock chamber.

With the band structure of FIG. 21A or FIG. 21B, the oxide semiconductor film 108b serves as a well, and a channel region is formed in the oxide semiconductor film 108b in the transistor with the stacked-layer structure.

Note that with the above stacked-layer structure, trap states, which can be formed in the oxide semiconductor film 108b in the case where the oxide semiconductor films 108a and 108c are not formed, are formed in the oxide semiconductor film 108a and/or the oxide semiconductor film 108c. Therefore, the trap states can be distanced away from the oxide semiconductor film 108b.

In addition, the trap states might be more distant from the vacuum level than the energy level of the conduction band minimum ($E_c$) of the oxide semiconductor film 108b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum ($E_c$) of the oxide semiconductor film 108b. Such a structure inhibits accumulation of electrons in the trap states. As a result, the on-state current and the field-effect mobility of the transistor can be increased.

In FIGS. 21A and 21B, the energy level of the conduction band minimum of each of the oxide semiconductor films 108a and 108c is closer to the vacuum level than that of the oxide semiconductor film 108b. Typically, a difference in energy level between the conduction band minimum of the oxide semiconductor film 108b and the conduction band minimum of each of the oxide semiconductor films 108a and 108c is 0.15 eV or more or 0.5 eV or more and 2 eV or less or 1 eV or less. That is, the difference between the electron affinity of each of the oxide semiconductor films 108a and 108c and the electron affinity of the oxide semiconductor film 108b is 0.15 eV or more or 0.5 eV or more and 2 eV or less or 1 eV or less.

In such a structure, the oxide semiconductor film 108b serves as a main path of current and functions as a channel region. In addition, since the oxide semiconductor films 108a and 108c each include one or more metal elements included in the oxide semiconductor film 108b in which a channel region is formed, interface scattering is less likely to occur at the interface between the oxide semiconductor film 108a and the oxide semiconductor film 108b or at the interface between the oxide semiconductor film 108b and the oxide semiconductor film 108c. Thus, the transistor can have high field-effect mobility because the movement of carriers is not hindered at the interface.

To prevent each of the oxide semiconductor films 108a and 108c from functioning as part of a channel region, a material having sufficiently low conductivity is used for the oxide semiconductor films 108a and 108c. Alternatively, a material which has a smaller electron affinity (a difference in energy level between the vacuum level and the conduction band minimum) than the oxide semiconductor film 108b and has a difference in energy level in the conduction band minimum from the oxide semiconductor film 108b (band offset) is used for the oxide semiconductor films 108a and 108c. Furthermore, to inhibit generation of a difference between threshold voltages due to the value of the drain voltage, it is preferable to form the oxide semiconductor films 108a and 108c using a material whose energy level of the conduction band minimum is closer to the vacuum level than that of the oxide semiconductor film 108b by 0.2 eV or more, further preferably 0.5 eV or more.

It is preferable that the oxide semiconductor films 108a and 108c not have a spinel crystal structure. This is because if the oxide semiconductor films 108a and 108c have a spinel crystal structure, constituent elements of the conductive films 112a and 112b might be diffused to the oxide semiconductor film 108b at the interface between the spinel crystal structure and another region. Note that each of the oxide semiconductor film 108a and 108c is preferably a CAAC-OS, which is described later, in which case a higher blocking property against constituent elements of the conductive films 112a and 112b, for example, copper elements is obtained.

The thickness of each of the oxide semiconductor films 108a and 108c is greater than or equal to a thickness that is capable of inhibiting diffusion of the constituent elements of the conductive films 112a and 112b to the oxide semiconductor film 108b, and less than a thickness that inhibits supply of oxygen from the insulating film 114 to the oxide semiconductor film 108b. For example, when the thickness of each of the oxide semiconductor films 108a and 108c is greater than or equal to 10 nm, diffusion of the constituent elements of the conductive films 112a and 112b to the oxide semiconductor film 108b can be inhibited. When the thickness of each of the oxide semiconductor films 108a and 108c is less than or equal to 100 nm, oxygen can be effectively supplied from the insulating films 114 and 116 to the oxide semiconductor film 108b.

When the oxide semiconductor films 108a and 108c are each an In-M-Zn oxide in which the atomic ratio of the element M (M is Ti, Ga, Y, Zr, La, Ce, Nd, Sn, or Hf) is higher than that of In, the energy gap of each of the oxide semiconductor films 108a and 108c can be large and the electron affinity thereof can be small. Therefore, a difference in electron affinity between the oxide semiconductor film 108b and each of the oxide semiconductor films 108a and 108c may be controlled by the proportion of the element M. Furthermore, oxygen vacancy is less likely to be generated in the oxide semiconductor film in which the atomic ratio of Ti, Ga, Y, Zr, La, Ce, Nd, Sn, or Hf is higher than that of In because Ti, Ga, Y, Zr, La, Ce, Nd, Sn, and Hf each are a metal element that is strongly bonded to oxygen.

When an In-M-Zn oxide is used for the oxide semiconductor films 108a and 108c, the proportions of In and M, not taking Zn and O into consideration, is preferably as follows: the atomic percentage of In is less than 50 atomic % and the atomic percentage of M is greater than 50 atomic %; and further preferably, the atomic percentage of In is less than 25 atomic % and the atomic percentage of M is greater than 75 atomic %. Alternatively, a gallium oxide film may be used as each of the oxide semiconductor films 108a and 108c.

Furthermore, in the case where each of the oxide semiconductor films 108a, 108b, and 108c is an In-M-Zn oxide, the proportion of M atoms in each of the oxide semiconductor films 108a and 108c is higher than that in the oxide semiconductor film 108b. Typically, the proportion of M atoms in each of the oxide semiconductor films 108a and 108c is 1.5 or more times, preferably twice or more times and further preferably three or more times, as high as that in the oxide semiconductor film 108b.

Furthermore, in the case where the oxide semiconductor films 108a, 108b, and 108c are each an In-M-Zn oxide, when the oxide semiconductor film 108b has an atomic ratio of $In:M:Zn=x_1:y_1:z_1$ and the oxide semiconductor films 108a and 108c each have an atomic ratio of $In:M:Zn=x_2:y_2:z_2$, $y_2/x_2$ is larger than $y_1/x_1$, preferably $y_2/x_2$ is 1.5 or more times as large as $y_1/x_1$, further preferably $y_2/x_2$ is two or more times as large as $y_1/x_1$, and still further preferably $y_2/x_2$ is three or more times or four or more times as large as $y_1/x_1$. At this time, $y_1$ is preferably greater than or equal to $x_1$ in the oxide semiconductor film 108b, because stable electrical characteristics of a transistor including the oxide semiconductor film 108b can be achieved. However, when $y_1$ is three or more times as large as $x_1$, the field-effect mobility of the transistor including the oxide semiconductor film 108b is reduced. Accordingly, $y_1$ is preferably smaller than three times $x_1$.

In the case where the oxide semiconductor film 108b is an In-M-Zn oxide and a target having the atomic ratio of metal elements of $In:M:Zn=x_1:y_1:z_1$ is used for depositing the oxide semiconductor film 108b, $x_1/y_1$ is preferably greater than or equal to 1/3 and less than or equal to 6 and further preferably greater than or equal to 1 and less than or equal to 6, and $z_1/y_1$ is preferably greater than or equal to 1/3 and less than or equal to 6 and further preferably greater than or equal to 1 and less than or equal to 6. Note that when $z_1/y_1$ is greater than or equal to 1 and less than or equal to 6, a CAAC-OS to be described later is easily formed as the oxide semiconductor film 108b. Typical examples of the atomic ratio of the metal elements of the target are In:M:Zn=1:1:1, In:M:Zn=1:1:1.2, and In:M:Zn=3:1:2.

In the case where the oxide semiconductor films 108a and 108c are each an In-M-Zn oxide and a target having an atomic ratio of metal elements of $In:M:Zn=x_2:y_2:z_2$ is used for depositing the oxide semiconductor films 108a and 108c, $x_2/y_2$ is preferably less than $x_1/y_1$, and $z_2/y_2$ is preferably greater than or equal to 1/3 and less than or equal to 6 and further preferably greater than or equal to 1 and less than or equal to 6. When the atomic ratio of M with respect to indium is high, the energy gap of the oxide semiconductor films 108a and 108c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 108a and 108c are each an In-M oxide, when a divalent metal element (e.g., zinc) is not included as M, the oxide semiconductor films 108a and 108c which do not include a spinel crystal structure can be formed. As the oxide semiconductor films 108a and 108c, for example, an In—Ga oxide film can be used. The In—Ga oxide film can be formed by a sputtering method using an In—Ga metal oxide target (In:Ga=7:93), for example. To deposit the oxide semiconductor films 108a and 108c by a sputtering method using DC discharge, on the assumption that an atomic ratio of In:M is x:y, y/(x+y) is preferably less than or equal to 0.96 and further preferably less than or equal to 0.95, for example, 0.93.

In each of the oxide semiconductor films 108a, 108b, and 108c, the proportions of the atoms in the above atomic ratio vary within a range of ±40% as an error.

The structures of the transistors of this embodiment can be freely combined with each other.

<Method 1 for Manufacturing Semiconductor Device>

Next, a method for manufacturing the transistor 100 will be described with reference to FIGS. 22A to 22D and FIGS. 23A to 23D. FIGS. 22A to 22D and FIGS. 23A to 23D are cross-sectional views illustrating a method for manufacturing a semiconductor device.

(Step of Forming Gate Electrode)

Figure 22A:
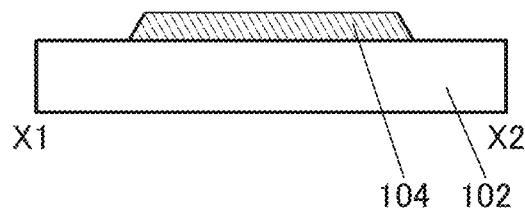
FIGS. 22A to 22D are cross-sectional views illustrating an example of a manufacturing process of a semiconductor device.

First, a conductive film is formed over the substrate 102 and processed through a lithography process and an etching process, whereby the conductive film 104 functioning as the gate electrode is formed (see FIG. 22A).

In this embodiment, a glass substrate is used as the substrate 102, and as the conductive film 104 functioning as the gate electrode, a 100-nm-thick tungsten film is formed by a sputtering method.

(Step of Forming Gate Insulating Film)

Figure 22B:
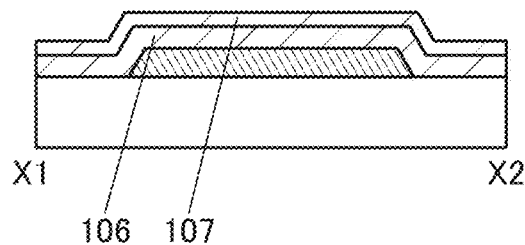

Then, the insulating films 106 and 107 functioning as a gate insulating film are formed over the conductive film 104 (see FIG. 22B).

In this embodiment, a 400-nm-thick silicon nitride film as the insulating film 106 and a 50-nm-thick silicon oxynitride film as the insulating film 107 are formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C.

When the insulating film 106 has the three-layer structure of silicon nitride films, for example, in the case where a conductive film including Cu is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film containing oxygen to improve characteristics of an interface with the oxide semiconductor film 108 formed later.

(Step of Forming Oxide Semiconductor Film)

Figure 22C:
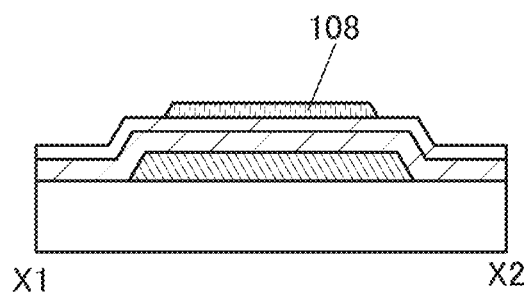

Next, the oxide semiconductor film 108 is formed over the insulating film 107 (see FIG. 22C).

In this embodiment, an oxide semiconductor film is formed by a sputtering method using an In—Ga—Zn metal oxide target (having an atomic ratio of In:Ga:Zn=1:1:1.2), a mask is formed over the oxide semiconductor film through a lithography process, and the oxide semiconductor film is processed into a desired region, whereby the oxide semiconductor film 108 having an island shape is formed.

After the oxide semiconductor film 108 is formed, heat treatment may be performed at a temperature higher than or equal to 150° C. and lower than the strain point of the substrate, preferably higher than or equal to 200° C. and lower than or equal to 450° C. and further preferably higher than or equal to 300° C. and lower than or equal to 450° C. The heat treatment performed here serves as one kind of treatment for increasing the purity of the oxide semiconductor film and can reduce hydrogen, water, and the like included in the oxide semiconductor film 108. Note that the heat treatment for the purpose of reducing hydrogen, water, and the like may be performed before the oxide semiconductor film 108 is processed into an island shape.

A gas baking furnace, an electric furnace, an RTA apparatus, or the like can be used for the heat treatment performed on the oxide semiconductor film 108. With the use of an RTA apparatus, the heat treatment can be performed at a temperature higher than or equal to the strain point of the substrate if the heating time is short. Therefore, the heat treatment time can be shortened.

The heat treatment may be performed on the oxide semiconductor film 108 in an atmosphere of a nitrogen gas, an oxygen gas, clean dry air (also referred to as CDA, which is an air with a water content of 20 ppm or less, preferably 1 ppm or less and further preferably 10 ppb or less), or a rare gas (e.g., argon or helium). The atmosphere of a nitrogen gas, an oxygen gas, CDA, or a rare gas preferably does not contain hydrogen, water, and the like.

The purity of the nitrogen gas, the oxygen gas, or CDA is preferably increased, for example. Specifically, the purity of the nitrogen gas, the oxygen gas, or CDA is preferably 6N (99.9999%) or 7N (99.99999%). When a gas which is highly purified to have a dew point of −60° C. or lower, preferably −100° C. or lower, is used as the nitrogen gas, the oxygen gas, or CDA, entry of moisture and the like into the oxide semiconductor film 108 can be minimized.

Further, another heat treatment may be performed on the oxide semiconductor film 108 in an oxygen atmosphere or a CDA atmosphere after the heat treatment in a nitrogen atmosphere or a rare gas atmosphere. As a result, hydrogen, water, and the like can be released from the oxide semiconductor film 108 and oxygen can be supplied to the oxide semiconductor film 108 at the same time. Consequently, the amount of oxygen vacancy in the oxide semiconductor film 108 can be reduced.

Here, thermal profiles of heat treatment performed on the oxide semiconductor film 108 in a gas baking furnace will be described with reference to FIGS. 26A and 26B and FIGS. 27A and 27B. FIGS. 26A and 26B and FIGS. 27A and 27B each show a thermal profile of heat treatment in a gas baking furnace.

Note that each of FIGS. 26A and 26B and FIGS. 27A and 27B is a thermal profile showing the temperature raised to a predetermined temperature (here, 450° C.; hereinafter referred to as a first temperature) and dropped to a predetermined temperature (here, higher than or equal to room temperature and lower than or equal to 150° C.; hereinafter referred to as a second temperature).

Figure 26A:
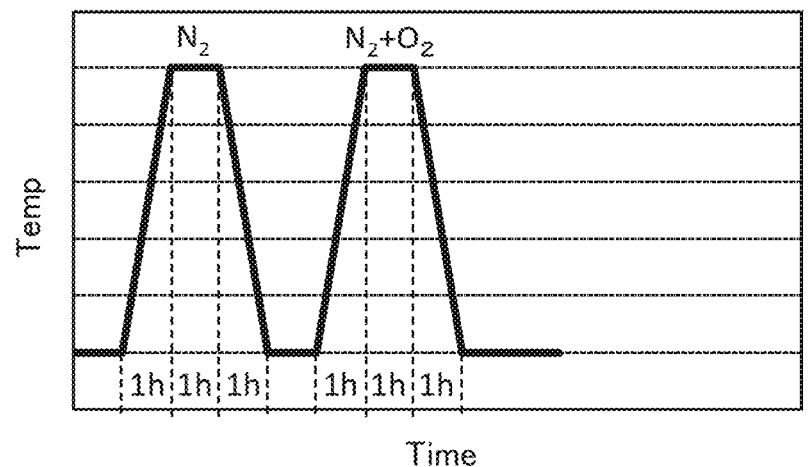
FIGS. 26A and 26B each show a thermal profile of heat treatment in a gas baking furnace.

When heat treatment is performed on the oxide semiconductor film 108, the heat treatment can be divided into two steps using two kinds of gases as shown in FIG. 26A. For example, a nitrogen gas is introduced into a gas baking furnace in the first step. Then, the temperature is raised to the first temperature over one hour, and the heat treatment is performed at the first temperature for another one hour. After that, the temperature is dropped to the second temperature over the next one hour. In the second step, the nitrogen gas is replaced by a mixed gas of nitrogen and oxygen. Then, the time taken to raise the temperature to the first temperature is one hour, and the heat treatment is performed at the first temperature for another one hour. After that, the temperature is dropped to the second temperature over the next one hour.

Figure 26B:
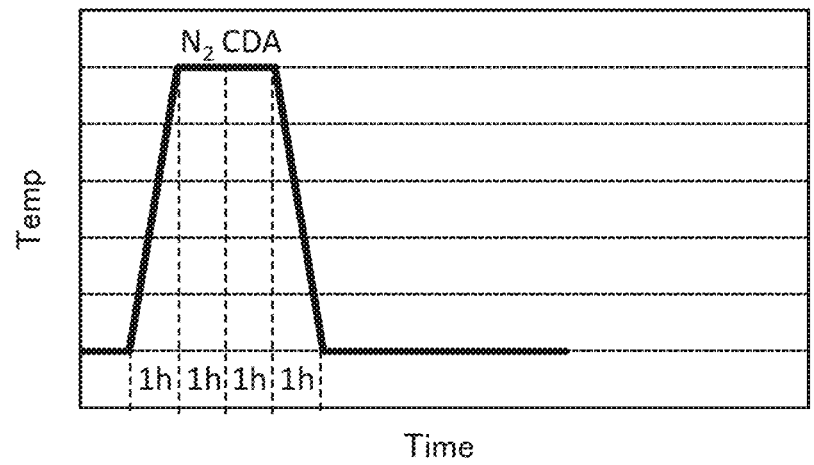

Alternatively, when heat treatment is performed on the oxide semiconductor film 108, the treatment can be performed in one step using two kinds of gases as shown in FIG. 26B. For example, first, a nitrogen gas is introduced into a gas baking furnace. Then, the temperature is raised to the first temperature over one hour, and the heat treatment is performed at the first temperature for another one hour. After that, the gas is changed from the nitrogen gas to CDA. After the gas change, the heat treatment is performed for another one hour, and the temperature is dropped to the second temperature over the next one hour.

The thermal profile of the heat treatment in the gas baking furnace shown in FIG. 26B requires less processing time than the thermal profile of the heat treatment in the gas baking furnace shown in FIG. 26A; accordingly, semiconductor devices can be provided with higher productivity.

Figure 27A:
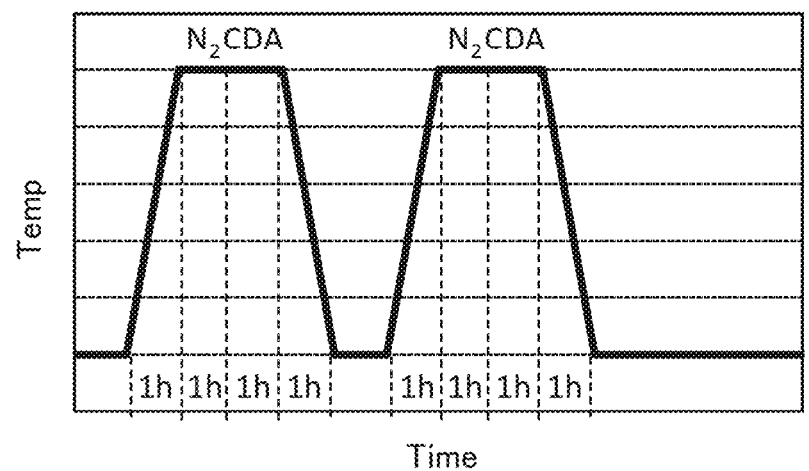
FIGS. 27A and 27B each show a thermal profile of heat treatment in a gas baking furnace.

Alternatively, when heat treatment is performed on the oxide semiconductor film 108, the heat treatment can be performed in two steps using two kinds of gases as shown in FIG. 27A. For example, first, a nitrogen gas is introduced into a gas baking furnace in the first step. Then, the temperature is raised to the first temperature over one hour, and the heat treatment is performed at the first temperature for another one hour. After that, the gas is changed from the nitrogen gas to CDA. After the gas change, the heat treatment is performed for another one hour, and the temperature is dropped to the second temperature over the next one hour. In the second step, CDA is replaced by a nitrogen gas. Then, the temperature is raised to the first temperature over one hour, and the heat treatment is performed at the first temperature for another one hour. After that, the gas is changed from the nitrogen gas to CDA. After the gas change, the heat treatment is performed for another one hour, and the temperature is dropped to the second temperature over the next one hour.

Figure 27B:
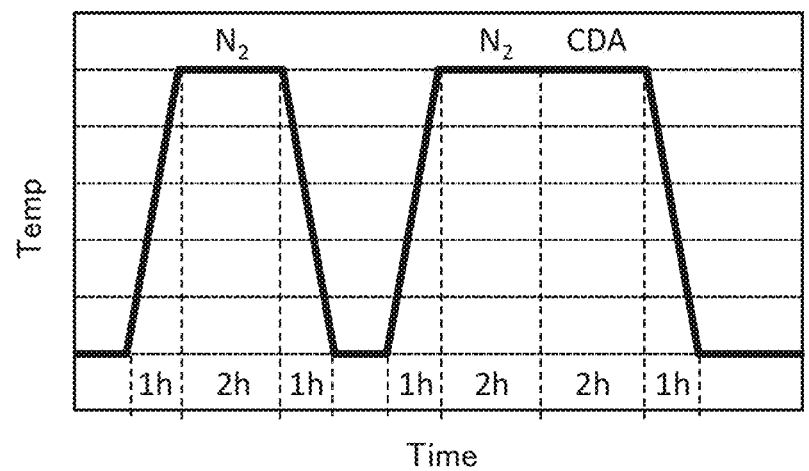

Alternatively, when heat treatment is performed on the oxide semiconductor film 108, the heat treatment can be performed in two steps using two kinds of gases as shown in FIG. 27B. For example, first, a nitrogen gas is introduced into a gas baking furnace in the first step. Then, the temperature is raised to the first temperature over one hour, and the heat treatment is performed at the first temperature for two hours. After that, the temperature is dropped to the second temperature over the next one hour. In the second step, the temperature is raised to the first temperature over one hour, and the heat treatment is performed at the first temperature for two hours. After that, the gas is changed from the nitrogen gas to CDA. After the gas change, the heat treatment is performed for another two hours, and then the temperature is dropped to the second temperature over the next one hour.

As far as the thermal profiles of heat treatment performed on the oxide semiconductor film 108 in a gas baking furnace are concerned, it is preferable that the oxide semiconductor film 108 be first heated in a nitrogen gas as shown in FIGS. 26A and 26B and FIGS. 27A and 27B.

When the oxide semiconductor film 108 is first heated in a nitrogen gas, oxygen, which is one of the principal components of the oxide semiconductor film 108, and hydrogen in the oxide semiconductor film 108 react with each other to form an OH group. Then, the OH group is released from the surface of the oxide semiconductor film 108 as $H_2O$. In other words, owing to the first nitrogen gas, hydrogen in the oxide semiconductor film 108 can be captured.

However, heating the oxide semiconductor film 108 with only a nitrogen gas makes oxygen be released from the oxide semiconductor film 108 as $H_2O$, whereby oxygen vacancy might be formed in the oxide semiconductor film 108. Thus, the nitrogen gas is replaced by either a mixed gas of nitrogen and oxygen or CDA as shown in FIGS. 26A and 26B and FIGS. 27A and 27B, in which case oxygen contained in the gas can fill the oxygen vacancy in the oxide semiconductor film 108.

Note that although the heat treatment is performed for one or two consecutive hours after the temperature becomes stable at the predetermined temperature in FIGS. 26A and 26B and FIGS. 27A and 27B, one embodiment of the present invention is not limited thereto. For example, the processing time of heat treatment in the nitrogen gas in the first step in FIG. 26B may be one to ten hours inclusive. As the processing time of the first step in FIG. 26B is increased, a larger amount of hydrogen can be released from the oxide semiconductor film 108, which is preferable.

In addition, time for baking with the use of either a mixed gas of nitrogen and oxygen or CDA may be set longer (e.g., one to ten hours inclusive) as necessary. Increasing the heating time in an oxygen-containing atmosphere makes it possible to favorably fill the oxygen vacancy formed in the oxide semiconductor film 108.

In the case where the oxide semiconductor film is formed by a sputtering method, a rare gas (typically argon), oxygen, or a mixed gas of a rare gas and oxygen is used as a sputtering gas, as appropriate. In the case where the mixed gas of a rare gas and oxygen is used, the proportion of oxygen to a rare gas is preferably increased. In addition, increasing the purity of a sputtering gas is necessary. For example, as an oxygen gas or an argon gas used for a sputtering gas, a gas that is highly purified to have a dew point of −60° C. or lower, preferably −100° C. or lower, is used, whereby entry of moisture or the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas containing carbon or hydrogen from an exhaust system to the inside of the chamber.

(Step of Forming Source Electrode and Drain Electrode)

Figure 22D:
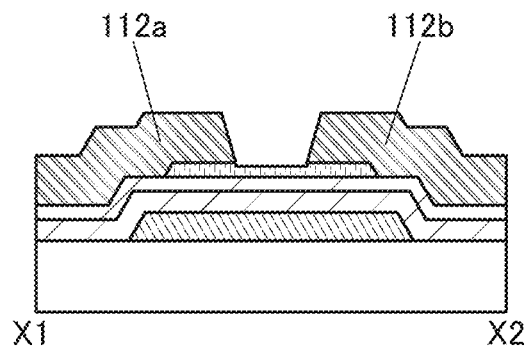

Next, a conductive film is formed over the insulating film 107 and the oxide semiconductor film 108 and processed into a desired shape, whereby the conductive films 112a and 112b are formed (see FIG. 22D).

In this embodiment, as the conductive films 112a and 112b, a 50-nm-thick tungsten film, a 400-nm-thick aluminum film, and a 100-nm-thick titanium film were formed in this order. Note that as a method of forming the conductive films 112a and 112b, a sputtering method may be used.

After the conductive films 112a and 112b are formed, a step of cleaning a surface of the oxide semiconductor film 108 may be performed. As a method of cleaning the surface of the oxide semiconductor film 108, a phosphoric acid solution or the like may be used, for example. Note that a recessed portion might be formed in part of the surface of the oxide semiconductor film 108 in the step of forming the conductive films 112a and 112b or the step of cleaning the surface of the oxide semiconductor film 108.

Through the above process, the transistor 100 is formed.

(Step of Forming Oxide Insulating Film)

Figure 23A:
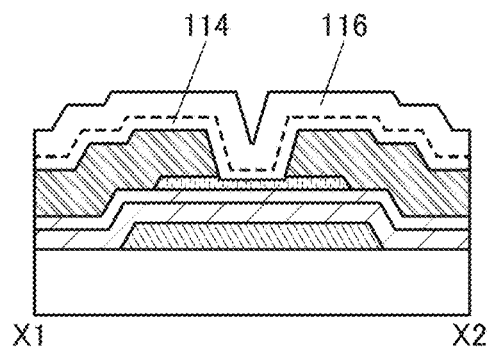
FIGS. 23A to 23D are cross-sectional views illustrating an example of the manufacturing process of a semiconductor device.

Next, the insulating films 114 and 116 functioning as protective insulating films of the transistor 100 are formed over the transistor 100, specifically, over the oxide semiconductor film 108 and the conductive films 112a and 112b (see FIG. 23A).

Note that after the insulating film 114 is formed, the insulating film 116 is preferably formed in succession without exposure to the air. After the insulating film 114 is formed, the insulating film 116 is formed in succession without exposure to the air while at least one of the flow rate of a source gas, pressure, a high-frequency power, and a substrate temperature is adjusted, whereby the concentration of impurities attributed to the atmospheric component at the interface between the insulating film 114 and the insulating film 116 can be reduced and oxygen in the insulating films 114 and 116 can be moved to the oxide semiconductor film 108; accordingly, the amount of oxygen vacancy in the oxide semiconductor film 108 can be reduced.

As the insulating film 114, a silicon oxynitride film can be formed by a PECVD method, for example. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 114 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6\times10^{-2}$ W/cm$^2$ as the power density) is supplied to parallel-plate electrodes.

As the insulating film 116, a silicon oxide film or a silicon oxynitride film is formed under the conditions where the substrate placed in a treatment chamber of the PECVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa, with introduction of a source gas into the treatment chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$, is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, an oxide insulating film that contains oxygen at a higher proportion than oxygen in the stoichiometric composition and from which part of oxygen is released by heating can be formed.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the number of defects in the insulating film 116 can be reduced. Typically, it is possible to form an oxide insulating layer in which the number of defects is small, i.e., the spin density of a signal that appears at g=2.001 due to a dangling bond of silicon is lower than $6\times10^{17}$ spins/cm$^3$, preferably lower than or equal to $3\times10^{17}$ spins/cm$^3$ and further preferably lower than or equal to $1.5\times10^{17}$ spins/cm$^3$, by ESR measurement. As a result, the reliability of the transistor can be improved.

Heat treatment may be performed after the insulating films 114 and 116 are formed. The heat treatment can reduce nitrogen oxide included in the insulating films 114 and 116. By the heat treatment, part of oxygen included in the insulating films 114 and 116 can be moved to the oxide semiconductor film 108, so that the amount of oxygen vacancy included in the oxide semiconductor film 108 can be reduced.

The temperature of the heat treatment performed on the insulating films 114 and 116 is typically higher than or equal to 150° C. and lower than or equal to 400° C., preferably higher than or equal to 300° C. and lower than or equal to 400° C. and further preferably higher than or equal to 320° C. and lower than or equal to 370° C. The heat treatment may be performed under an atmosphere of nitrogen, oxygen, CDA, or a rare gas (argon, helium, and the like). Note that a gas baking furnace, an electric furnace, an RTA apparatus, or the like can be used for the heat treatment, in which it is preferable that hydrogen, water, and the like not be contained in the nitrogen, oxygen, ultra-dry air, or a rare gas.

In this embodiment, the heat treatment is performed at 350° C. for one hour in an atmosphere of nitrogen and oxygen.

(Step of Adding Oxygen to Oxide Insulating Film)

Figure 23B:
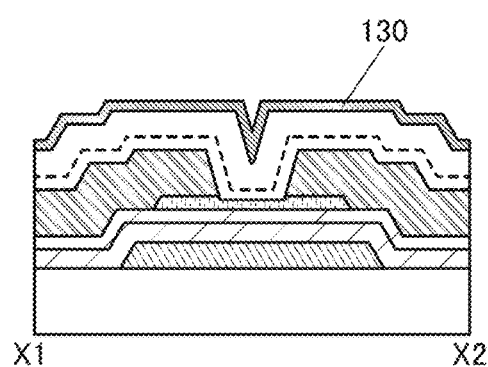

Next, a protective film 130 that inhibits release of oxygen is formed over the insulating film 116 (see FIG. 23B).

The protective film 130 can be formed using a conductive film including indium or a semiconductor film including indium. In this embodiment, a 5-nm-thick ITSO film is formed using a sputtering apparatus as the protective film 130. Note that the thickness of the protective film 130 is preferably greater than or equal to 1 nm and less than or equal to 20 nm or greater than or equal to 2 nm and less than or equal to 10 nm, in which case oxygen is favorably transmitted and release of oxygen can be inhibited.

Figure 23C:
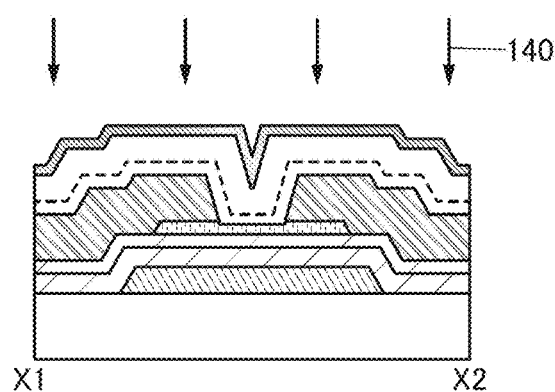

Next, oxygen 140 is added to the insulating films 114 and 116 through the protective film 130 (see FIG. 23C).

Examples of a method for adding the oxygen 140 to the insulating films 114 and 116 through the protective film 130 include an ion doping method, an ion implantation method (e.g., ion implantation, plasma-based ion implantation, plasma immersion ion implantation, and plasma source ion implantation), and a plasma treatment method. In the case of the plasma treatment method, high-density plasma may be generated by exciting a halogen element and oxygen with a microwave.

By application of a bias voltage to the substrate side when the oxygen 140 is added, the oxygen 140 can be effectively added to the insulating films 114 and 116. As the condition of the bias voltage, an ashing apparatus is used, for example, and the power density of the bias voltage applied to the substrate side of the ashing apparatus can be greater than or equal to 0.5 W/cm$^2$ and less than or equal to 5 W/cm$^2$. The substrate temperature during addition of the oxygen 140 is higher than or equal to room temperature and lower than or equal to 300° C., preferably higher than or equal to 100° C. and lower than or equal to 250° C., whereby the oxygen 140 can be added efficiently to the insulating films 114 and 116.

In this embodiment, an ashing apparatus is used. An oxygen gas is introduced into the ashing apparatus and a bias is applied to the substrate side, so that the oxygen 140 is added to the insulating films 114 and 116.

By adding the oxygen 140 after providing the protective film 130 over the insulating film 116, the protective film 130 functions as a protective film that inhibits release of oxygen from the insulating film 116. Thus, a larger amount of oxygen can be added to the insulating films 114 and 116.

Figure 23D:
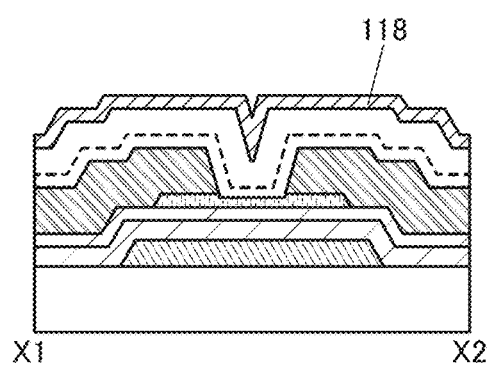

After that, the protective film 130 is removed, and the insulating film 118 is formed over the insulating film 116 (see FIG. 23D).

A chemical solution or an etching gas may be used to remove the protective film 130. In this embodiment, after an oxalic acid solution containing an oxalic acid at a concentration of 5% is used, a hydrofluoric acid solution containing a hydrofluoric acid at a concentration of 0.5% is used to remove the protective film 130.

In the case where the insulating film 118 is formed by a PECVD method, the substrate temperature is preferably set to be higher than or equal to 300° C. and lower than or equal to 400° C. and further preferably higher than or equal to 320° C. and lower than or equal to 370° C., so that a dense film can be formed.

For example, in the case where a silicon nitride film is formed by a PECVD method as the insulating film 118, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is preferably set to be greater than or equal to 5 and less than or equal to 50 and further preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

In the case where the insulating film 118 is formed by thermal deposition, it is preferable that preheating be not performed before formation of the insulating film 118. For example, in the case where preheating is performed before formation of the insulating film 118, excess oxygen in the insulating films 114 and 116 is released to the outside in some cases. Therefore, when the insulating film 118 is formed, excess oxygen in the insulating films 114 and 116 can be prevented from being released to the outside without preheating by, specifically, forming the insulating film 118 over the insulating film 116 within preferably three minutes and further preferably within one minute after the substrate is transferred to a heated chamber.

Note that heat treatment may be performed before or after the formation of the insulating film 118, so that excess oxygen included in the insulating films 114 and 116 can be diffused to the oxide semiconductor film 108 to fill oxygen vacancy in the oxide semiconductor film 108. Alternatively, the insulating film 118 may be deposited by heating, so that excess oxygen included in the insulating films 114 and 116 can be diffused to the oxide semiconductor film 108 to fill oxygen vacancy in the oxide semiconductor film 108. The temperature of the heat treatment that can be performed before or after the formation of the insulating films 118 is typically higher than or equal to 150° C. and lower than or equal to 400° C., preferably higher than or equal to 300° C. and lower than or equal to 400° C. and further preferably higher than or equal to 320° C. and lower than or equal to 370° C.

Through the above process, the transistor 100 can be manufactured.

<Method 2 for Manufacturing Semiconductor Device>

Next, a method for manufacturing the transistor 150 will be described with reference to FIGS. 24A to 24D. FIGS. 24A to 24D are cross-sectional views illustrating a method for manufacturing a semiconductor device.

Figure 24A:
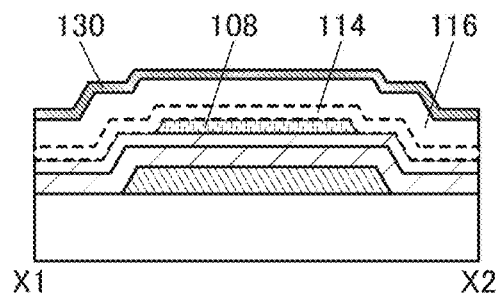
FIGS. 24A to 24D are cross-sectional views illustrating an example of a manufacturing process of a semiconductor device.

First, the steps up to the step in FIG. 22C are performed, and then the insulating films 114 and 116 and the protective film 130 are formed over the insulating film 107 and the oxide semiconductor film 108 (see FIG. 24A).

Figure 24B:
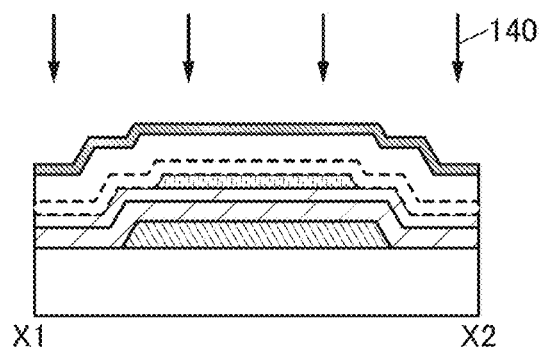
Figure 24C:
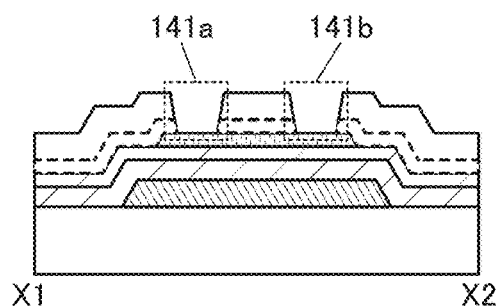
Figure 24D:
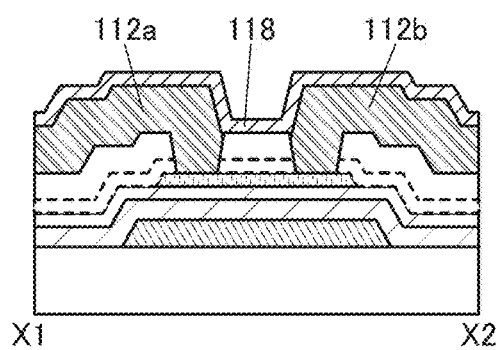

Next, oxygen 140 is added to the insulating films 114 and 116 and the oxide semiconductor film 108 through the protective film 130 (see FIG. 24B).

Next, the protective film 130 is removed. After that, a mask is formed over the insulating film 116 through a lithography process, and the openings 141a and 141b are formed in desired regions in the insulating films 114 and 116. Note that the openings 141a and 141b reach the oxide semiconductor film 108 (see FIG. 24C).

Next, a conductive film is deposited over the oxide semiconductor film 108 and the insulating film 116 to cover the openings 141a and 141b, a mask is formed over the conductive film through a lithography process, and the conductive film is processed into desired regions, whereby the conductive films 112a and 112b are formed. After that, the insulating film 118 is formed over the insulating film 116 and the conductive films 112a and 112b (see FIG. 24D).

Through the above process, the transistor 150 can be manufactured.

Note that the transistor 160 can be manufactured in such a manner that the insulating films 114 and 116 are left over a channel region of the oxide semiconductor film 108 at the formation of the openings 141a and 141b.

<Method 3 for Manufacturing Semiconductor Device>

Next, a method for manufacturing the transistor 170 will be described with reference to FIGS. 25A to 25D. FIGS. 25A to 25D are cross-sectional views illustrating a method for manufacturing a semiconductor device.

Figure 25A:
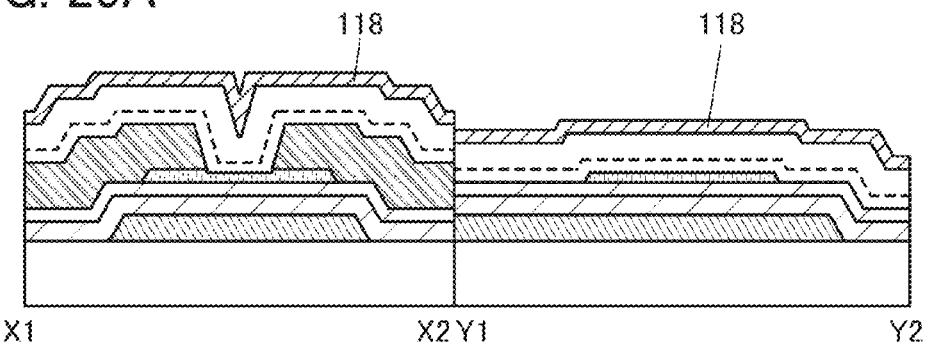
FIGS. 25A to 25D are cross-sectional views illustrating an example of a manufacturing process of a semiconductor device.
Figure 25B:
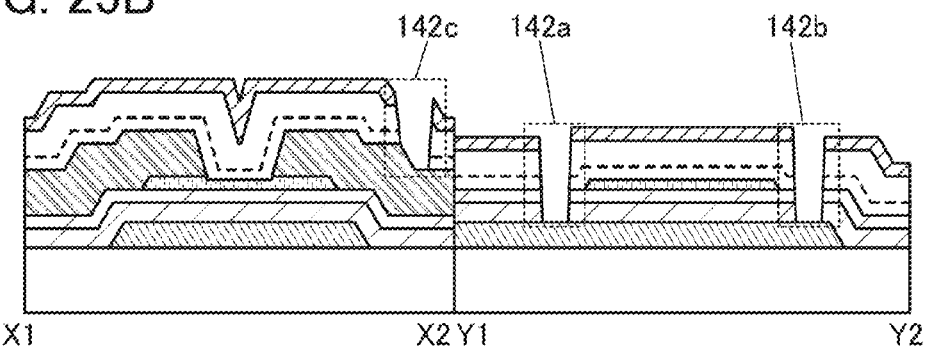

First, the steps up to the step in FIG. 23D are performed (see FIG. 25A).

Next, a mask is formed over the insulating film 118 through a lithography process, and the opening 142c is formed in a desired region in the insulating films 114, 116, and 118. In addition, a mask is formed over the insulating film 118 through a lithography process, and the openings 142a and 142b are formed in desired regions in the insulating films 106, 107, 114, 116, and 118. Note that the opening 142c reaches the conductive film 112b. The openings 142a and 142b reach the conductive film 104 (see FIG. 25B).

Note that the openings 142a and 142b and the opening 142c may be formed at a time or may be formed by different steps. In the case where the openings 142a and 142b and the opening 142c are formed at a time, for example, a gray-tone mask or a half-tone mask can be used.

Figure 25C:
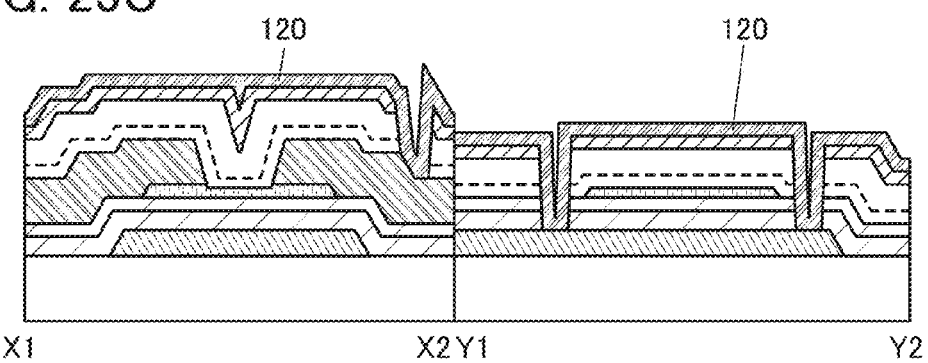

Next, a conductive film 120 is formed over the insulating film 118 to cover the openings 142a, 142b, and 142c (see FIG. 25C).

For the conductive film 120, for example, a material including one of indium (In), zinc (Zn), and tin (Sn) can be used. Particularly for the conductive film 120, a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide containing silicon oxide can be used. Moreover, the conductive film 120 is favorably formed using the same kind of material as the protective film 130 which can inhibit release of oxygen, in which case the manufacturing cost can be reduced.

The conductive film 120 can be formed by a sputtering method, for example. In this embodiment, a 110-nm-thick ITSO film is formed by a sputtering method.

Figure 25D:
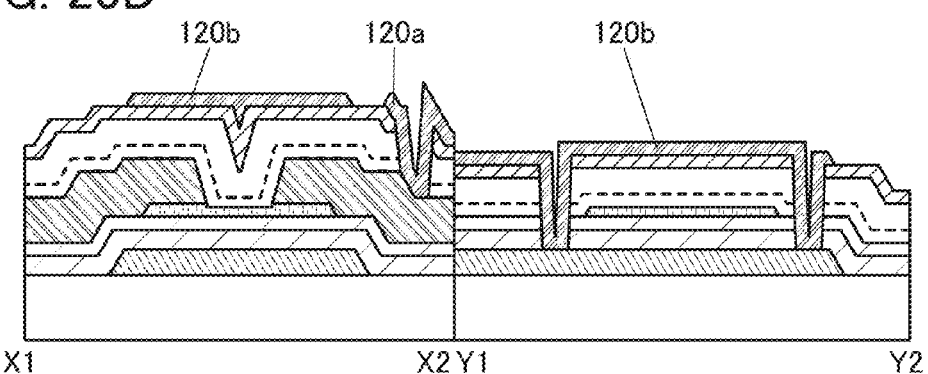

Next, a mask is formed over the conductive film 120 through a lithography process, and the conductive film 120 is processed into desired regions to form the conductive films 120a and 120b (see FIG. 25D).

Through the above process, the transistor 170 can be manufactured.

The structure and method described in this embodiment can be combined as appropriate with any of the other structures and methods described in the other embodiments.

Embodiment 4

In this embodiment, an oxide semiconductor included in a semiconductor device of one embodiment of the present invention will be described in detail below.

<Structure of Oxide Semiconductor>

First, a structure of an oxide semiconductor is described.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 28A:
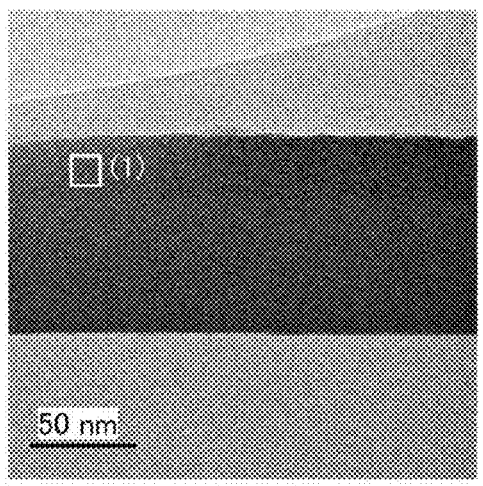
FIGS. 28A to 28D are Cs-corrected high-resolution TEM images of a cross section of a CAAC-OS and a cross-sectional schematic view of the CAAC-OS.

The CAAC-OS observed with a TEM is described below. FIG. 28A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 28B:
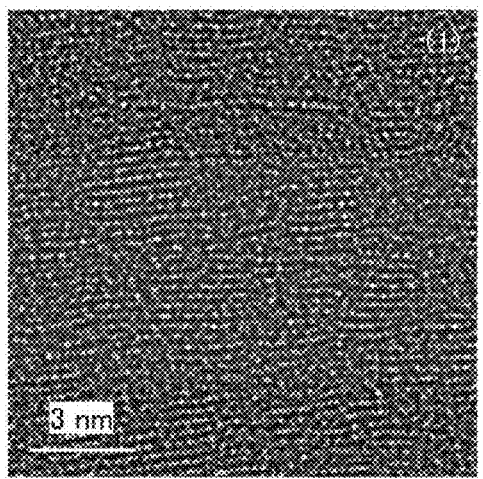

FIG. 28B is an enlarged Cs-corrected high-resolution TEM image of a region (1) in FIG. 28A. FIG. 28B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 28C:
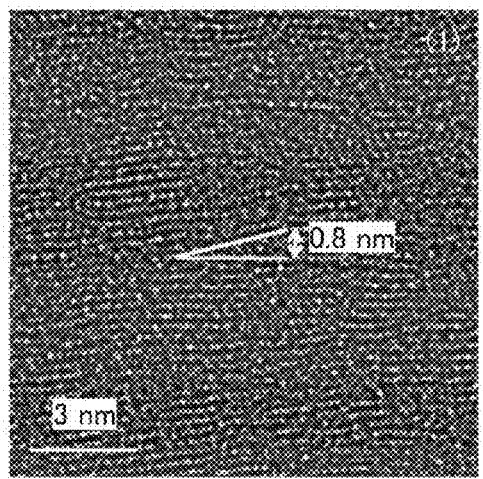

As shown in FIG. 28B, the CAAC-OS has a characteristic atomic arrangement. The characteristic atomic arrangement is denoted by an auxiliary line in FIG. 28C. FIGS. 28B and 28C prove that the size of a pellet is 1 nm or more, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 28D:
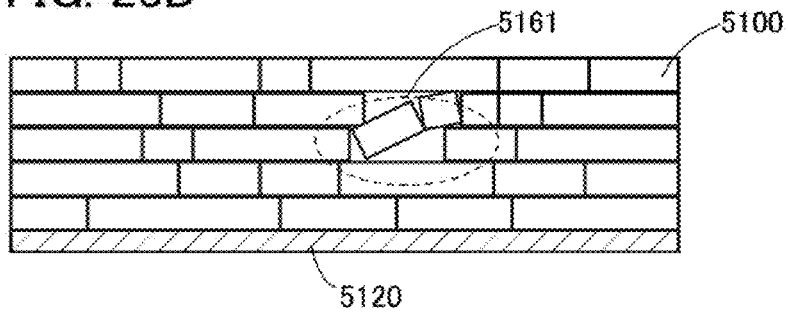

Here, according to the Cs-corrected high-resolution TEM images, the schematic arrangement of pellets 5100 of a CAAC-OS over a substrate 5120 is illustrated by such a structure in which bricks or blocks are stacked (see FIG. 28D). The part in which the pellets are tilted as observed in FIG. 28C corresponds to a region 5161 shown in FIG. 28D.

FIG. 29A shows a Cs-corrected high-resolution TEM image of a plane of the CAAC-OS observed from a direction substantially perpendicular to the sample surface. FIGS. 29B, 29C, and 29D are enlarged Cs-corrected high-resolution TEM images of regions (1), (2), and (3) in FIG. 29A, respectively. FIGS. 29B, 29C, and 29D indicate that metal atoms are arranged in a triangular, quadrangular, or hexagonal configuration in a pellet. However, there is no regularity of arrangement of metal atoms between different pellets.

Figure 30A:
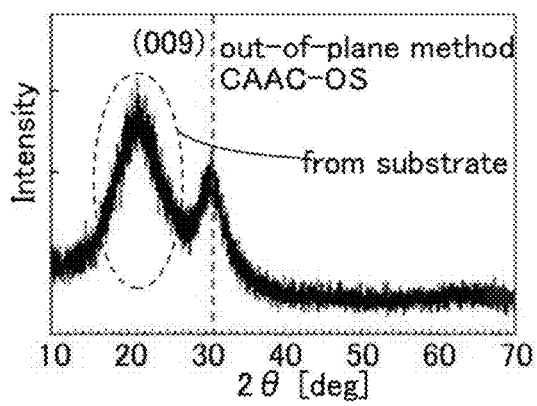
FIGS. 30A to 30C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 30A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 30B:
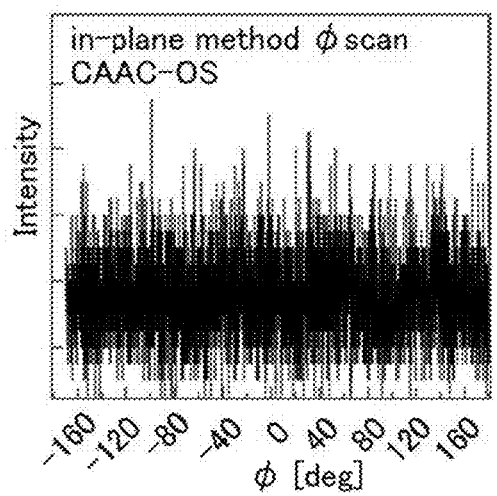
Figure 30C:
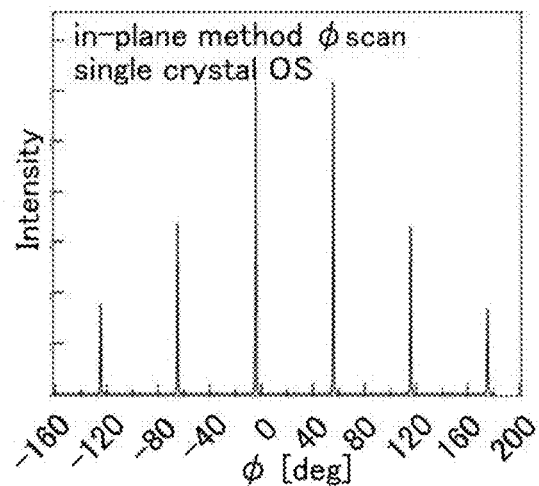

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 30B, a peak is not clearly observed. In contrast, in the case of a single crystal oxide semiconductor of InGaZnO$_4$, when φ scan is performed with 2θ fixed at around 56°, as shown in FIG. 30C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 31A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 31B shows a diffraction pattern obtained in such a manner that an electron beam with a probe diameter of 300 nm is incident on the same sample in a direction perpendicular to the sample surface. As shown in FIG. 31B, a ring-like diffraction pattern is observed. Thus, the electron diffraction also indicates that the a-axes and b-axes of the pellets included in the CAAC-OS do not have regular alignment. The first ring in FIG. 31B is considered to be derived from the (010) plane, the (100) plane, and the like of the InGaZnO$_4$ crystal. The second ring in FIG. 31B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancy).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancy in the oxide semiconductor serve as carrier traps or serve as carrier generation sources when hydrogen is captured therein.

The CAAC-OS having small amounts of impurity and oxygen vacancy is an oxide semiconductor with low carrier density (specifically, lower than $8\times10^{11}/cm^3$, preferably lower than $1\times10^{11}/cm^3$, and further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS film is greater than or equal to 1 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

Thus, the nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

In a high-resolution TEM image of the a-like OS film, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 32:
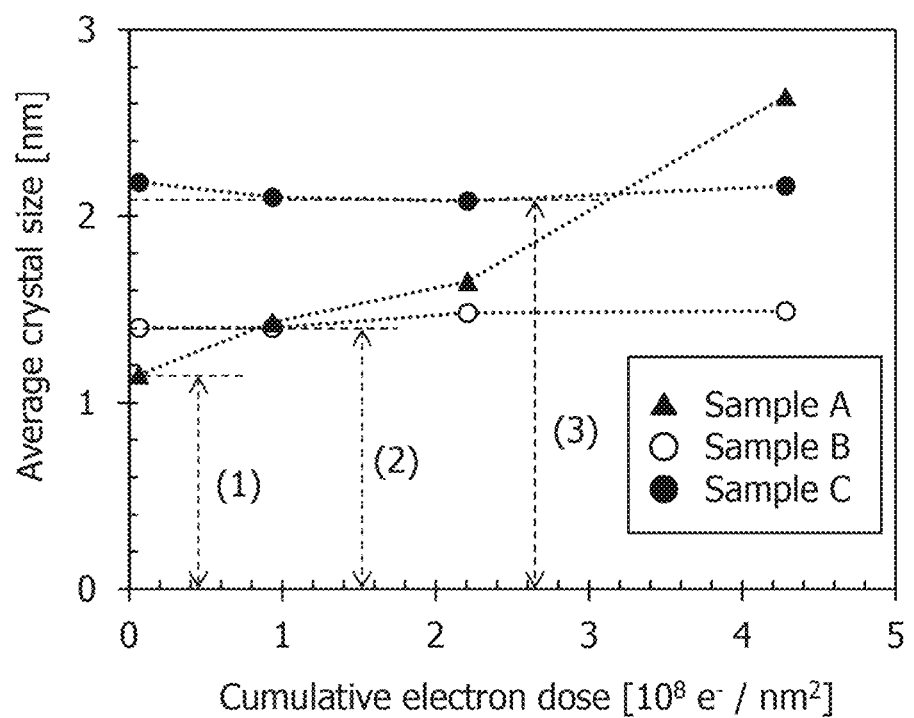
FIG. 32 shows a change of crystal parts of an In—Ga—Zn oxide owing to electron irradiation.

FIG. 32 shows change in the average size of crystal parts (at 22 points to 45 points) in each sample. Note that the crystal part size corresponds to the length of a lattice fringe. FIG. 32 indicates that the crystal part size in the a-like OS increases with an increase in the cumulative electron dose. Specifically, as shown by (1) in FIG. 32, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. Specifically, as shown by (2) and (3) in FIG. 32, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<Formation Method of CAAC-OS and Nc-OS>

Next, an example of a method for forming a CAAC-OS film will be described below.

Figure 33A:
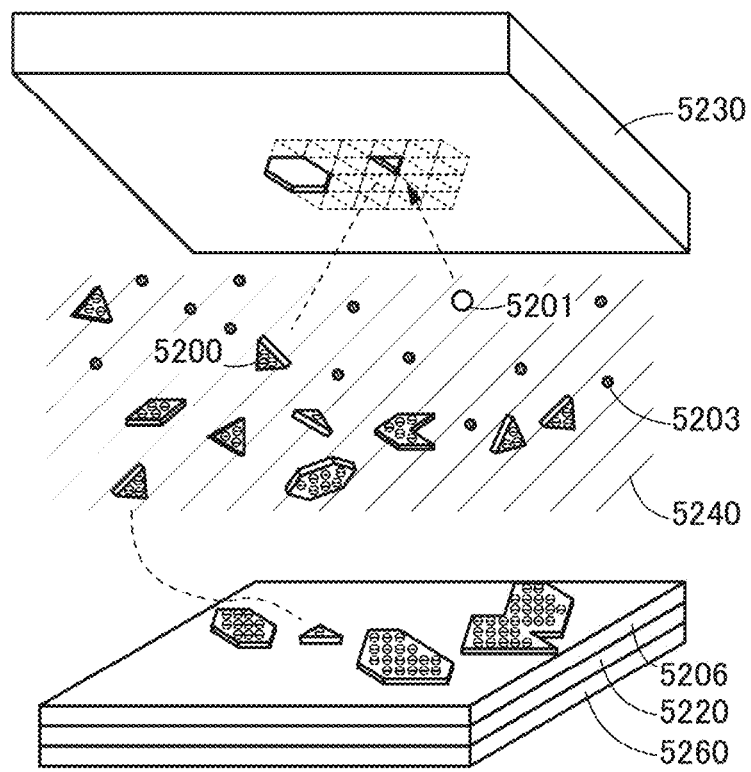
FIGS. 33A to 33C illustrate a deposition method of a CAAC-OS.

FIG. 33A is a schematic view of the inside of a film formation chamber. The CAAC-OS film can be formed by a sputtering method.

As shown in FIG. 33A, a substrate 5220 and a target 5230 are arranged to face each other. Plasma 5240 is generated between the substrate 5220 and the target 5230. A heating mechanism 5260 is under the substrate 5220. The target 5230 is attached to a backing plate (not illustrated in the drawing). A plurality of magnets are arranged to face the target 5230 with the backing plate provided therebetween. A sputtering method in which the disposition speed is increased by utilizing a magnetic field of magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 5230, and the plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation (O$^+$) and an argon cation (Ar$^+$).

Figure 34:
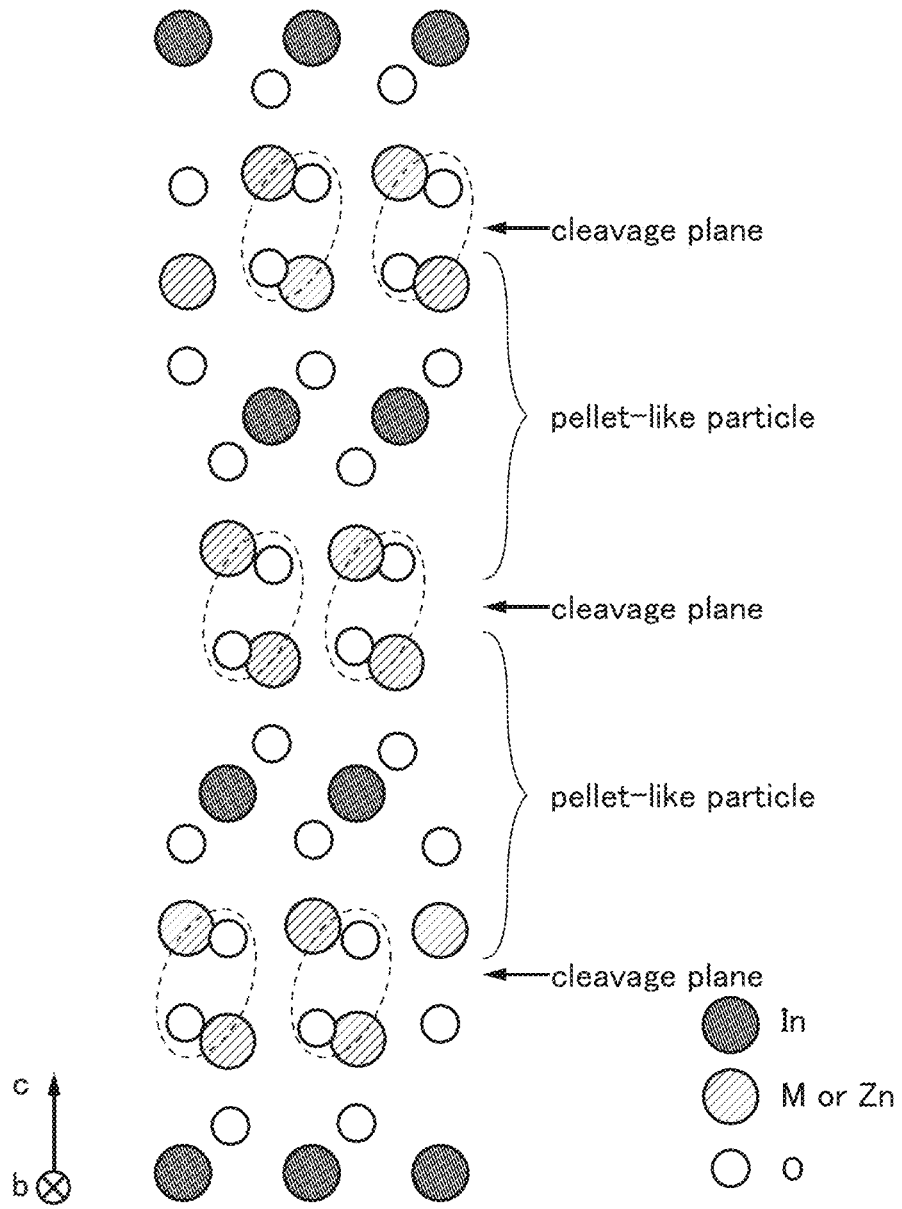
FIG. 34 illustrates a crystal structure of $InMZnO_4$.

The target 5230 has a polycrystalline structure which includes a plurality of crystal grains and in which a cleavage plane exists in any of the crystal grains. FIG. 34 shows a crystal structure of InMZnO$_4$ (the element M is Ga or Sn, for example) included in the target 5230 as an example. Note that the crystal structure shown in FIG. 34 is InMZnO$_4$ observed from a direction parallel to a b-axis. In the crystal of InMZnO$_4$, oxygen atoms are negatively charged, whereby repulsive force is generated between the two adjacent M-Zn—O layers. Thus, the InMZnO$_4$ crystal has a cleavage plane between the two adjacent M-Zn—O layers.

The ion 5201 generated in the high-density plasma region is accelerated to move toward the target 5230 side by an electric field, and then collides with the target 5230. At this time, the pellet 5200 which is a flat-plate-like or pellet-like sputtered particle is separated from the cleavage plane (see FIG. 33A).

Figure 33B:
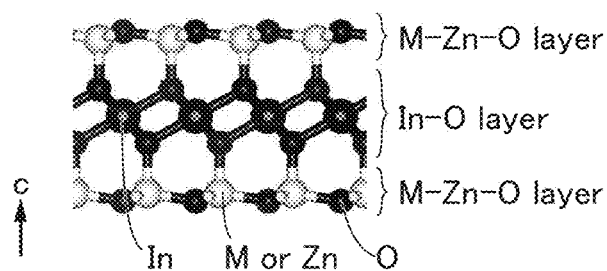
Figure 33C:
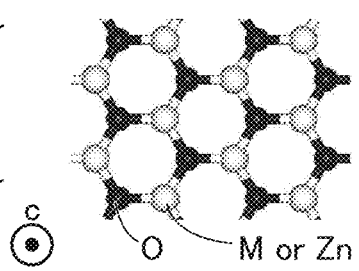

The pellet 5200 corresponds to a portion between the two cleavage planes shown in FIG. 34. Thus, when the pellet 5200 is observed, the cross-section thereof is as shown in FIG. 33B, and the top surface thereof is as shown in FIG. 33C. Note that structure of the pellet 5200 may be distorted by an impact of collision of the ion 5201. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 is a flat-plate-like (pellet-like) sputtered particle having a triangle plane, for example, regular triangle plane. Alternatively, the pellet 5200 is a flat-plate-like (pellet-like) sputtered particle having a hexagon plane, for example, regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of deposition gas and the like. For example, the thickness of the pellet 5200 is greater than or equal to 0.4 nm and less than or equal to 1 nm, preferably greater than or equal to 0.6 nm and less than or equal to 0.8 nm. In addition, the width of the pellet 5200 is, for example, greater than or equal to 1 nm. For example, the ion 5201 collides with the target 5230 including the In-M-Zn oxide. Then, the pellet 5200 including three layers of an M-Zn—O layer, an In—O layer, and an M-Zn—O layer is separated. Note that along with the separation of the pellet 5200, a particle 5203 is also sputtered from the target 5230.

The pellet 5200 may receive a charge when passing through the plasma 5240, so that surfaces thereof are negatively or positively charged. For example, the pellet 5200 receives a negative charge from O$^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach the surface of the substrate 5220. Note that part of the particle 5203 is sometimes discharged to the outside by a vacuum pump or the like because the particle 5203 is small in mass.

Next, deposition of the pellet 5200 and the particle 5203 over the surface of the substrate 5220 is described with reference to FIGS. 35A to 35E.

First, a first of the pellets 5200 is deposited over the substrate 5220. Since the pellet 5200 has a flat-plate-like shape, it is deposited so that the flat plane faces the surface of the substrate 5220 (see FIG. 35A). Here, a charge on a surface of the pellet 5200 on the substrate 5220 side is lost through the substrate 5220.

Next, a second of the pellets 5200 reaches the substrate 5220. Here, since the surface of the first of the pellets 5200 and the surface of the second of the pellets 5200 are charged, they repel each other (see FIG. 35B).

Figure 35A:
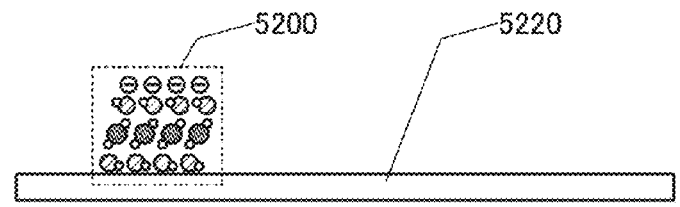
FIGS. 35A to 35E illustrate a deposition method of a CAAC-OS.
Figure 35B:
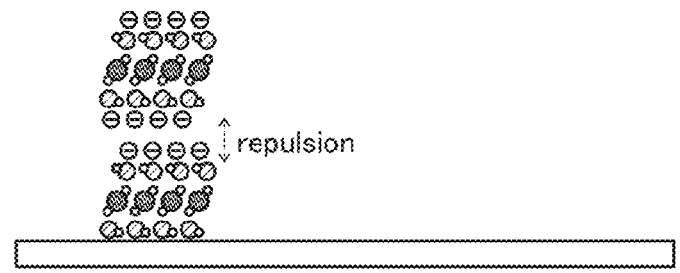
Figure 35C:
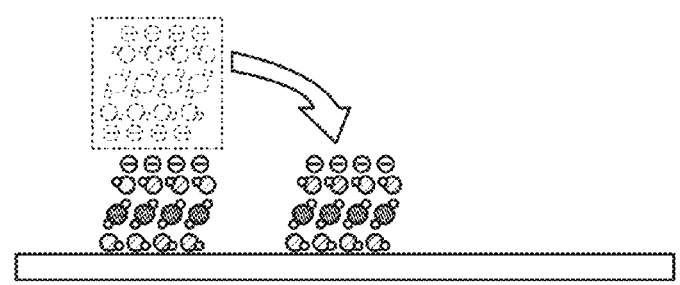

As a result, the second of the pellets 5200 avoids being deposited over the first of the pellets 5200, and is deposited over the surface of the substrate 5220 so as to be a little distance away from the first of the pellets 5200 (see FIG. 35C). With repetition of this, millions of pellets 5200 are deposited over the surface of the substrate 5220 to have a thickness of one layer. A region where any pellet 5200 is not deposited is generated between adjacent pellets 5200.

Figure 35D:
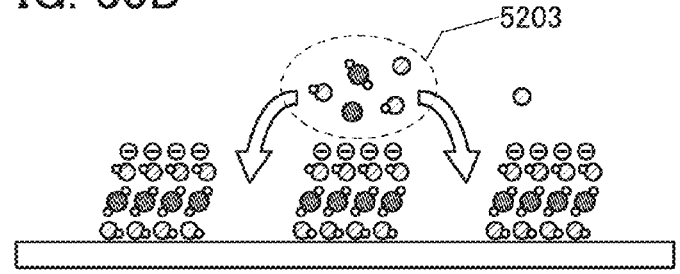

Next, the particle 5203 reaches the surface of the substrate 5220 (see FIG. 35D).

The particle 5203 cannot be deposited over an active region such as the surface of the pellet 5200. Therefore, the particle 5203 is deposited so as to fill a region where the pellets 5200 are not deposited. The particles 5203 grow in the horizontal (lateral) direction between the pellets 5200, thereby connecting the pellets 5200. In this way, the particles 5203 are deposited until they fill regions where the pellets 5200 are not deposited. This mechanism is similar to a deposition mechanism of an atomic layer deposition (ALD) method.

Figure 35E:
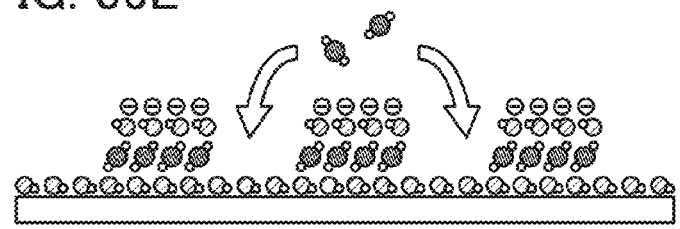

Note that there can be several mechanisms for the lateral growth of the particles 5203 between the pellets 5200. For example, as shown in FIG. 35E, the pellets 5200 can be connected from side surfaces of the first M-Zn—O layers. In this case, after the first M-Zn—O layers make connection, the In—O layers and the second M-Zn—O layers are connected in this order (the first mechanism).

Figure 36A:
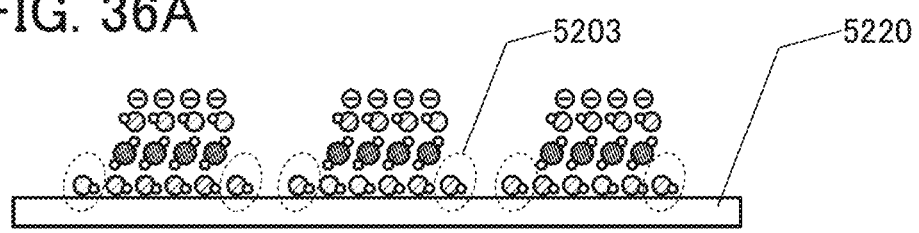
FIGS. 36A to 36C illustrate a deposition method of a CAAC-OS.
Figure 36B:
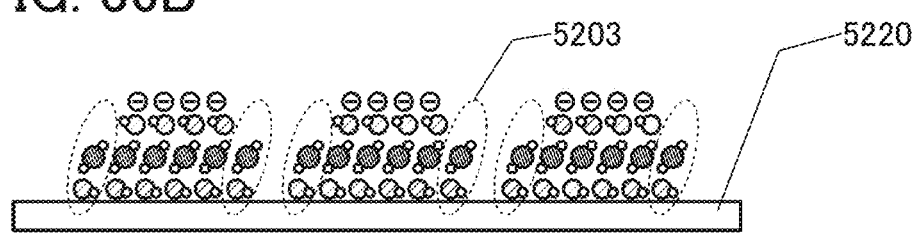

Alternatively, as shown in FIG. 36A, first, the particles 5203 are connected to the sides of the first M-Zn—O layers so that each side of the first M-Zn—O layer has one particle 5203. Then, as shown in FIG. 36B, the particle 5203 is connected to each side of the In—O layers. After that, as shown in FIG. 36C, the particle 5203 is connected to each side of the second M-Zn—O layers (the second mechanism).

Figure 36C:
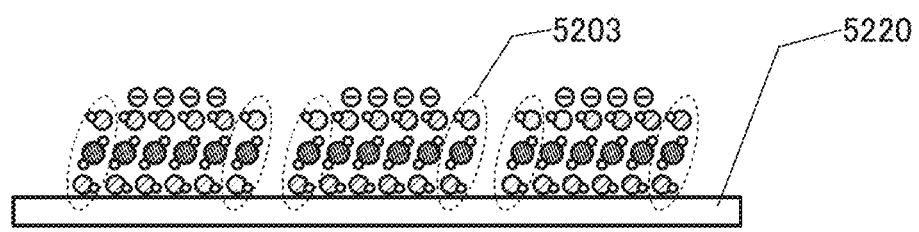

Note that the connection can also be made by the simultaneous occurrence of the deposition in FIGS. 36A, 36B, and 36C (the third mechanism).

As shown in the above, the above three mechanisms are considered as the mechanisms of the lateral growth of the particles 5203 between the pellets 5200. However, the particles 5203 may grow up laterally between the pellets 5200 by other mechanisms.

Therefore, even when the orientations of a plurality of pellets 5200 are different from each other, generation of crystal boundaries can be suppressed since the particles 5203 laterally grow to fill gaps between the plurality of pellets 5200. In addition, as the particles 5203 make smooth connection between the plurality of pellets 5200, a crystal structure different from a single crystal and a polycrystal is formed. In other words, a crystal structure including distortion between minute crystal regions (pellets 5200) is formed. The regions filling the gaps between the crystal regions are distorted crystal regions, and thus, it will be not appropriate to say that the regions have an amorphous structure.

After the gaps between the pellets 5200 are filled with the particles 5203, a first layer with a thickness approximately the same as that of the pellet 5200 is formed. Then, a new first of the pellets 5200 is deposited over the first layer, and a second layer is formed. With repetition of this cycle, the stacked-layer thin film structure is formed.

A deposition way of the pellets 5200 changes depending on the surface temperature of the substrate 5220 or the like. For example, if the surface temperature of the substrate 5220 is high, migration of the pellets 5200 occurs over the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to 100° C. and lower than 500° C., preferably higher than or equal to 140° C. and lower than 450° C. and further preferably higher than or equal to 170° C. and lower than 400° C. Therefore, even when a large-sized substrate of the 8th generation or more is used as the substrate 5220, a warp or the like hardly occurs.

Figure 37:
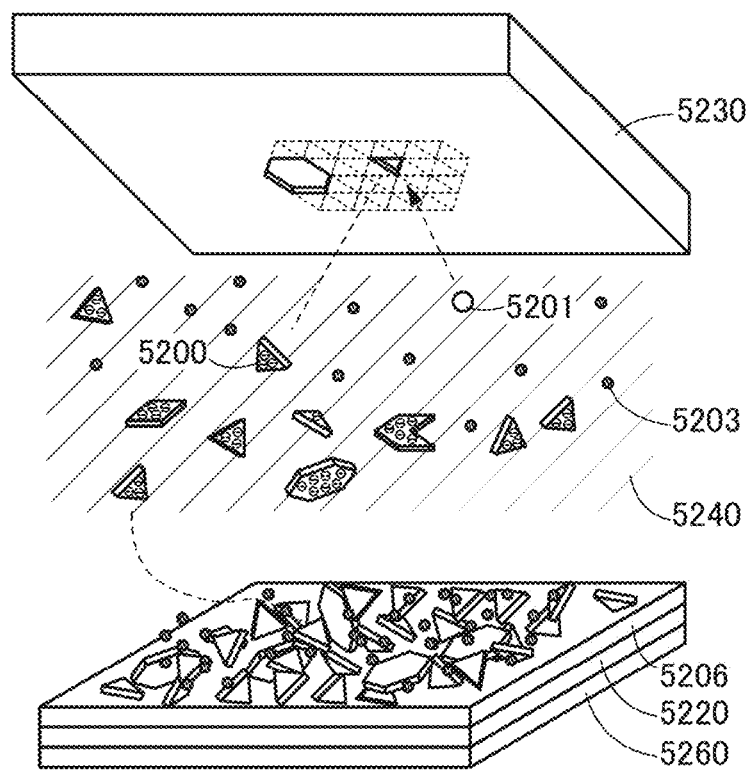
FIG. 37 illustrates a deposition method of an nc-OS.

On the other hand, if the surface temperature of the substrate 5220 is low, the migration of the pellets 5200 over the substrate 5220 does not easily occur. As a result, the pellets 5200 overlap with each other, whereby an nc-OS with low orientation or the like is made (see FIG. 37). In the nc-OS, the pellets 5200 are possibly deposited with certain gaps because the pellets 5200 are negatively charged. Therefore, the nc-OS film has low orientation but some regularity, and thus it has a denser structure than an amorphous oxide semiconductor.

When gaps between the pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

According to such a model, the pellets 5200 are considered to be deposited on the surface of the substrate 5220. Thus, a CAAC-OS can be deposited even when a formation surface does not have a crystal structure; therefore, a growth mechanism in this case is different from epitaxial growth. In addition, a uniform film of a CAAC-OS or an nc-OS can be formed even over a large-sized glass substrate or the like. For example, even when the surface of the substrate 5220 (formation surface) has an amorphous structure (e.g., amorphous silicon oxide), a CAAC-OS can be formed.

Furthermore, it is found that the pellets 5200 are arranged in accordance with a surface shape of the substrate 5220 that is the film formation surface even when the film formation surface has unevenness.

The structure and method described in this embodiment can be combined as appropriate with any of the other structures and methods described in the other embodiments.

Embodiment 5

In this embodiment, a display device including a semiconductor device of one embodiment of the present invention and an electronic device in which the display device is provided with an input device will be described with reference to FIGS. 38A and 38B, FIGS. 39A and 39B, FIGS. 40A and 40B, FIGS. 41A and 41B, and FIG. 42.

<Touch Panel>

In this embodiment, a touch panel 2000 including a display device and an input device will be described as an example of an electronic device. In addition, an example in which a touch sensor is used as an input device will be described.

Figure 38A:
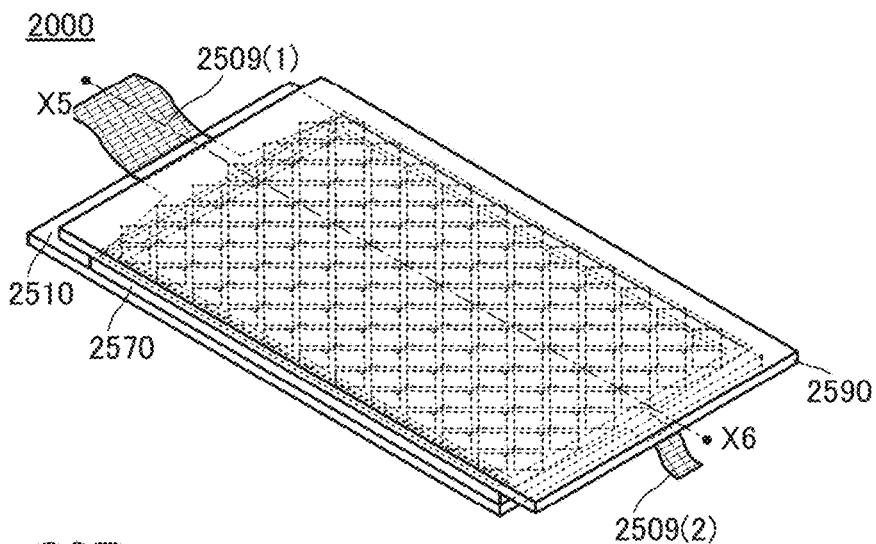
FIGS. 38A and 38B are perspective views illustrating an example of a touch panel.
Figure 38B:
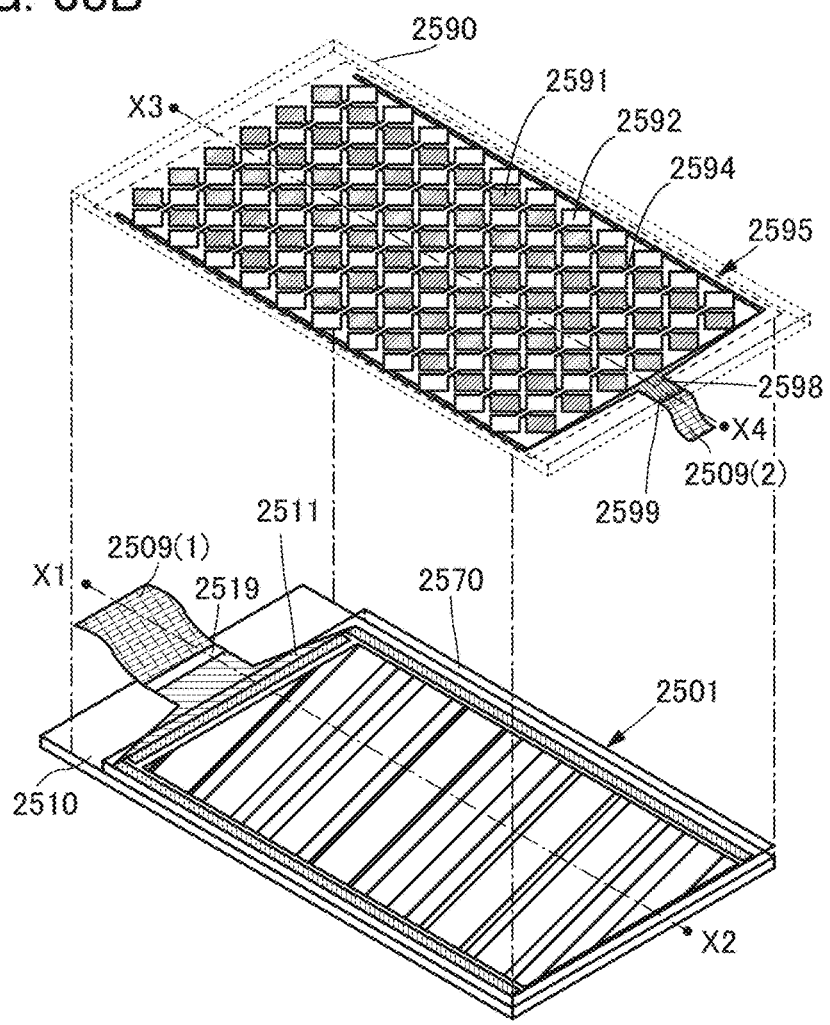

FIGS. 38A and 38B are perspective views of the touch panel 2000. Note that FIGS. 38A and 38B illustrate only main components of the touch panel 2000 for simplicity.

The touch panel 2000 includes a display device 2501 and a touch sensor 2595 (see FIG. 38B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 38B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 38B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 38A and 38B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films used for the electrodes 2591, the electrodes 2592, and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (e.g., a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 $\Omega/cm^2$ or more and 100 $\Omega/cm^2$ or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<Display Device>

Figure 39A:
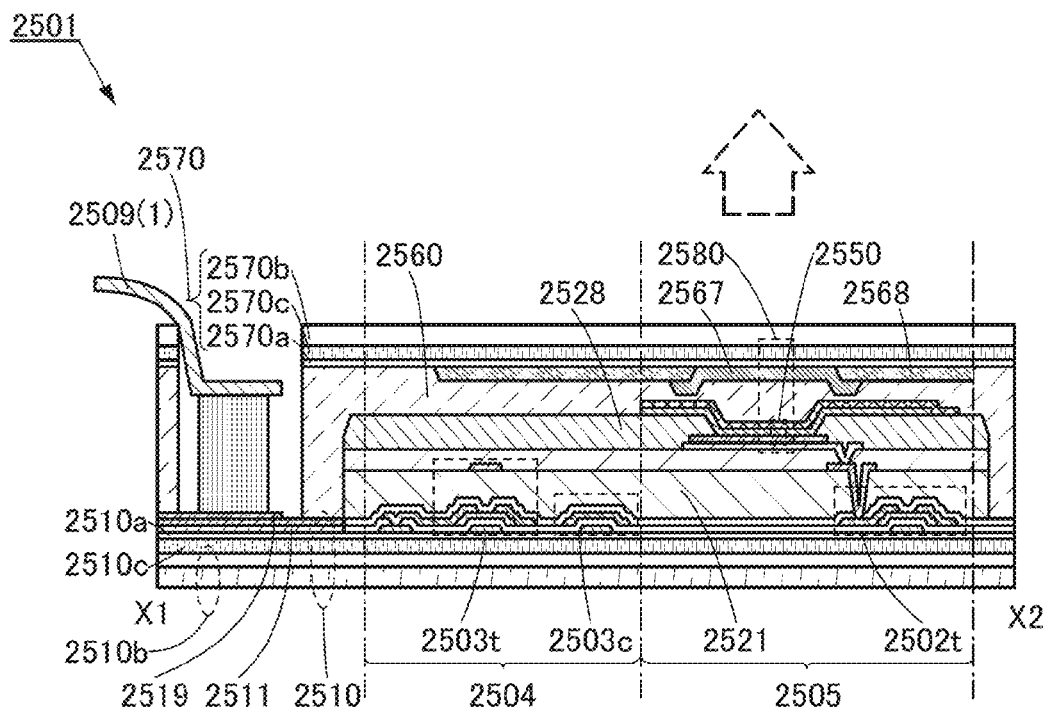
FIGS. 39A and 39B are cross-sectional views illustrating examples of a display device and a touch sensor.

Next, the display device 2501 will be described in detail with reference to FIG. 39A. FIG. 39A corresponds to a cross-sectional view taken along the dashed-dotted line X1-X2 in FIG. 38B.

The display device 2501 includes a plurality of pixels arranged in a matrix. Each of the pixels includes a display element and a pixel circuit for driving the display element.

(Structure with EL Element as Display Element)

A structure that uses an EL element as a display element will be described below with reference to FIG. 39A. In the following description, an example of using an EL element that emits white light will be described; however, the EL element is not limited to this element. For example, EL elements that emit light of different colors may be included so that the light of different colors can be emitted from adjacent pixels.

For the substrate 2510 and the substrate 2570, for example, a flexible material with a vapor permeability of lower than or equal to $10^{-5}$ g/(m²·day), preferably lower than or equal to $10^{-6}$ g/(m²·day), can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, polyurethane, an acrylic resin, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 39A, the sealing layer 2560 can also serve as an optical element.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which does not transmit moisture or oxygen is preferably used.

The display device 2501 illustrated in FIG. 39A includes a pixel 2505. The pixel 2505 includes a light-emitting module 2580, the EL element 2550, and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 39A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502t or the like from being lowered by impurity diffusion.

The EL element 2550 is formed over the insulating layer 2521. A partition wall 2528 is provided so as to overlap with an end portion of the lower electrode of the EL element 2550. Note that a spacer for controlling the distance between the substrate 2510 and the substrate 2570 may be formed over the partition wall 2528.

A scan line driver circuit 2504 includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502t and 2503t. The transistors used in this embodiment each include an oxide semiconductor film which is highly purified and in which formation of oxygen vacancy is inhibited. In the transistors, the current in an off state (off-state current) can be made small. Accordingly, an electrical signal such as an image signal can be held for a longer period, and a writing interval can be set longer in an on state. Thus, the frequency of refresh operation can be reduced, which leads to an effect of reducing power consumption. In addition, the transistors used in this embodiment can have relatively high field-effect mobility and thus are capable of high speed operation. For example, with such transistors which can operate at high speed used for the display device 2501, a switching transistor of a pixel circuit and a driver transistor in a driver circuit can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

<Touch Sensor>

Figure 39B:
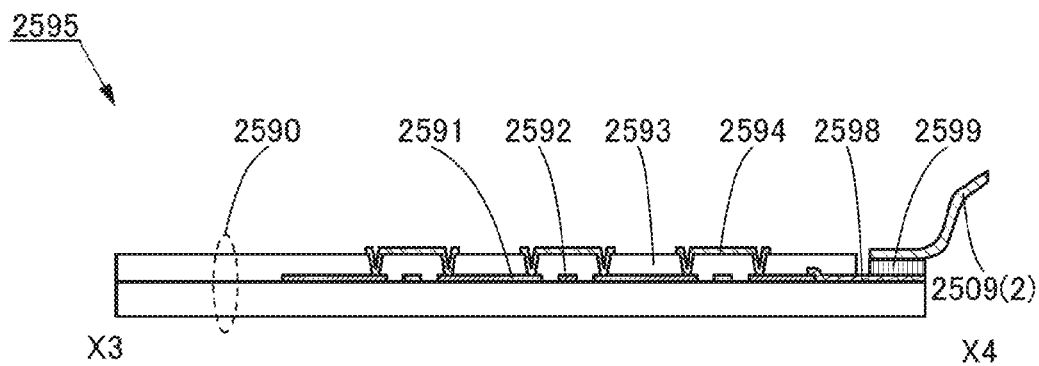

Next, the touch sensor 2595 will be described in detail with reference to FIG. 39B. FIG. 39B corresponds to a cross-sectional view taken along the dashed-dotted line X3-X4 in FIG. 38B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Touch Panel>

Figure 40A:
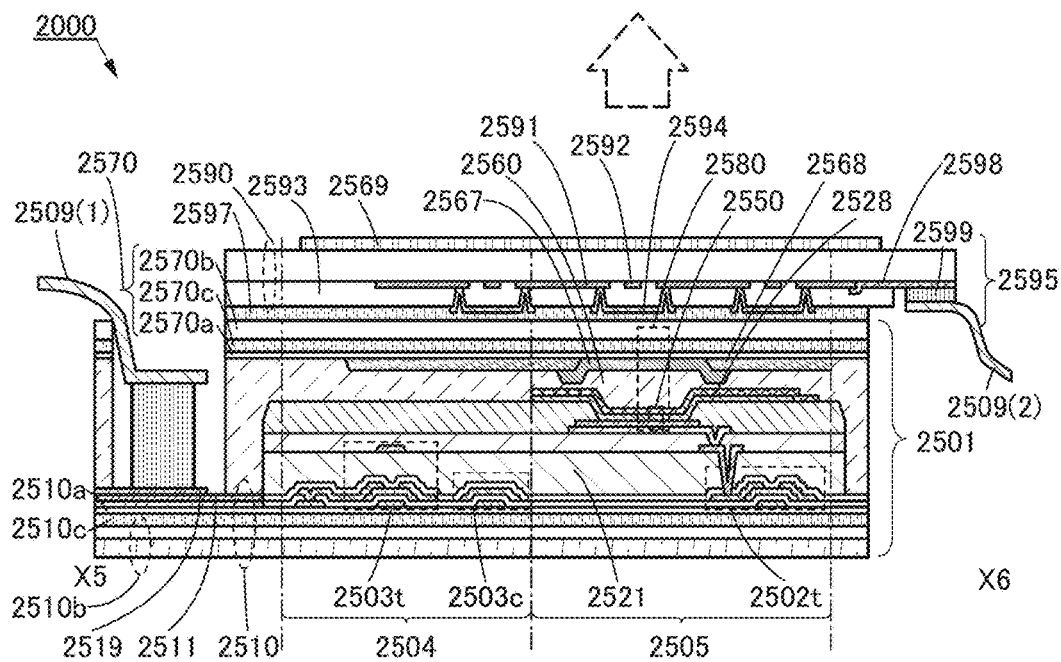
FIGS. 40A and 40B are cross-sectional views illustrating examples of a touch panel.

Next, the touch panel 2000 will be described in detail with reference to FIG. 40A. FIG. 40A corresponds to a cross-sectional view taken along the dashed-dotted line X5-X6 in FIG. 38A.

In the touch panel 2000 illustrated in FIG. 40A, the display device 2501 described with reference to FIG. 39A and the touch sensor 2595 described with reference to FIG. 39B are attached to each other.

The touch panel 2000 illustrated in FIG. 40A includes an adhesive layer 2597 and an anti-reflective layer 2569 in addition to the components described with reference to FIG. 39A.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 40A will be described with reference to FIG. 40B.

Figure 40B:
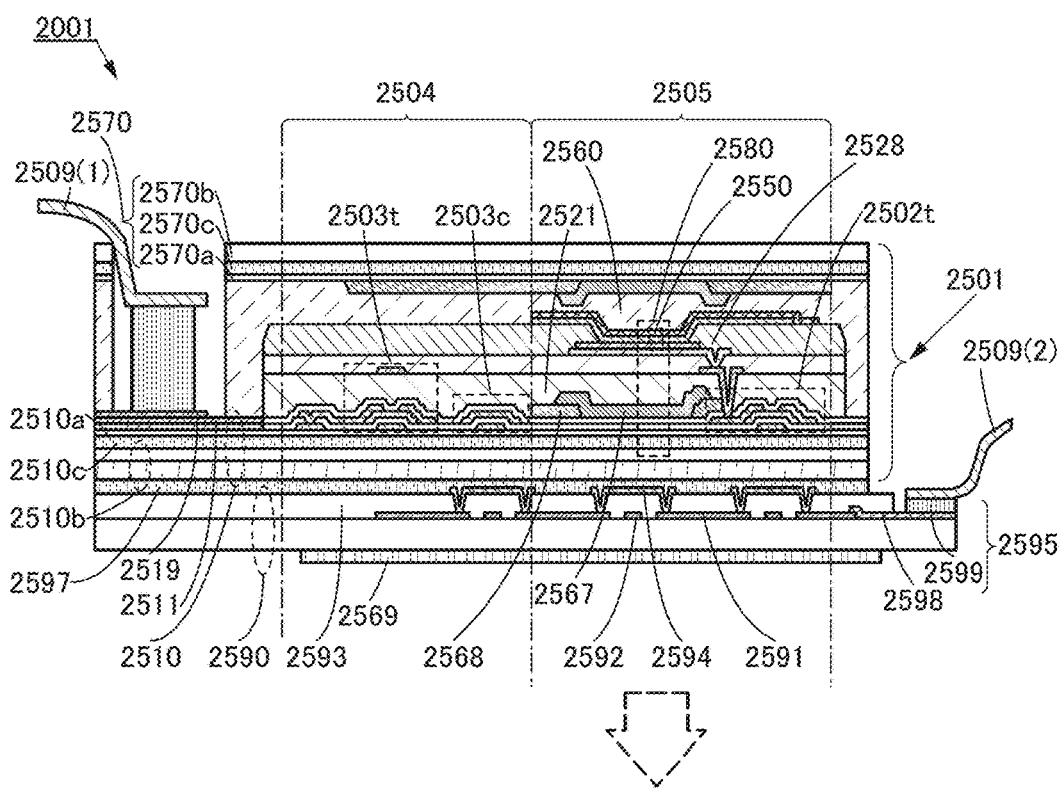

FIG. 40B is a cross-sectional view of a touch panel 2001. The touch panel 2001 illustrated in FIG. 40B differs from the touch panel 2000 illustrated in FIG. 40A in the position of the touch sensor 2595 relative to the display device 2501. Different parts are described in detail below, and the above description of the touch panel 2000 is referred to for the other similar parts.

The coloring layer 2567 is positioned under the EL element 2550. The EL element 2550 illustrated in FIG. 40B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 40B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 40A or FIG. 40B, light may be emitted from the light-emitting element to one or both of upper and lower sides of the substrate.

<Driving Method of Touch Panel>

Next, an example of a method for driving a touch panel will be described with reference to FIGS. 41A and 41B.

Figure 41A:
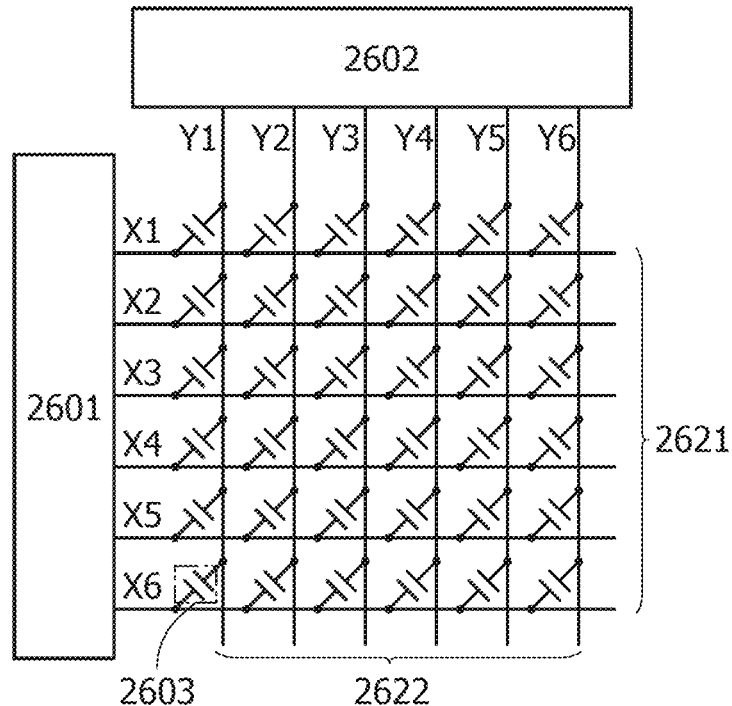
FIGS. 41A and 41B are a block diagram and a timing chart of a touch sensor.

FIG. 41A is a block diagram illustrating the structure of a mutual capacitive touch sensor. FIG. 41A illustrates a pulse voltage output circuit 2601 and a current sensing circuit 2602. Note that in FIG. 41A, six wirings X1 to X6 represent the electrodes 2621 to which a pulse voltage is applied, and six wirings Y1 to Y6 represent the electrodes 2622 that detect changes in current. FIG. 41A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 41B:
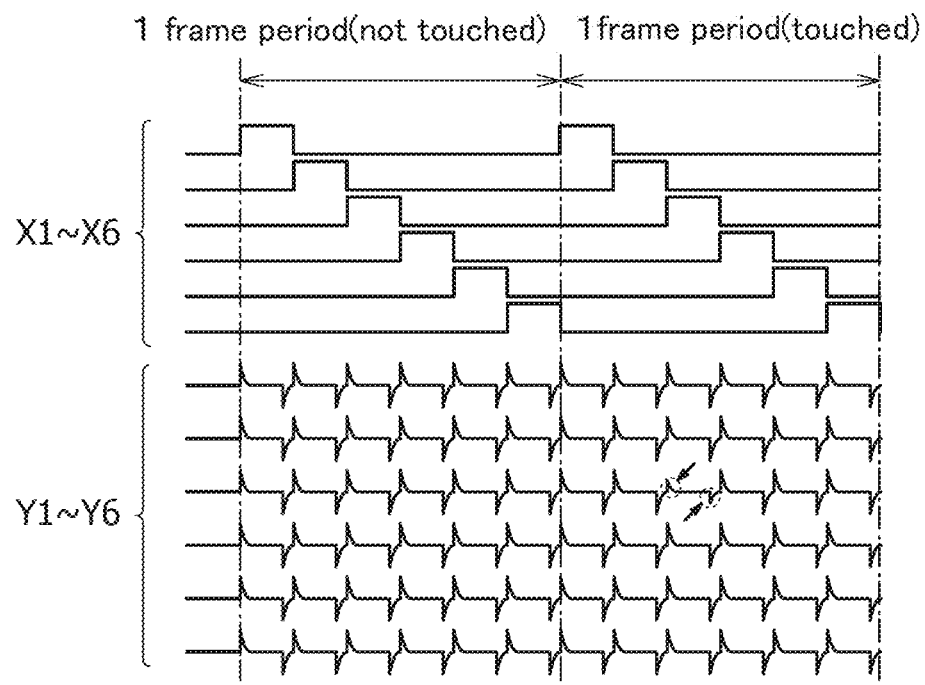

FIG. 41B is a timing chart showing input and output waveforms in the mutual capacitive touch sensor illustrated in FIG. 41A. In FIG. 41B, sensing of a sensing target is performed in all the rows and columns in one frame period. FIG. 41B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage level changes.

By detecting a change in mutual capacitance in this manner, the approach or contact of a sensing target can be sensed.

<Sensor Circuit>

Figure 42:
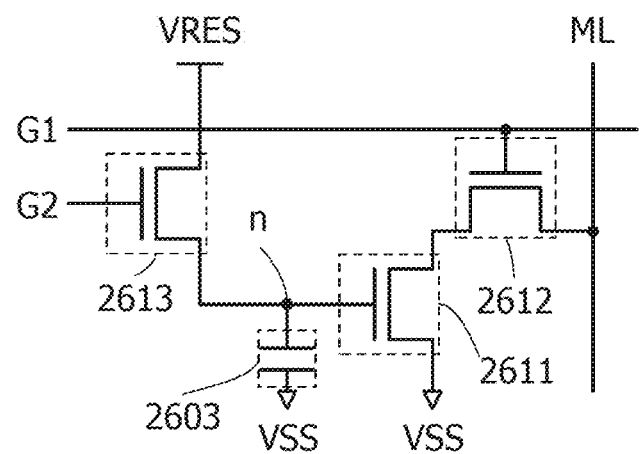
FIG. 42 is a circuit diagram of a touch sensor.

Although FIG. 41A illustrates a passive matrix type touch sensor in which only the capacitor 2603 is provided at the intersection of wirings as a touch sensor, an active matrix type touch sensor including a transistor and a capacitor may be used. FIG. 42 illustrates an example of a sensor circuit included in an active matrix type touch sensor.

The sensor circuit in FIG. 42 includes the capacitor 2603 and transistors 2611, 2612, and 2613.

A signal G2 is applied to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage $V_{ss}$ is applied to the other of the source and the drain of the transistor 2611. A signal G1 is applied to a gate of the transistor 2612, and a wiring ML is electrically connected to the other of the source and the drain of the transistor 2612. The voltage $V_{ss}$ is applied to the other electrode of the capacitor 2603.

Next, the operation of the sensor circuit in FIG. 42 will be described. First, a potential for turning on the transistor 2613 is supplied to the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied to the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, any of the transistors described in the above embodiments can be used. In particular, it is preferable to use any of the transistors described in the above embodiments as the transistor 2613 because the potential of the node n can be held for a long time and the frequency of operation of resupplying VRES to the node n (refresh operation) can be reduced.

The structure described in this embodiment can be combined as appropriate with any of the structures described in the other embodiments.

Embodiment 6

In this embodiment, a display module, electronic devices, and a display device which include a semiconductor device of one embodiment of the present invention will be described with reference to FIG. 43, FIGS. 44A to 44G, and FIGS. 45A and 45B.

<Display Module>

Figure 43:
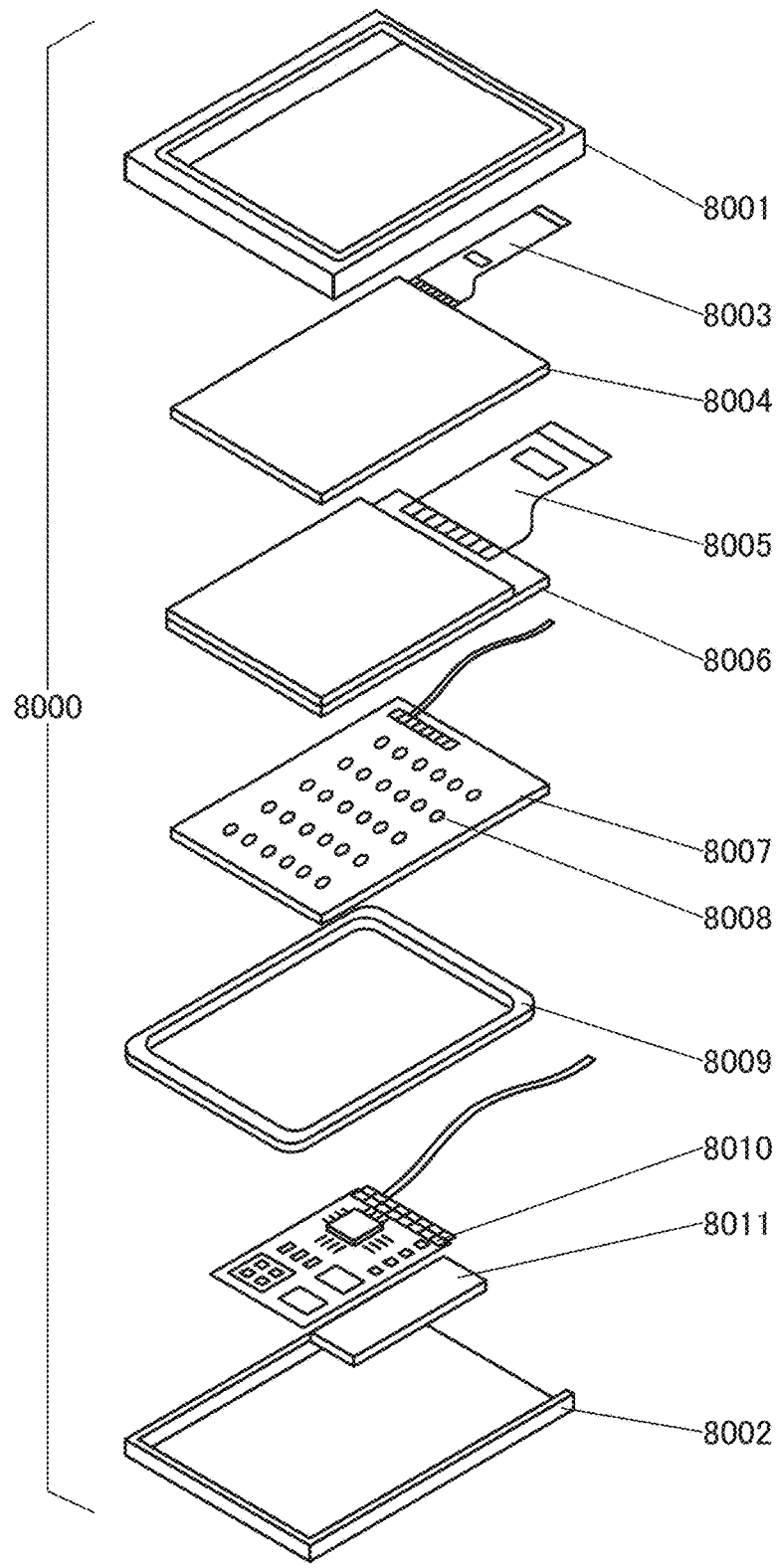
FIG. 43 illustrates a display module.

In a display module 8000 illustrated in FIG. 43, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes light sources 8008. Note that although a structure in which the light sources 8008 are provided over the backlight 8007 is illustrated in FIG. 43, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<Electronic Device>

FIGS. 44A to 44G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 44A to 44G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 44A to 44G are not limited thereto, and the electronic devices can have a variety of functions. Although not illustrated in FIGS. 44A to 44G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 44A to 44G will be described in detail below.

Figure 44A:
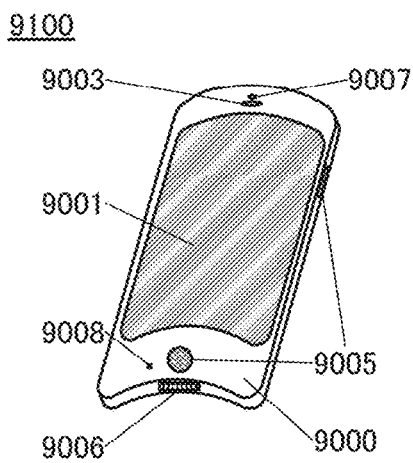
FIGS. 44A to 44G illustrate electronic devices.

FIG. 44A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, an application can be started.

Figure 44B:
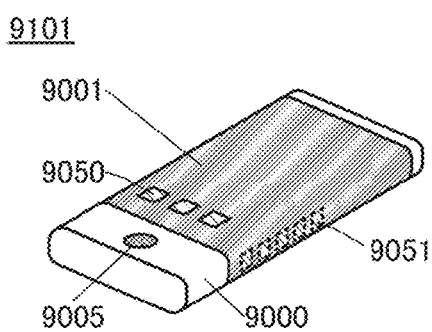

FIG. 44B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 44B, can be positioned in the portable information terminal 9101 as in the portable information terminal 9100 illustrated in FIG. 44A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming e-mail, social networking service (SNS) message, call, or the like; the title and sender of an e-mail, SNS message, or the like; the date; the time; remaining battery; the strength of an antenna; and the like. Instead of the information 9051, the operation buttons 9050 or the like may be displayed in the position where the information 9051 is displayed.

Figure 44C:
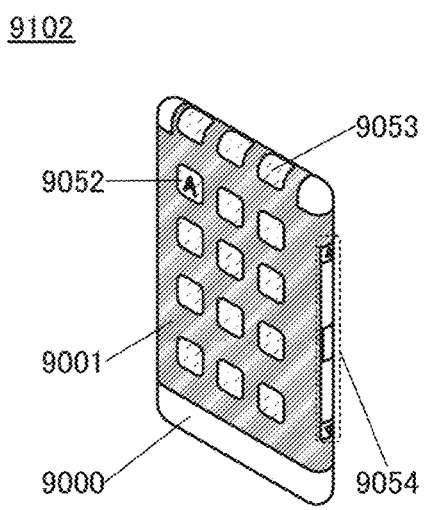

FIG. 44C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

Figure 44D:
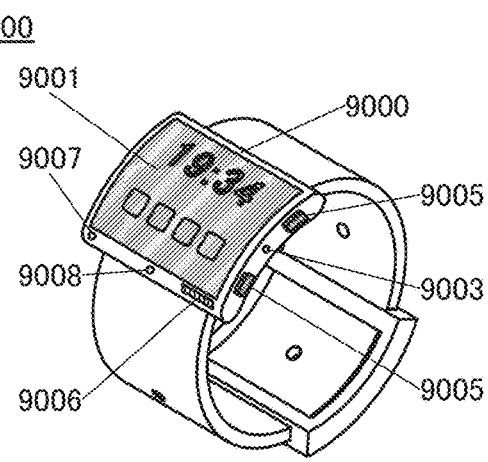

FIG. 44D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and display can be performed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 44E:
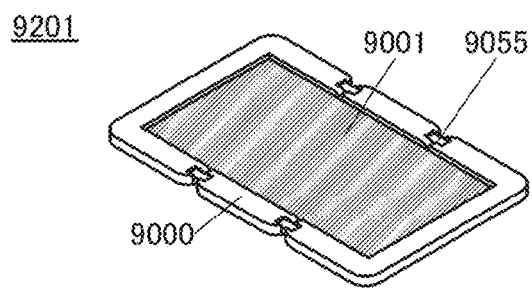
Figure 44F:
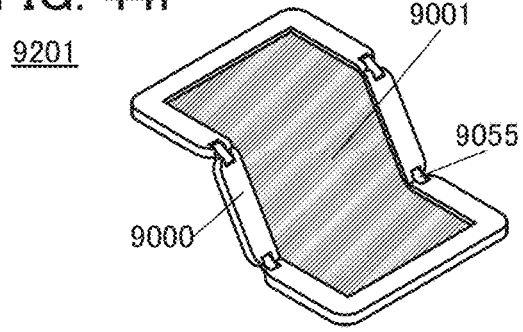
Figure 44G:
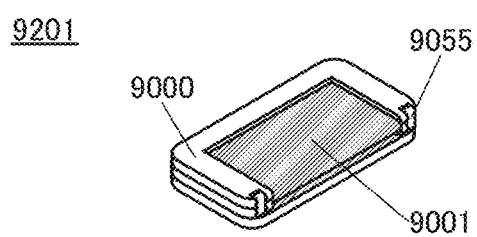

FIGS. 44E, 44F, and 44G are perspective views of a foldable portable information terminal 9201. FIG. 44E is a perspective view of the foldable portable information terminal 9201 that is opened. FIG. 44F is a perspective view of the foldable portable information terminal 9201 that is being opened or being folded. FIG. 44G is a perspective view of the foldable portable information terminal 9201 that is folded. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

Figure 45A:
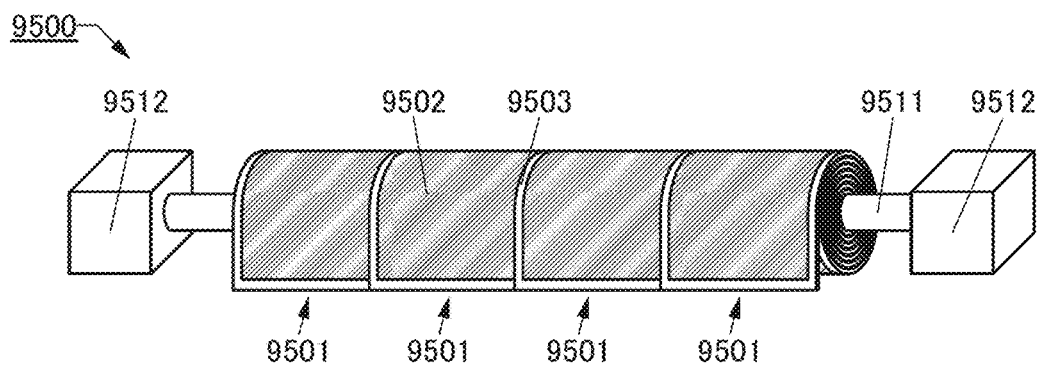
FIGS. 45A and 45B are perspective views of a display device.
Figure 45B:
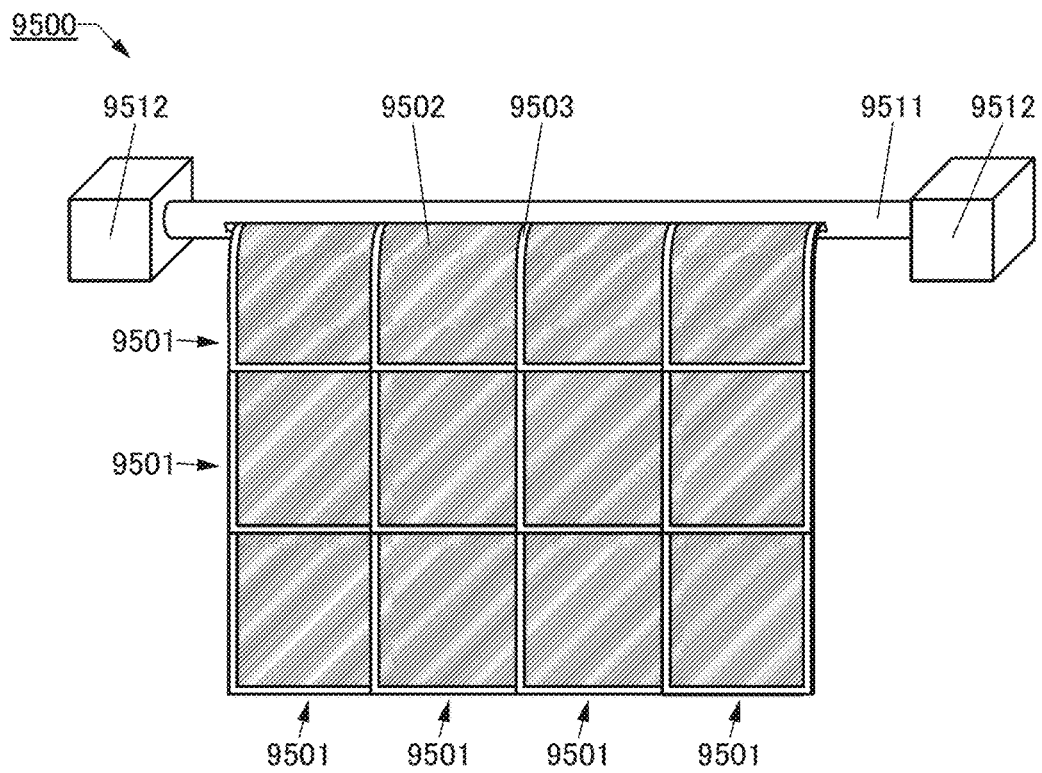

FIGS. 45A and 45B are perspective views of a display device including a plurality of display panels. Note that the plurality of display panels are wound in the perspective view in FIG. 45A, and are unwound in the perspective view in FIG. 45B.

A display device 9500 illustrated in FIGS. 45A and 45B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 45A and 45B, without limitation to this structure, the display regions 9502 of the adjacent display panels 9501 may overlap with each other without any space so that a continuous display region 9502 is obtained, for example.

It is possible to reduce luminance variation in the adjacent display panels 9501 with the monitor circuit of one embodiment of the present invention; therefore, a viewer can perceive the plurality of display regions 9502 as one display region.

The electronic devices described in this embodiment each include the display portion for displaying some sort of data. Note that the semiconductor device of one embodiment of the present invention can also be used for an electronic device that does not have a display portion. The structure in which the display portion of the electronic device described in this embodiment is flexible and display can be performed on the curved display surface or the structure in which the display portion of the electronic device is foldable is described as an example; however, the structure is not limited thereto, and a structure in which the display portion of the electronic device is not flexible and display is performed on a plane portion may be employed.

The structure described in this embodiment can be combined as appropriate with any of the structures described in the other embodiments.

Embodiment 7

In this embodiment, a deposition apparatus which can be used for manufacturing the display module of one embodiment of the present invention will be described with reference to FIG. 46.

FIG. 46 illustrates a deposition apparatus 3000 which can be used for manufacturing the display module of one embodiment of the present invention. Note that the deposition apparatus 3000 is an example of a batch-type ALD apparatus.

<Structural Example of Deposition Apparatus>

The deposition apparatus 3000 described in this embodiment includes a deposition chamber 3180 and a control portion 3182 connected to the deposition chamber 3180 (see FIG. 46).

The control portion 3182 includes a control unit (not illustrated) which supplies control signals and flow rate controllers 3182*a*, 3182*b*, and 3182*c* to which the control signals are supplied. For example, high-speed valves can be used as the flow rate controllers. Specifically, flow rates can be precisely controlled by using ALD valves or the like. The control portion 3182 also includes a heating mechanism 3182*h* which controls the temperatures of the flow rate controllers and pipes.

The flow rate controller 3182*a* is supplied with a control signal, a first source material, and an inert gas and has a function of supplying the first source material or the inert gas in accordance with the control signal.

The flow rate controller 3182*b* is supplied with a control signal, a second source material, and an inert gas and has a function of supplying the second source material or the inert gas in accordance with the control signal.

The flow rate controller 3182*c* is supplied with a control signal and has a function of connecting to an evacuation unit 3185 in accordance with the control signal.

<Source Material Supply Portion>

A source material supply portion 3181*a* has a function of supplying the first source material and is connected to the flow rate controller 3182*a*.

A source material supply portion 3181*b* has a function of supplying the second source material and is connected to the flow rate controller 3182*b*.

A vaporizer, a heating unit, or the like can be used as each of the source material supply portions. Thus, a gaseous source material can be generated from a solid or liquid source material.

Note that the number of source material supply portions is not limited to two and may be three or more.

<Source Material>

Any of a variety of substances can be used as the first source material. For example, an organometallic compound, a metal alkoxide, or the like can be used as the first source material. Any of a variety of substances which react with the first source material can be used as the second source material. For example, a substance which contributes to an oxidation reaction, a substance which contributes to a reduction reaction, a substance which contributes to an addition reaction, a substance which contributes to a decomposition reaction, a substance which contributes to a hydrolysis reaction, or the like can be used as the second source material.

Furthermore, a radical or the like can be used. For example, plasma obtained by supplying a source material to a plasma source or the like can be used. Specifically, an oxygen radical, a nitrogen radical, or the like can be used.

The second source material combined with the first source material is preferably a source material which reacts at a temperature close to room temperature. For example, a source material which reacts at a temperature higher than or equal to room temperature and lower than or equal to 200° C., preferably higher than or equal to 50° C. and lower than or equal to 150° C., is preferable.

<Evacuation Unit>

The evacuation unit 3185 has an evacuating function and is connected to the flow rate controller 3182*c*. Note that a trap for capturing the source material to be evacuated may be provided between an outlet port 3184 and the flow rate controller 3182*c*. The evacuated gas or the like is removed by using a removal unit.

<Control Portion>

The control portion 3182 supplies the control signal which controls the flow rate controllers, a control signal which controls the heating mechanism, or the like. For example, in a first step, the first source material is supplied to a surface of a process member. Then, in a second step, the second source material which reacts with the first source material is supplied. Accordingly, a reaction product of the first source material and the second source material can be deposited onto a surface of a process member 3010.

Note that the amount of the reaction product to be deposited onto the surface of the process member 3010 can be controlled by repetition of the first step and the second step.

Note that the amount of the first source material to be supplied to the process member 3010 is limited by the maximum possible amount of adsorption on the surface of the process member 3010. For example, conditions are selected so that a monomolecular layer of the first source material is formed on the surface of the process member 3010, and the formed monomolecular layer of the first source material is reacted with the second source material, whereby a significantly uniform layer containing the reaction product of the first source material and the second source material can be formed.

Accordingly, a variety of materials can be deposited on a surface of the process member 3010 even when the surface has a complicated structure. For example, a film having a thickness greater than or equal to 3 nm and less than or equal to 200 nm can be formed on the process member 3010.

In the case where, for example, a small hole called a pinhole or the like is formed in the surface of the process member 3010, the pinhole can be filled by depositing a material into the pinhole.

The remainder of the first source material or the second source material is evacuated from the deposition chamber 3180 with use of the evacuation unit 3185. For example, the evacuation may be performed while an inert gas such as argon or nitrogen is introduced.

<Deposition Chamber>

The deposition chamber 3180 includes an inlet port 3183 from which the first source material, the second source material, and the inert gas are supplied and the outlet port 3184 from which the first source material, the second source material, and the inert gas are evacuated.

The deposition chamber 3180 includes a support portion 3186 which has a function of supporting one or a plurality of process members 3010, a heating mechanism 3187 which has a function of heating the one or plurality of process members 3010, and a door 3188 which has a function of opening or closing to load and unload the one or plurality of process members 3010.

For example, a resistive heater, an infrared lamp, or the like can be used as the heating mechanism 3187. The heating mechanism 3187 has a function of heating up, for example, to 80° C. or higher, 100° C. or higher, or 150° C. or higher. The heating mechanism 3187 heats the one or plurality of process members 3010 to a temperature higher than or equal to room temperature and lower than or equal to 200° C., preferably higher than or equal to 50° C. and lower than or equal to 150° C.

The deposition chamber 3180 may also include a pressure regulator and a pressure detector.

<Support Portion>

The support portion 3186 supports the one or plurality of process members 3010. Accordingly, an insulating film, for example, can be formed over the one or plurality of process members 3010 in each treatment.

<Example of Film>

An example of a film which can be formed with the deposition apparatus 3000 described in this embodiment will be described.

For example, a film including an oxide, a nitride, a fluoride, a sulfide, a ternary compound, a metal, or a polymer can be formed.

For example, the film can be formed with a material including aluminum oxide, hafnium oxide, aluminum silicate, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like.

For example, the film can be formed with a material including aluminum nitride, hafnium nitride, silicon nitride, tantalum nitride, titanium nitride, niobium nitride, molybdenum nitride, zirconium nitride, gallium nitride, or the like.

For example, the film can be formed with a material including copper, platinum, ruthenium, tungsten, iridium, palladium, iron, cobalt, nickel, or the like.

For example, the film can be formed with a material including zinc sulfide, strontium sulfide, calcium sulfide, lead sulfide, calcium fluoride, strontium fluoride, zinc fluoride, or the like.

For example, the film can be formed with a material which includes a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The structure described in this embodiment can be combined as appropriate with any of the structures described in the other embodiments.

REFERENCE NUMERALS

10: semiconductor device, 12: pixel portion, 14: pixel, 16: gate line driver circuit, 18: signal line driver circuit, 20: monitor circuit, 22: terminal portion, 32: amplifier circuit, 34: transistor, 36: light-emitting element, 38: resistor, 54: driving transistor, 56: light-emitting element, 60: correction circuit, 62: circuit group, 81: selection transistor, 82: capacitor, 86: selection transistor, 87: transistor, 88: selection transistor, 89: transistor, 90: transistor, 91: transistor, 92: selection transistor, 93: transistor, 94: transistor, 95: selection transistor, 96: transistor, 97: transistor, 98: transistor, 99: transistor, 100: transistor, 100A: transistor, 100B: transistor, 102: substrate, 104: conductive film, 106: insulating film, 107: insulating film, 108: oxide semiconductor film, 108*a*: oxide semiconductor film, 108*b*: oxide semiconductor film, 108*c*: oxide semiconductor film, 112*a*: conductive film, 112*b*: conductive film, 114: insulating film, 116: insulating film, 118: insulating film, 120: conductive film, 120*a*: conductive film, 120*b*: conductive film, 130: protective film, 131: insulating film, 132: insulating film, 133: insulating film, 140: oxygen, 140*a*: opening, 140*b*: opening, 140*c*: opening, 141*a*: opening, 141*b*: opening, 142*a*: opening, 142*b*: opening, 142*c*: opening, 150: transistor, 160: transistor, 170: transistor, 180: transistor, 180*b*: oxide semiconductor film, 600: transistor, 602: substrate, 604: conductive film, 604*a*: conductive film, 604*b*: conductive film, 606: insulating film, 607: insulating film, 608: oxide semiconductor film, 609: oxide semiconductor film, 612*a*: conductive film, 612*b*: conductive film, 612*c*: conductive film, 612*d*: conductive film, 612*e*: conductive film, 614: insulating film, 616: insulating film, 618: insulating film, 620: conductive film, 642*a*: opening, 642*b*: opening, 644*a*: opening, 644*b*: opening, 646*a*: opening, 646*b*: opening, 650: sample for evaluation, 702: substrate, 742: insulating film, 744: insulating film, 746: partition wall, 748: spacer, 752: conductive film, 752*a*: conductive film, 752*b*: conductive film, 754: conductive film, 756: EL layer, 758: conductive film, 760: substrate, 762: light-blocking film, 764G: color filter, 764R: color filter, 770: transistor, 772: capacitor, 773: resistor, 774: light-emitting element, 804: conductive film, 804*a*: conductive film, 804*b*: conductive film, 806: insulating film, 807: insulating film, 809: oxide conductive film, 812: conductive film, 812*a*: conductive film, 812*b*: conductive film, 818: insulating film, 820: conductive film, 2000: touch panel, 2001: touch panel, 2501: display device, 2502*t*: transistor, 2503*c*: capacitor, 2503*t*: transistor, 2504: scan line driver circuit, 2505: pixel, 2509: FPC, 2510: substrate, 2510*a*: insulating layer, 2510*b*: flexible substrate, 2510*c*: adhesive layer, 2511: wiring, 2519: terminal, 2521: insulating layer, 2528: partition wall, 2550: EL element, 2560: sealing layer, 2567: coloring layer, 2568: light-blocking layer, 2569: anti-reflective layer, 2570: substrate, 2570*a*: insulating layer, 2570*b*: flexible substrate, 2570*c*: adhesive layer, 2580: light-emitting module, 2590: substrate, 2591: electrode, 2592: electrode, 2593: insulating layer, 2594: wiring, 2595: touch sensor, 2597: adhesive layer, 2598: wiring, 2599: connection layer, 2601: pulse voltage output circuit, 2602: current sensing circuit, 2603: capacitor, 2611: transistor, 2612: transistor, 2613: transistor, 2621: electrode, 2622: electrode, 3000: deposition apparatus, 3010: process member, 3180: deposition chamber, 3181*a*: source material supply portion, 3181*b*: source material supply portion, 3182: control portion, 3182*a*: flow rate controller, 3182*b*: flow rate controller, 3182*c*: flow rate controller, 3182*h*: heating mechanism, 3183: inlet port, 3184: outlet port, 3185: evacuation unit, 3186: support portion, 3187: heating mechanism, 3188: door, 5100: pellet, 5120: substrate, 5161: region, 5200: pellet, 5201: ion, 5203: particle, 5220: substrate, 5230: target, 5240: plasma, 5260: heating mechanism, 8000: display module, 8001: upper cover, 8002: lower cover, 8003: FPC, 8004: touch panel, 8005: FPC, 8006: display panel, 8007: backlight, 8008: light source, 8009: frame, 8010: printed board, 8011: battery, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal, 9500: display device, 9501: display panel, 9502: display region, 9503: region, 9511: hinge, 9512: bearing.

This application is based on Japanese Patent Application serial no. 2014-266969 filed with Japan Patent Office on Dec. 29, 2014 and Japanese Patent Application serial no. 2014-266973 filed with Japan Patent Office on Dec. 29, 2014, the entire contents of which are hereby incorporated by reference.

The invention claimed is:

1. A semiconductor device comprising:
a pixel portion; and
a monitor circuit provided outside the pixel portion,
wherein the pixel portion comprises a first light-emitting element,
wherein the monitor circuit comprises a second light-emitting element, a transistor, a resistor, and an amplifier circuit,
wherein an anode of the second light-emitting element is electrically connected to one of a source and a drain of the transistor,
wherein a cathode of the second light-emitting element is electrically connected to one electrode of the resistor and a first input terminal of the amplifier circuit,
wherein the other electrode of the resistor is electrically connected to a first power supply line,
wherein a second input terminal of the amplifier circuit is electrically connected to a second power supply line,
wherein an output terminal of the amplifier circuit is electrically connected to a gate of the transistor,
wherein the other of the source and the drain of the transistor is electrically connected to a third power supply line,
wherein the transistor includes an oxide semiconductor film formed on a surface,
wherein the resistor includes an oxide conductive film formed on the same surface as the oxide semiconductor film, and
wherein an amount of current flowing through the first light-emitting element is controlled by the monitor circuit.

2. The semiconductor device according to claim 1, wherein the oxide semiconductor film contains In, Zn, and M (M is Ti, Ga, Y, Zr, La, Ce, Nd, Sn, or Hf).

3. The semiconductor device according to claim 1,
wherein the oxide semiconductor film includes a crystal part, and
wherein the crystal part has c-axis alignment.

4. The semiconductor device according to claim 1, wherein the oxide conductive film contains In, Zn, and M (M is Ti, Ga, Y, Zr, La, Ce, Nd, Sn, or Hf).

5. A display device comprising:
the semiconductor device according to claim 1; and
a color filter.

6. A display module comprising:
the display device according to claim 5; and
a touch sensor.

7. An electronic device comprising:
the semiconductor device according to claim 1; and
an operation key or a battery.

8. A semiconductor device comprising:
a pixel portion; and
a monitor circuit provided outside the pixel portion,
wherein the pixel portion comprises a selection transistor, a driving transistor, and a first light-emitting element,
wherein the selection transistor has a function of controlling conduction between a signal line and a gate of the driving transistor,
wherein the driving transistor has a function of controlling an amount of current flowing through the first light-emitting element,
wherein the monitor circuit comprises a second light-emitting element, a transistor, a resistor, and an amplifier circuit,
wherein an anode of the second light-emitting element is electrically connected to one of a source and a drain of the transistor,
wherein a cathode of the second light-emitting element is electrically connected to one electrode of the resistor and a first input terminal of the amplifier circuit,
wherein the other electrode of the resistor is electrically connected to a first power supply line,
wherein a second input terminal of the amplifier circuit is electrically connected to a second power supply line,
wherein an output terminal of the amplifier circuit is electrically connected to a gate of the transistor,
wherein the other of the source and the drain of the transistor is electrically connected to a third power supply line,
wherein the transistor includes an oxide semiconductor film formed on a surface,
wherein the resistor includes an oxide conductive film formed on the same surface as the oxide semiconductor film, and
wherein the amount of current flowing through the driving transistor and the first light-emitting element is controlled by the monitor circuit.

9. The semiconductor device according to claim 8, wherein the selection transistor and the driving transistor each include the oxide semiconductor film.

10. The semiconductor device according to claim 8, wherein the oxide semiconductor film contains In, Zn, and M (M is Ti, Ga, Y, Zr, La, Ce, Nd, Sn, or Hf).

11. The semiconductor device according to claim 8,
wherein the oxide semiconductor film includes a crystal part, and
wherein the crystal part has c-axis alignment.

12. The semiconductor device according to claim 8, wherein the oxide conductive film contains In, Zn, and M (M is Ti, Ga, Y, Zr, La, Ce, Nd, Sn, or Hf).

13. A display device comprising:
the semiconductor device according to claim 8; and
a color filter.

14. A display module comprising:
the display device according to claim 13; and
a touch sensor.

15. A semiconductor device comprising:
a pixel portion; and
a monitor circuit provided outside the pixel portion,
wherein the pixel portion comprises a selection transistor, a driving transistor, a first transistor, and a first light-emitting element,
wherein the selection transistor has a function of controlling conduction between a signal line and a gate of the driving transistor,
wherein the driving transistor and the first transistor each have a function of controlling an amount of current flowing through the first light-emitting element,
wherein the monitor circuit comprises a second light-emitting element, a second transistor, a resistor, and an amplifier circuit,
wherein an anode of the second light-emitting element is electrically connected to one of a source and a drain of the second transistor,
wherein a cathode of the second light-emitting element is electrically connected to one electrode of the resistor and a first input terminal of the amplifier circuit,
wherein the other electrode of the resistor is electrically connected to a first power supply line,
wherein a second input terminal of the amplifier circuit is electrically connected to a second power supply line,
wherein an output terminal of the amplifier circuit is electrically connected to a gate of the second transistor,
wherein the other of the source and the drain of the second transistor is electrically connected to a third power supply line,
wherein the second transistor includes an oxide semiconductor film formed on a surface,
wherein the resistor includes an oxide conductive film formed on the same surface as the oxide semiconductor film, and
wherein the amount of current flowing through the driving transistor and the first light-emitting element is controlled by the monitor circuit.

16. The semiconductor device according to claim 15, wherein the selection transistor, the driving transistor, and the first transistor each include the oxide semiconductor film.

17. The semiconductor device according to claim 15, wherein the oxide semiconductor film contains In, Zn, and M (M is Ti, Ga, Y, Zr, La, Ce, Nd, Sn, or Hf).

18. The semiconductor device according to claim 15, wherein the oxide semiconductor film includes a crystal part, and
wherein the crystal part has c-axis alignment.

19. The semiconductor device according to claim 15, wherein the oxide conductive film contains In, Zn, and M (M is Ti, Ga, Y, Zr, La, Ce, Nd, Sn, or Hf).

20. A display device comprising:
the semiconductor device according to claim 15; and
a color filter.

21. A display module comprising:
the display device according to claim 20; and
a touch sensor.

* * * * *